US009165976B2

(12) United States Patent
Kawamura

(10) Patent No.: US 9,165,976 B2
(45) Date of Patent: Oct. 20, 2015

(54) METHOD OF MANUFACTURING SEMICONDUCTOR DEVICE

(71) Applicant: RENESAS ELECTRONICS CORPORATION, Kawasaki-shi, Kangawa (JP)

(72) Inventor: Takeshi Kawamura, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 164 days.

(21) Appl. No.: 14/065,215

(22) Filed: Oct. 28, 2013

(65) Prior Publication Data

US 2014/0120652 A1 May 1, 2014

(30) Foreign Application Priority Data

Oct. 29, 2012 (JP) .................................. 2012-238069

(51) Int. Cl.
*H01L 21/00* (2006.01)
*H01L 27/146* (2006.01)

(52) U.S. Cl.
CPC ...... *H01L 27/14685* (2013.01); *H01L 27/1462* (2013.01); *H01L 27/14609* (2013.01); *H01L 27/14636* (2013.01); *H01L 27/14645* (2013.01)

(58) Field of Classification Search
CPC ................................................ H01L 27/14685
USPC ............................................................. 438/69
See application file for complete search history.

(56) References Cited

U.S. PATENT DOCUMENTS

| 7,400,003 | B2 * | 7/2008 | Lee et al. ....................... 257/291 |
| 8,384,817 | B2 | 2/2013 | Abe |
| 8,395,692 | B2 | 3/2013 | Nakayama |
| 2006/0220025 | A1 * | 10/2006 | Oh ................................... 257/72 |
| 2008/0038864 | A1 * | 2/2008 | Yoo et al. ......................... 438/70 |

FOREIGN PATENT DOCUMENTS

| JP | 2008-147288 | 6/2008 |
| JP | 2010-141280 A | 6/2010 |
| JP | 2010-153414 A | 7/2010 |
| JP | 2010-205994 A | 9/2010 |

* cited by examiner

*Primary Examiner* — Matthew Landau
*Assistant Examiner* — Igwe U Anya
(74) *Attorney, Agent, or Firm* — McDermott Will & Emery LLP

(57) ABSTRACT

Provided is a semiconductor device having improved performance and an improved manufacturing yield. Over photodiodes formed in a semiconductor substrate, a plurality of first to third embedded insulating films are stacked to form a waveguide for light incident on each of the photodiodes. The first embedded insulating film is formed simultaneously with plugs when the plugs are formed. The second embedded insulating film is formed simultaneously with first wires when the first wires are formed. The third embedded insulating film is formed simultaneously with second wires when the second wires are formed.

18 Claims, 64 Drawing Sheets

METHOD OF MANUFACTURING SEMICONDUCTOR DEVICE

CROSS-REFERENCE TO RELATED APPLICATIONS

The disclosure of Japanese Patent Application No. 2012-238069 filed on Oct. 29, 2012 including the specification, drawings and abstract is incorporated herein by reference in its entirety.

BACKGROUND

The present invention relates to a method of manufacturing a semiconductor device which can be applied appropriately to, e.g., a method of manufacturing a semiconductor device including a solid-state image sensing element.

The development of a solid-state image sensing element (CMOS image sensor) using a CMOS (Complementary Metal Oxide Semiconductor) as a solid-state image sensing element has been promoted. The CMOS image sensor is configured to include a plurality of pixels each having a photodiode and a transfer transistor.

Japanese Unexamined Patent Publication No. 2010-141280 (Patent Document 1) discloses a technique related to a solid-state image sensing device in which a plurality of optical waveguide members 131a, 131b, and 131c are stacked in layers to form an optical waveguide.

Japanese Unexamined Patent Publication No. 2010-205994 (Patent Document 2) discloses a technique related to a solid-state image sensing device in which a first lens material layer 121, a second lens material layer 122, and a third lens material layer 123 are formed.

Japanese Unexamined Patent Publication No. 2010-153414 (Patent Document 3) discloses a technique related to a solid-state image sensing device in which an optical waveguide is formed over a light receiving portion.

Japanese Unexamined Patent Publication No. 2008-147288 (Patent Document 4) discloses a technique which simultaneously etches a plurality of dummy metal layers over a photoelectric conversion element to form an opening.

RELATED ART DOCUMENTS

Patent Documents

[Patent Document 1]
Japanese Unexamined Patent Publication No. 2010-141280
[Patent Document 2]
Japanese Unexamined Patent Publication No. 2010-205994
[Patent Document 3]
Japanese Unexamined Patent Publication No. 2010-153414
[Patent Document 4]
Japanese Unexamined Patent Publication No. 2008-147288

SUMMARY

There is a semiconductor device having a light receiving element and, even in such a semiconductor device also, it is desired to maximally improve the performance thereof. Alternatively, it is desired to improve the manufacturing yield of the semiconductor device or achieve both the maximal performance improvement and the manufacturing yield improvement.

Other problems and novel features of the present invention will become apparent from a statement in the present specification and the accompanying drawings.

According to an embodiment, embedded insulating films are stacked in a plurality of layers over a light receiving element to form a waveguide for light. The individual embedded insulating films are formed simultaneously when a conductive plug or an embedded wire is formed.

According to the embodiment, it is possible to improve the performance of a semiconductor device. Alternatively, it is possible to improve the manufacturing yield of the semiconductor device or improve both the performance and the manufacturing yield.

DETAILED DESCRIPTION

Figure 1:
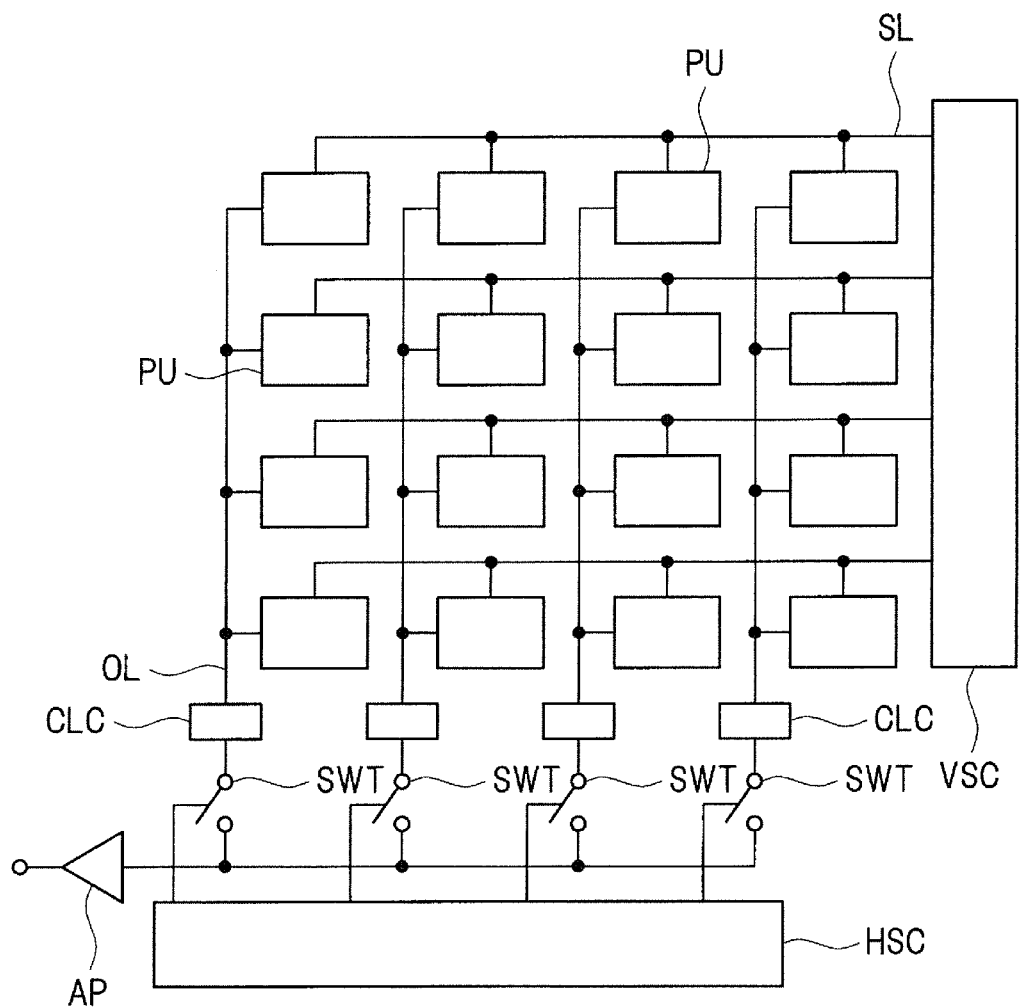
FIG. 1 is a circuit block diagram showing an example of a configuration of a semiconductor device in an embodiment.

In the following embodiments, if necessary for the sake of convenience, the embodiments will be each described by being divided into a plurality of sections or embodiments. However, they are by no means irrelevant to each other unless particularly explicitly described otherwise, and one of the sections or embodiments is modifications, details, supplementary explanation, and so forth of part or the whole of the others. Also in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

Hereinbelow, the embodiments will be described in detail with reference to the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

About Example of Circuit Configuration of Semiconductor Device

Figure 2:
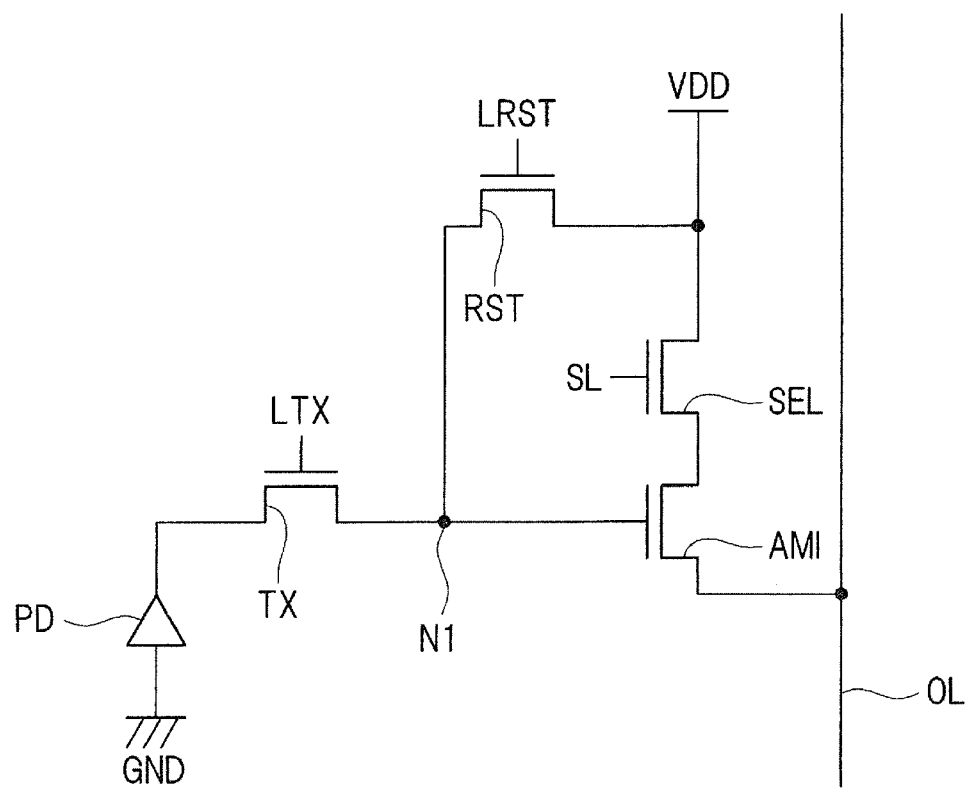
FIG. 2 is a circuit diagram showing an example of a configuration of a pixel.

FIG. 1 is a circuit block diagram showing an embodiment of a configuration of a semiconductor device in the present embodiment. FIG. 2 is a circuit diagram showing an example of a configuration of a pixel. FIG. 1 shows sixteen pixels arranged in the form of an array (a matrix) having four rows and four columns (4×4), but the number of the arranged pixels is not limited thereto and can be variously changed. For example, the number of the pixels actually used in an electronic device such as a camera may be several millions.

As shown in FIG. 1, in a pixel region, a plurality of pixels PU are arranged in the form of an array. Around the pixels PU, drive circuits such as a vertical scanning circuit VSC and a horizontal scanning circuit HSC are placed. The pixels (cells or pixel units) PU are disposed at the respective intersections of selection lines SL with output lines OL. The selection lines SL are each coupled to the vertical scanning circuit VSL, while the output lines OL are coupled to respective column circuits CLC. The column circuits CLC are each coupled to an output amplifier AP via switches SWT. The switches SWT are each coupled to the horizontal scanning circuit HSC to be controlled thereby.

For example, an electric signal read from the pixel PU selected by the vertical scanning circuit VSC and the horizontal scanning circuit HSC is output via the output line OL and the output amplifier AP.

As shown in, e.g., FIG. 2, the pixel PU has the configuration including a photodiode PD and four transistors RST, TX, SEL, and AMI. Each of the transistors RST, TX, SEL, and AMI is formed of an n-channel MISFET (Metal Insulator Semiconductor Field Effect Transistor). Among them, RST is a reset transistor (transistor for resetting), TX is a transfer transistor (transistor for transfer, SEL is a selection transistor (transistor for selection), and AMI is an amplification transistor (transistor for amplification). Note that, besides these transistors, another transistor or an element such as a capacitive element may also be incorporated. Forms of coupling between these transistors includes various modified/applied forms.

In the circuit example shown in FIG. 2, between a ground potential (GND) and a node N1, the photodiode PD and the transfer transistor TX are coupled in series. Between the node N1 and a power source potential (power source potential line) VDD, the reset transistor RST is coupled. Between the power source potential VDD and the output line OL, the selection transistor SEL and the amplification transistor AMI are coupled in series. The gate electrode of the amplification transistor AMI is coupled to the node N1. The gate electrode of the reset transistor RST is coupled to a reset line LRST. The gate electrode of the selection transistor SEL is coupled to the selection line SL. The gate electrode of the transfer transistor TX is coupled to a transfer line (second selection line) LTX.

For example, the transfer line LTX and the reset line LRST are each raised (to a H level) to bring each of the transfer transistor TX and the reset transistor RST into an ON state. As a result, charges in the photodiode PD are removed to deplete the photodiode PD. Then, the transfer transistor TX is brought into an OFF state.

Thereafter, when, e.g., the mechanical shutter of an electronic device such as a camera is opened, in the photodiode PD, charges are generated by incident light and stored while the shutter is open.

Then, after the shutter is closed, the reset line LRST is lowered (to a L level) to bring the reset transistor RST into an OFF state. Further, each of the selection line SL and the transfer line LTX is raised (to the H level) to bring each of the selection transistor SEL and the transfer transistor TX into the ON state. As a result, the charges in the photodiode PD are transferred to the terminal (floating diffusion corresponding to an $n^+$-type semiconductor region SD1 described later) of the transfer transistor TX coupled to the node N1. That is, a potential at the floating diffusion changes to a value in accordance with the charges transferred from the photodiode PD, and the value is amplified by the amplification transistor AMI to appear in the output line OL. The potential in the output line OL serves as an electric signal (received light signal), which is read as an output signal from the output amplifier AP via the column circuit CLC and the switch SWT.

About Manufacturing Process of Semiconductor Device

Figure 3:
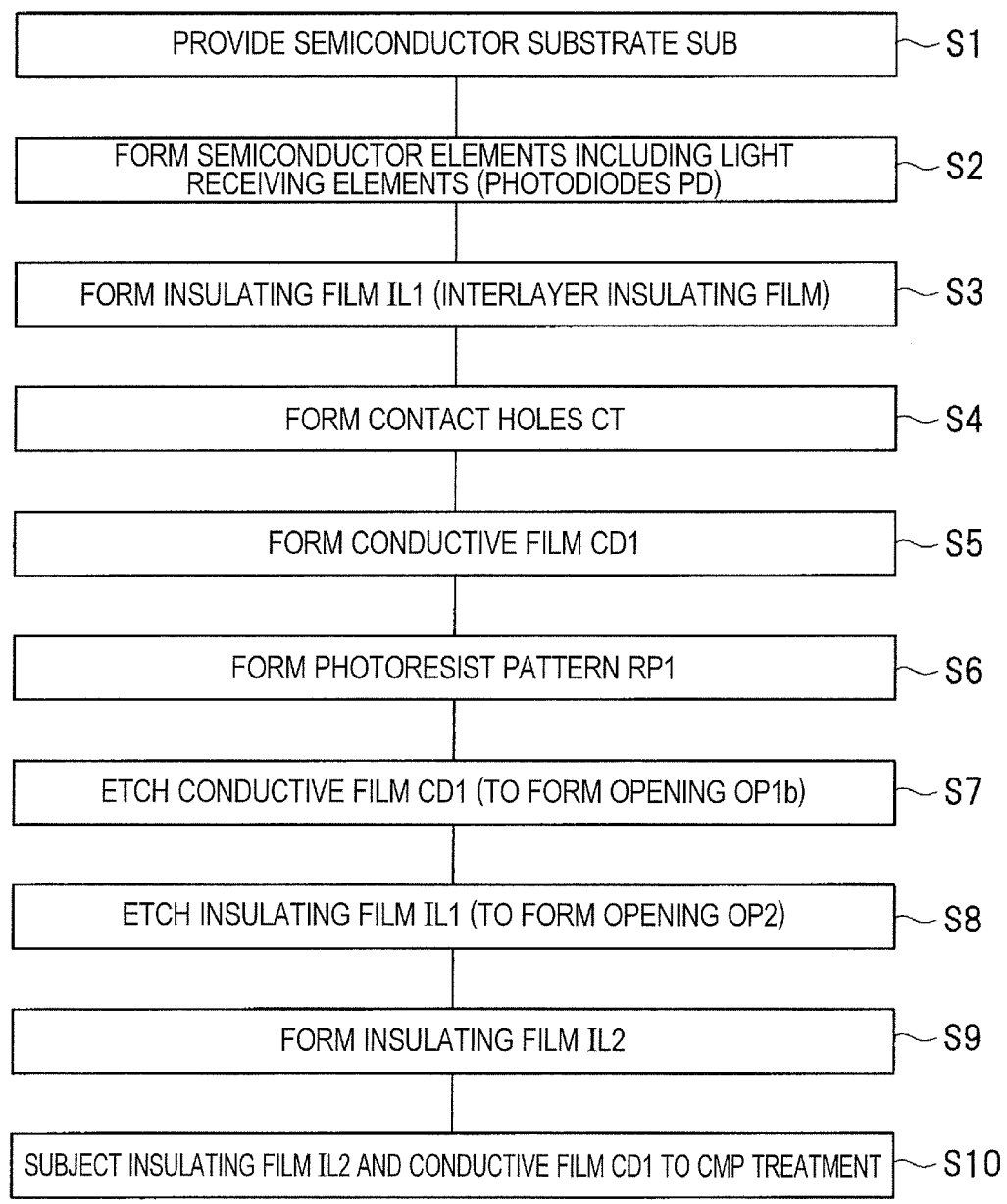
FIG. 3 is a process flow chart showing the manufacturing process of the semiconductor device in the embodiment.
Figure 4:
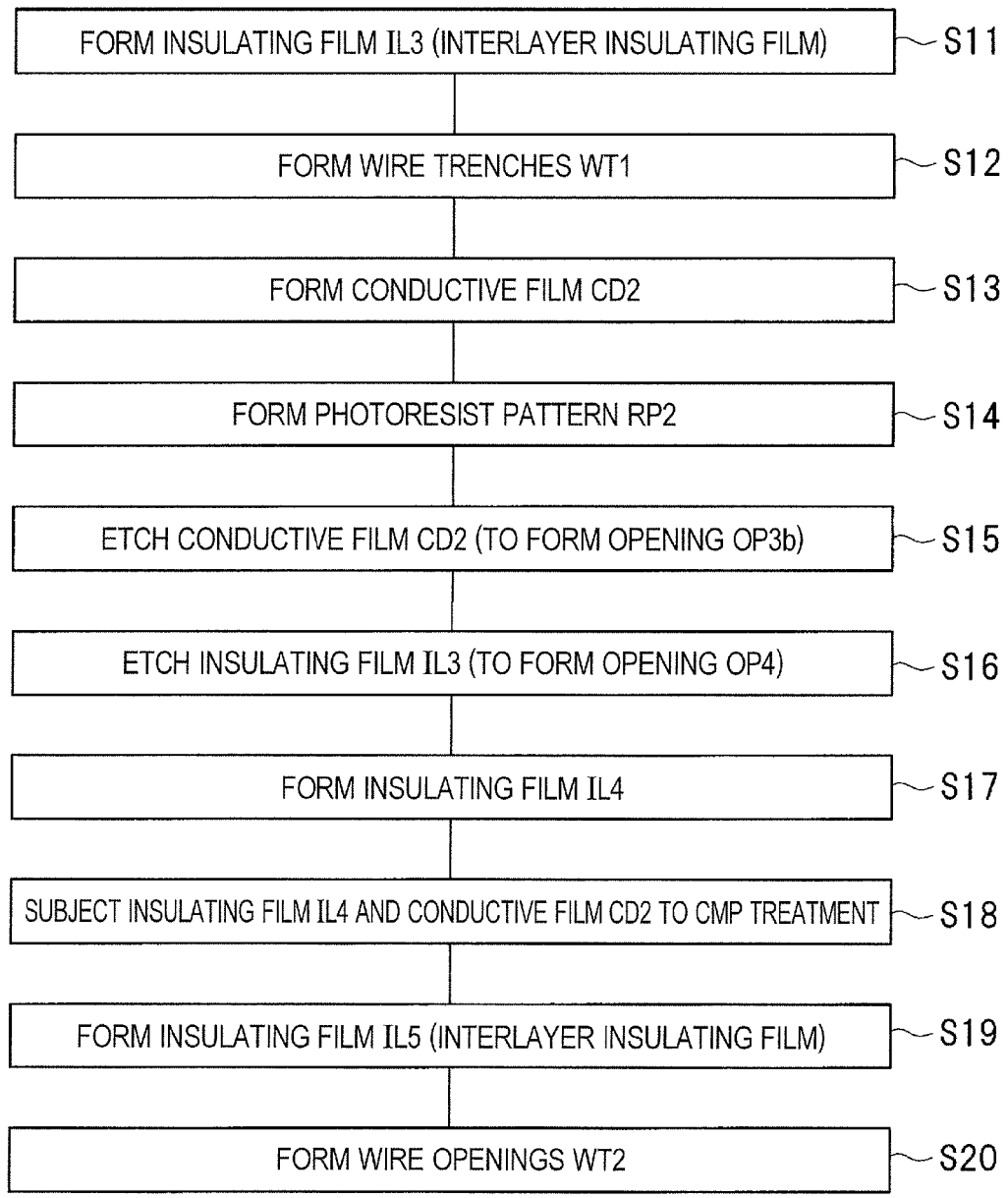
FIG. 4 is a process flow chart showing the manufacturing process of the semiconductor device in the embodiment.
Figure 5:
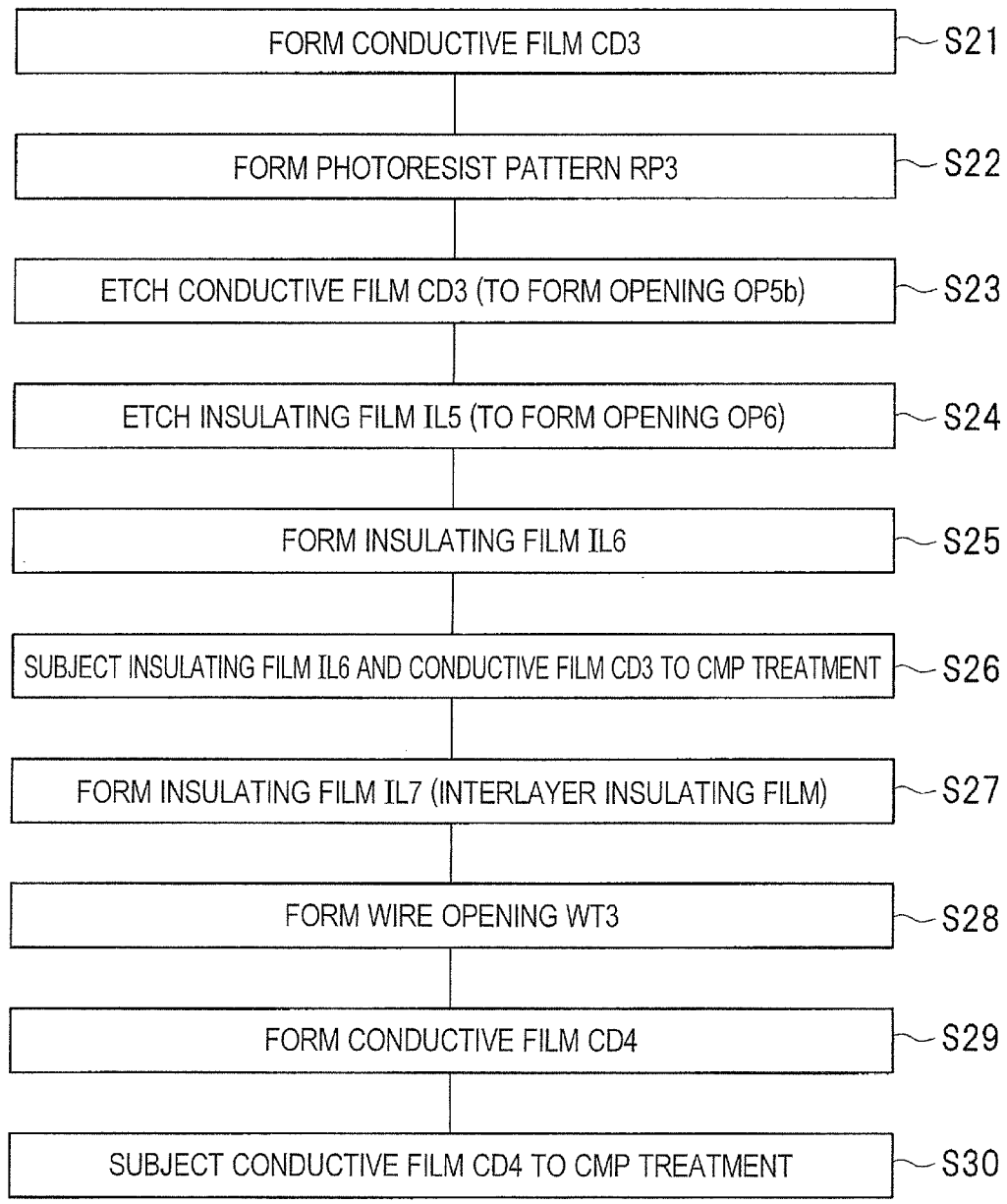
FIG. 5 is a process flow chart showing the manufacturing process of the semiconductor device in the embodiment.

Next, the manufacturing process of the semiconductor device in the present embodiment will be described with reference to the drawings. FIGS. 3 to 5 are process flow charts each showing the manufacturing process of the semiconductor device in the present embodiment. FIGS. 6 to 43 are main-portion cross-sectional views of the semiconductor device in the present embodiment during the manufacturing process thereof.

Figure 6:
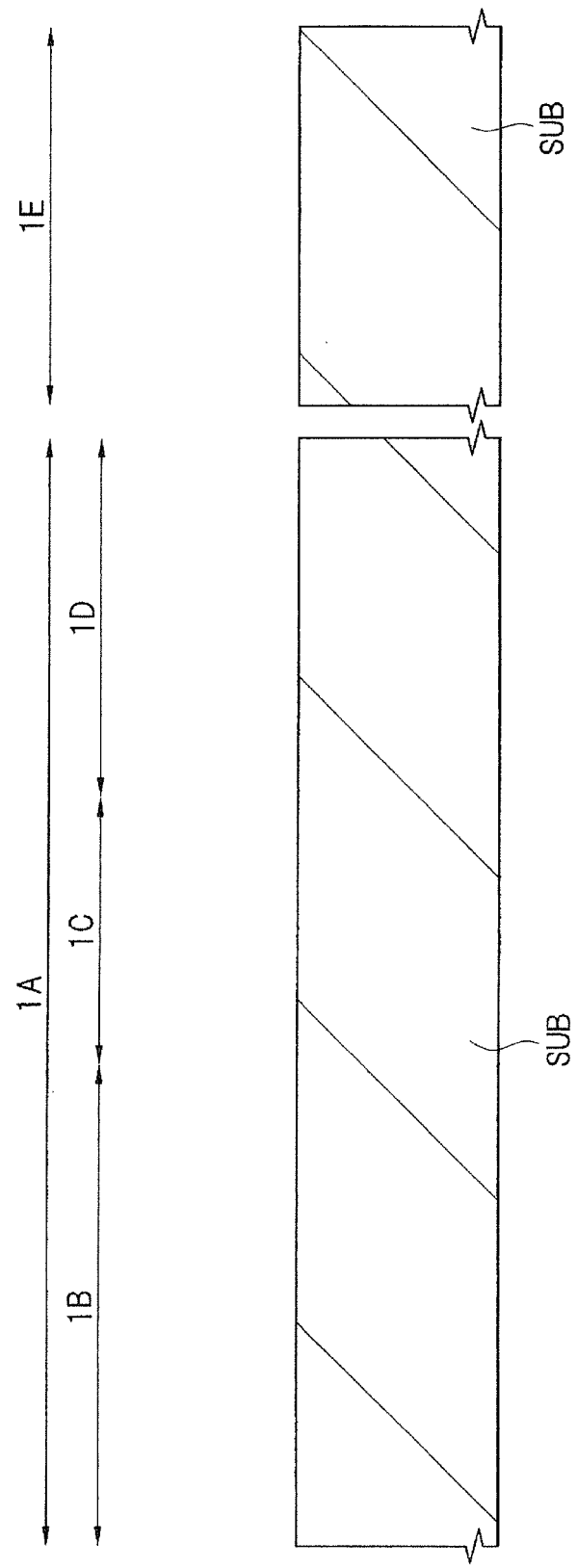
FIG. 6 is a main-portion cross-sectional view of the semiconductor device as the embodiment during the manufacturing process thereof.

To manufacture the semiconductor device in the present embodiment, first, as shown in FIG. 6, a semiconductor substrate (semiconductor wafer) SUB is provided (prepared) (Step S1 in FIG. 3).

The semiconductor substrate SUB is a semiconductor substrate (semiconductor wafer) made of n-type monocrystalline silicon into which an n-type impurity such as, e.g., phosphorus (P) or arsenic (As) or the like has been introduced. In another form, the semiconductor substrate SUB can also be a so-called epitaxial wafer. When the semiconductor substrate SUB is an epitaxial wafer, over the main surface of, e.g., an n$^+$-type monocrystalline silicon substrate into which an n-type impurity (e.g., arsenic (As)) has been introduced, an epitaxial layer made of n$^-$-type monocrystalline silicon into which an n-type impurity (e.g., phosphorus (P)) has been introduced is grown to allow the semiconductor substrate SUB to be formed.

Next, semiconductor elements including a light receiving element (which is the photodiode PD herein) are formed in the semiconductor substrate SUB (Step S2 in FIG. 3). A specific description will be given below of Step S2.

The semiconductor substrate SUB has a pixel region 1A including a photodiode formation region 1B which is a region to be formed with the photodiode PD, a transfer transistor formation region 1C which is a region to be formed with the transfer transistor TX, and a pixel transistor formation region 1D which is a region to be formed with the pixel transistor Q1, and a peripheral circuit formation region 1E which is a region to be formed with a peripheral circuit portion such as a logic circuit portion (logic portion).

Note that one pixel region 1A forms one pixel (corresponding to the foregoing pixel PU). In an actual situation, over the main surface of the semiconductor substrate SUB, a plurality of the pixel regions 1A (i.e., a plurality of the pixels PU) are arranged in the form of an array (a matrix). However, for simplified illustration, it is assumed that only one pixel region 1A is shown here as a representative. Also, in an actual situation, in addition to the photodiode PD and the transfer transistor TX, the foregoing transistors RST, SEL, and AMI are also formed in each of the pixel regions 1A, but it is assumed that one pixel transistor Q1 is shown as a representative of the foregoing transistors RST, SEL, and AMI. Also, in an actual situation, a plurality of transistors are formed in the peripheral circuit formation region 1E, but it is assumed that only one peripheral transistor Q2 is shown as a representative. Also, in FIG. 6, the semiconductor substrate SUB in the pixel region 1A and the semiconductor substrate SUB in the peripheral circuit formation region 1E are separately shown but, in an actual situation, the semiconductor substrate SUB in the pixel region 1A and the semiconductor substrate SUB in the peripheral circuit formation region 1E are integrally formed as the same semiconductor substrate SUB.

Figure 7:
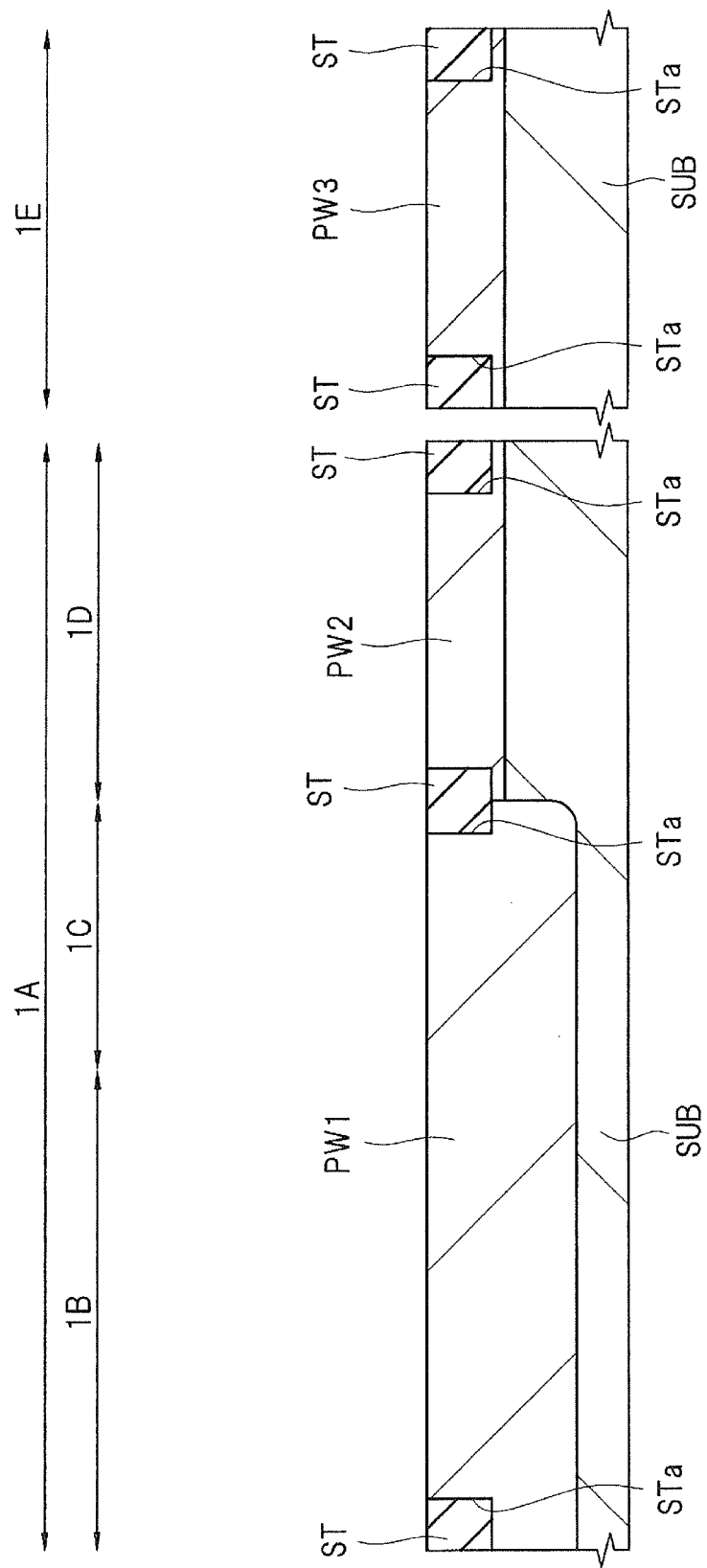
FIG. 7 is a main-portion cross-sectional view of the semiconductor device during the manufacturing process thereof, which is subsequent to FIG. 6.

First, as shown in FIG. 7, in the main surface of the semiconductor substrate SUB, an isolation region ST made of an insulator (insulator embedded in a trench) is formed by, e.g., a STI (Shallow Trench Isolation) method or the like.

That is, in the main surface of the semiconductor substrate SUB, an isolation trench (trench) STa is formed by etching or the like, and then an insulating film made of a silicon oxide (e.g., an ozone TEOS (Tetraethoxysilane) oxide film) or the like is formed over the semiconductor substrate SUB so as to fill the isolation trench STa. Subsequently, the insulating film is polished using a CMP (Chemical Mechanical Polishing) method or the like such that the unneeded insulating film located outside the isolation trench STa is removed and the insulating film is left in the isolation trench STa. In this manner, the isolation region ST formed of the insulating film (insulator) filling the isolation trench STa can be formed.

By the isolation region ST, the active region of the semiconductor substrate SUB is defined. In the active region defined by the isolation region ST in each of the pixel regions 1A, the photodiode PD and the transistor TX are formed in a manner as described later. That is, in each of the pixel regions 1A, the photodiode formation region 1B and the transfer transistor formation region 1C are not isolated from each other by the isolation region ST, and the photodiode PD and the transfer transistor TX are formed in the active region spanning over the photodiode formation region 1B and the transfer transistor formation region 1C in a manner as described later. Also, in the active region defined in the pixel transistor formation region 1D by the isolation region ST, the pixel transistor Q1 is formed in a manner as described later. Also, in the active region defined in the peripheral circuit formation region 1E by the isolation region ST, the peripheral transistor Q2 for forming the peripheral circuit is formed in a manner as described later.

Next, over predetermined depths from the main surface of the semiconductor substrate SUB, p-type wells (p-type semiconductor regions) PW1, PW2, and PW3 are formed. The p-type wells PW1, PW2, and PW3 can be formed through ion implantation of a p-type impurity such as, e.g., boron (B) into the semiconductor substrate SUB or the like.

The p-type well PW1 is formed over the photodiode formation region 1B and the transfer transistor formation region 1C. The p-type well PW2 is formed in the pixel transistor formation region 1D. The p-type well PW3 is formed in the peripheral circuit formation region 1E.

In the present embodiment, the case is described where the peripheral transistor Q2 formed in the peripheral circuit formation region 1E is an n-channel MISFET. However, the peripheral transistor Q2 can also be a p-channel MISFET by inverting the conductivity type thereof. Alternatively, both of an n-channel MISFET and a p-channel MISFET can also be formed in the peripheral circuit formation region 1E.

The depth (junction depth) of the p-type well PW1 is deeper than the depths (junction depths) of the p-type wells PW2 and PW3. Ion implantation for forming the p-type well PW1 is performed in an ion implantation step different from that for ion implantation for forming the p-type well PW2 and that for ion implantation for forming the p-type well PW3. On the other hand, the ion implantation for forming the p-type well PW2 and the ion implantation for forming the p-type well PW3 are performed in different ion implantation steps or in the same ion implantation step.

Figure 8:
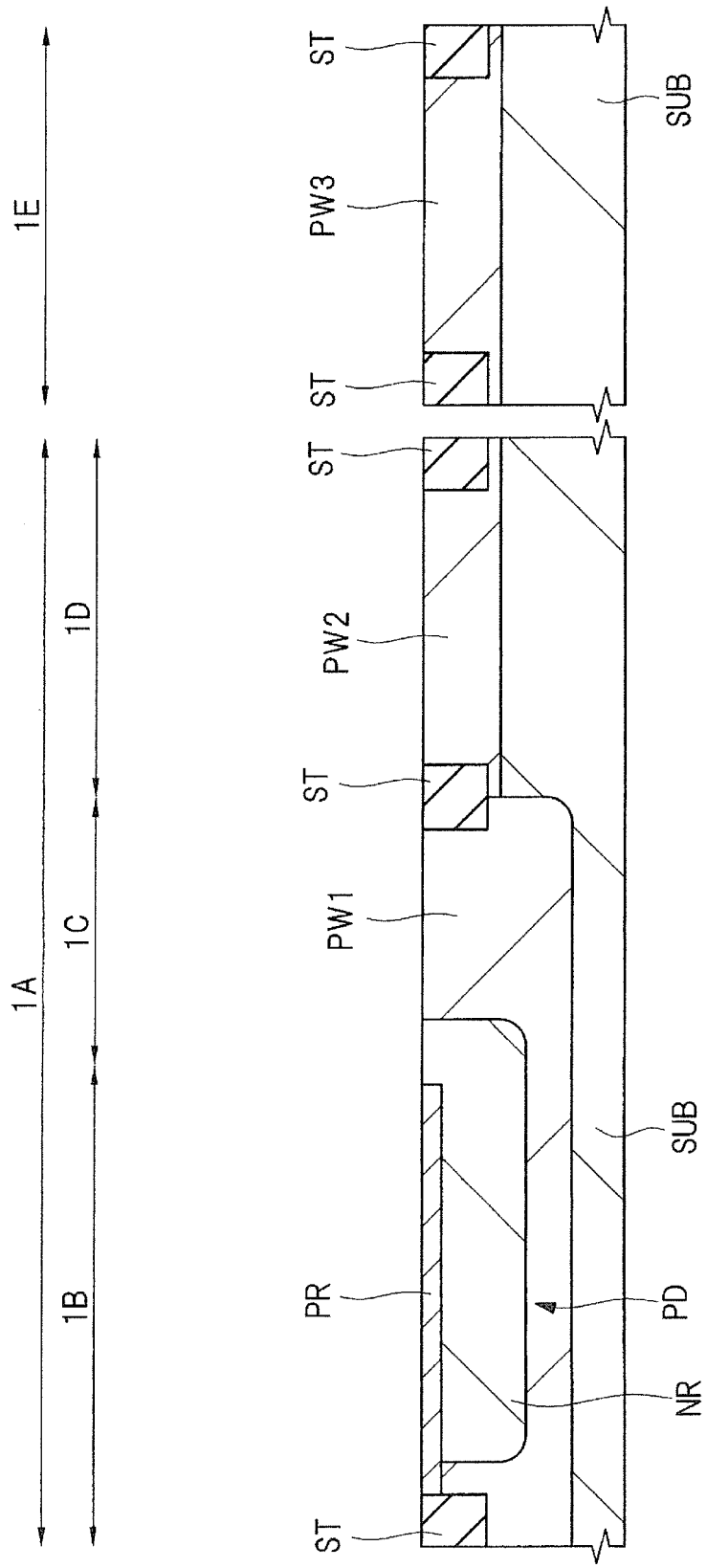
FIG. 8 is a main-portion cross-sectional view of the semiconductor device during the manufacturing process thereof, which is subsequent to FIG. 7.

Next, as shown in FIG. 8, in the semiconductor substrate SUB in the pixel region 1A, an n-type semiconductor region NR is formed by ion implantation. The n-type semiconductor region NR can be formed by ion-implanting an n-type impurity such as phosphorus (P) or arsenic (As) into the semiconductor substrate SUB in the pixel region 1A.

The n-type semiconductor region NR is an n-type semiconductor region for forming the photodiode PD and formed mainly in the photodiode formation region 1B of the pixel region 1A. However, since the source region of the transfer transistor TX is formed also of the n-type semiconductor region NR, a part of the n-type semiconductor region NR extends also into the transfer transistor formation region 1C. That is, the n-type semiconductor region NR is formed mainly in the photodiode formation region 1B of the pixel region 1A, but a part of the n-type semiconductor region NR is formed at a position which overlaps a gate electrode GE1 formed later in two dimensions (in planar view). In the pixel transistor formation region 1D, the n-type semiconductor region NR is not formed.

The depth of the n-type semiconductor region NR (the bottom surface thereof) is smaller than the depth of the p-type well PW1 (the bottom surface thereof), and the n-type semiconductor region NR is formed so as to be included in the p-type well PW1. In the ion implantation for forming the n-type semiconductor region NR, by covering the semiconductor substrate SUB except for the portion thereof located in the region to be formed with the n-type semiconductor region NR with a photoresist pattern (not shown), an n-type impurity can be selectively ion-implanted into the region to be formed with the n-type semiconductor region NR.

Then, in the semiconductor substrate SUB in the photodiode formation region 1B, a $p^+$-type semiconductor region PR is formed by ion implantation. The $p^+$-type semiconductor region PR can be formed by ion-implanting a p-type impurity such as boron (B) into the semiconductor substrate SUB in the photodiode formation region 1B. The $p^+$-type semiconductor region PR is a $p^+$-type semiconductor region into which a p-type impurity has been introduced (which is doped with a p-type impurity) at a high concentration. The impurity concentration (p-type impurity concentration) of the $p^+$-type semiconductor region PR is higher than the impurity concentration (p-type impurity concentration) of the p-type well PW1.

The depth of the $p^+$-type semiconductor region PR (the bottom surface thereof) is shallower than the n-type semiconductor region NR (the bottom surface thereof). The $p^+$-type semiconductor region PR is formed mainly in the surface layer portion of the n-type semiconductor region NR. Accordingly, when viewed in the thickness direction thereof, the semiconductor substrate SUB is in a state where the n-type semiconductor region NR exists under the $p^+$-type semiconductor region PR in the uppermost layer and, under the n-type semiconductor region NR, a p-type well PW1 exists. In the ion implantation for forming the $p^+$-type semiconductor region PR, by covering the semiconductor substrate SUB except for the portion thereof located in the region to be formed with the $p^+$-type semiconductor region PR with a photoresist pattern (not shown), a p-type impurity can be selectively ion-implanted into the region to be formed with the $p^+$-type semiconductor region PR. In the region where the n-type semiconductor region NR is not formed, a part of the $p^+$-type semiconductor region PR is in contact with the p-type well PW1.

Between the p-type well PW1 and the n-type semiconductor region NR, a PN junction is formed. Also, between the $p^+$-type semiconductor region PR and the n-type semiconductor region NR, a PN junction is formed.

The p-type well PW1 (p-type semiconductor region) and the n-type semiconductor region NR form the photodiode (PN-junction diode) PD. Additionally, in a part of the surface of the n-type semiconductor region NR, the $p^+$-type semiconductor region PR is formed. The $p^+$-type semiconductor region PR is a region formed for the purpose of suppressing the generation of electrons based on a large number of interface states formed in the surface of the semiconductor substrate SUB. That is, in the surface region of the semiconductor substrate SUB, under the influence of the interface states, electrons are generated even in a state where there is no radiation of light to cause an increase in dark current. Accordingly, by forming the $p^+$-type semiconductor region PR having holes as majority carriers in the surface of the n-type semiconductor region NR having electrons as majority carriers, it is possible to suppress the generation of electrons in a state where there is no radiation of light and suppress an increase in dark current.

The photodiode PD is a light receiving element. The photodiode PD can also be regarded as a photoelectric conversion element.

After the n-type semiconductor region NR and the $p^+$-type semiconductor region PR are formed, annealing treatment (heat treatment) for repairing a crystal defect can also be performed.

Figure 9:
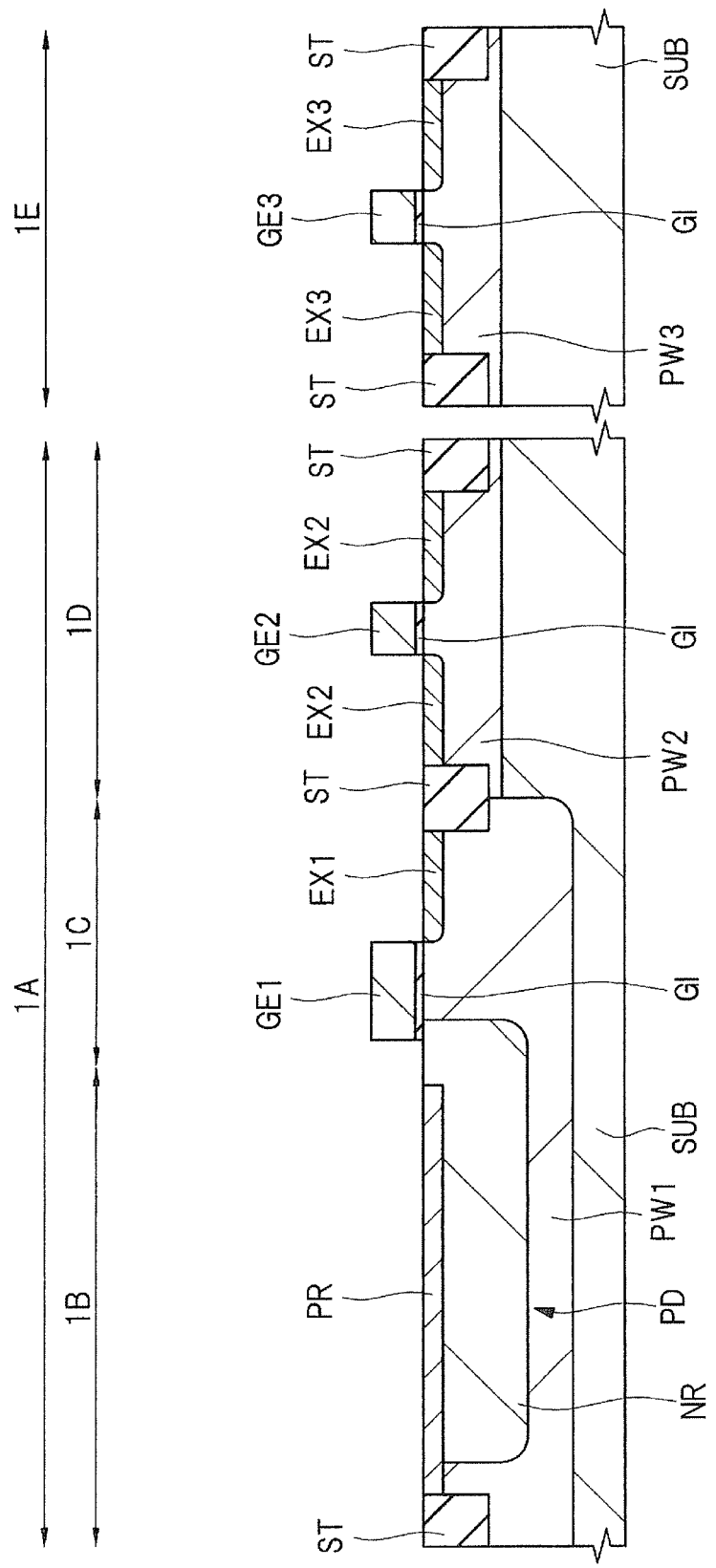
FIG. 9 is a main-portion cross-sectional view of the semiconductor device during the manufacturing process thereof, which is subsequent to FIG. 8.

Next, as shown in FIG. 9, the gate electrode GE1 for the transfer transistor TX, a gate electrode GE2 for the pixel transistor Q1, and a gate electrode GE3 for the peripheral transistor Q2 are respectively formed over the semiconductor substrate SUB in the transfer transistor formation region 1C, the semiconductor substrate SUB in the pixel transistor formation region 1D, and the semiconductor substrate SUB in the peripheral circuit formation region 1E each via a gate insulating film GI.

Specifically, e.g., the main surface of the semiconductor substrate SUB is cleaned by cleaning treatment or the like, and then an insulating film (e.g., a silicon oxide film) for the gate insulating film GI is formed over the main surface of the semiconductor substrate SUB. Over the insulating film, a conductive film (e.g., a polycrystalline silicon film) for each of the gate electrodes GE1, GE2, and GE3 is formed and then patterned using a photolithographic method and a dry etching method. In this manner, the gate electrodes GE1, GE2, and GE3 each made of the patterned conductive film (e.g., a polycrystalline silicon film) can be formed. The foregoing insulating film for the gate insulating film GI remaining under the gate electrodes GE1, GE2, and GE3 serves as the gate insulating film GI. By dry etching for patterning the conductive film or wet etching after the dry etching, the foregoing insulating film for the gate electrodes GI located in the region not covered with the gate electrodes GE1, GE2, and GE3 may be removed.

The foregoing insulating film for the gate insulating film GI is made of, e.g., a silicon oxide film and can be formed by, e.g., a thermal oxidation method or the like. The foregoing conductive film for the gate electrodes GE1, GE2, and GE3 is made of, e.g., a polycrystalline silicon film (polysilicon film) and can be formed by, e.g., a CVD (Chemical Vapor Deposition) method or the like. The polycrystalline silicon film is changed to a doped polysilicon film by being doped with an impurity during the deposition thereof or introducing an impurity therein by ion implantation after the deposition thereof, resulting in a low-resistance semiconductor film (conductive material film). The polycrystalline silicon film can also be obtained by depositing an amorphous silicon film and changing the deposited amorphous silicon film to the polycrystalline silicon film by heat treatment after the deposition.

The gate electrode GE1 functions as the gate electrode of the transfer transistor TX and is formed over the semiconductor substrate SUB via the gate insulating film GI in the transfer transistor formation region 1C. The gate insulating film GI under the gate electrode GE1 functions as the gate insulating film of the transfer transistor TX. The gate electrode GE2 functions as the gate electrode of the pixel transistor Q1 and is formed over the semiconductor substrate SUB via the gate insulating film GI in the pixel transistor formation region 1D. The gate insulating film GI under the gate electrode GE2 functions as the gate insulating film of the pixel transistor Q1. The gate electrode GE3 functions as the gate electrode of the peripheral transistor Q2 and is formed over the semiconductor substrate SUB via the gate insulating film GI in the peripheral circuit formation region 1E. The gate insulating film GI under the gate electrode GE3 functions as the gate insulating film of the peripheral transistor Q2.

Next, extension regions (source/drain extension regions) EX1, EX2, and EX3 are each formed by ion implantation. Among them, the extension region EX1 is formed by ion-implanting an n-type impurity into the semiconductor substrate SUB in the transfer transistor formation region 1C. Also, the extension regions EX2 are formed by ion-implanting an n-type impurity into the semiconductor substrate SUB in the pixel transistor formation region 1D. Also, the extension regions EX3 are formed by ion-implanting an n-type impurity into the semiconductor substrate SUB in the peripheral transistor formation region 1E.

That is, in the ion implantation for forming the extension region EX1, the gate electrode GE1 functions as a mask (ion implantation blocking mask) in the transfer transistor formation region 1C. Therefore, in the area of the semiconductor substrate SUB located immediately under the gate electrode GE1, the implantation of the impurity is prevented. As a result, in the transfer transistor formation region 1C, the n-type impurity is ion-implanted into the area of semiconductor substrate SUB located outside the gate electrode GE1 to form the extension region EX1. Accordingly, in the transfer transistor formation region 1C, the extension region EX1 is formed by self alignment with respect to the side walls of the gate electrode GE1.

Note that, of the areas of the semiconductor substrate SUB located on both sides of the gate electrode GE1, the area adjacent to the photodiode formation region 1B (i.e., the area where the n-type semiconductor region NR is formed) is covered with a photoresist pattern (not shown) during the ion implantation for forming the extension region EX1 so that the extension region EX1 is not formed therein. As a result, the extension region EX1 is formed in the one of the areas of the semiconductor substrate SUB located on both sides of the gate electrode GE1 which is not adjacent to the photodiode formation region 1B (i.e., the area opposite to the area where the n-type semiconductor region NR is formed).

Also, in the ion implantation for forming the extension regions EX2, the gate electrode GE2 functions as a mask (ion implantation blocking mask) in the pixel transistor formation region 1D. Therefore, in the area of the semiconductor substrate SUB located immediately under the gate electrode GE2, the implantation of the impurity is prevented. As a result, in the pixel transistor formation region 1D, the n-type impurity is ion-implanted into the areas of the semiconductor substrate SUB located on both sides of the gate electrode GE2 to form the extension regions EX2. Accordingly, in the pixel transistor formation region 1D, the extension regions EX2 are formed by self alignment with respect to the side walls of the gate electrode GE2.

Also, in the ion implantation for forming the extension regions EX3, the gate electrode GE3 functions as a mask (ion implantation blocking mask) in the peripheral circuit formation region 1E. Therefore, in the area of the semiconductor substrate SUB located immediately under the gate electrode GE3, the implantation of the impurity is prevented. As a result, in the peripheral circuit formation region 1E, the n-type impurity is ion-implanted into the areas of the semiconductor substrate SUB located on both sides of the gate electrode GE3 to form the extension regions EX3. Accordingly, in the peripheral circuit formation region 1E, the extension regions EX3 are formed by self alignment with respect to the side walls of the gate electrode GE3.

The extension region EX1 of the transfer transistor formation region 1C, the extension regions EX2 of the pixel transistor formation region 1D, and the extension regions EX3 of the peripheral circuit formation region 1E can be formed by the same ion implantation step or by different ion implantation steps.

Figure 10:
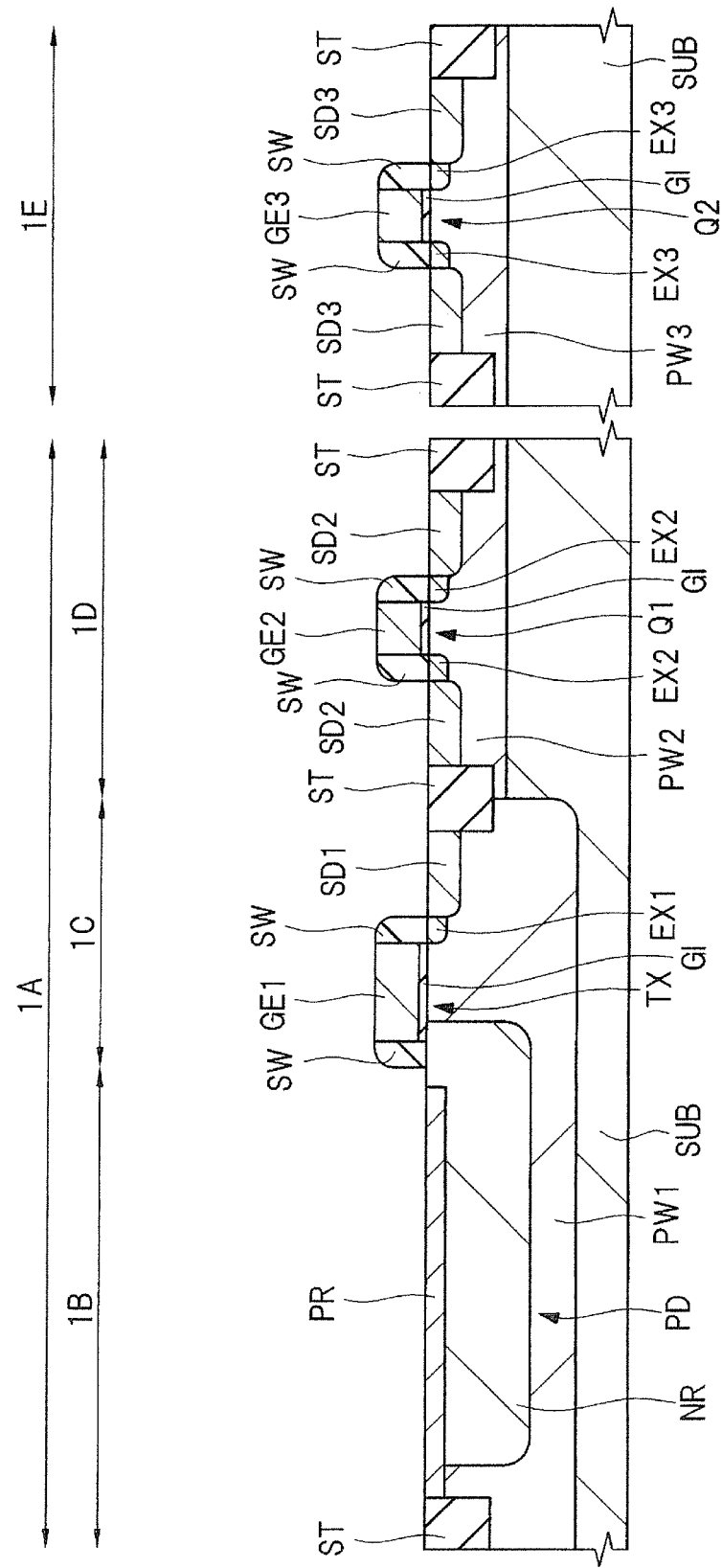
FIG. 10 is a main-portion cross-sectional view of the semiconductor device during the manufacturing process thereof, which is subsequent to FIG. 9.

Next, as shown in FIG. 10, over the side walls of the gate electrodes GE1, G2, and GE3, sidewall spacers SW as side wall insulating films are formed. For example, over the main surface of the semiconductor substrate SUB, an insulating film (single-layer or laminated insulating film) for the sidewall spacers SW is formed so as to cover the gate electrodes GE1, GE2, and GE3 and then etched back by anisotropic etching to be locally left over the side walls of the gate electrodes GE1, GE2, and GE3 to be able to form the sidewall spacers SW.

Next, the $n^+$-type semiconductor regions SD1, SD3, and SD3 are each formed by ion implantation. Among them, the $n^+$-type semiconductor region SD1 is formed by ion-implanting an n-type impurity into the semiconductor substrate SUB in the transfer transistor formation region 1C. Also, the $n^+$-type semiconductor regions SD2 are formed by ion-implanting an n-type impurity into the semiconductor substrate SUB in the pixel transistor formation region 1D. Also, the $n^+$-type semiconductor regions SD3 are formed by ion-implanting an n-type impurity into the semiconductor substrate SUB in the peripheral circuit formation region 1E.

That is, in the ion implantation for forming the $n^+$-type semiconductor region SD1, the gate electrode GE1 and the sidewall spacer SW over the side wall thereof function as a mask (ion implantation blocking mask) in the transfer transistor formation region 1C. Therefore, in the area of the semiconductor substrate SUB located immediately under the gate electrode GE1 and the sidewall spacer SW over the side wall thereof, the implantation of the impurity is prevented. As a result, in the transfer transistor formation region 1C, the n-type impurity is ion-implanted into the area of semiconductor substrate SUB located outside the sidewall spacer SW over the side wall of the gate electrode GE1 to form the $n^+$-type semiconductor region SD1. Accordingly, in the transfer transistor formation region 1C, the $n^+$-type semiconductor region SD1 is formed by self alignment with respect to the side wall spacer SW over the side wall of the gate electrode GE1.

Note that, of the areas of the semiconductor substrate SUB located on both sides of the gate electrode GE1, the area adjacent to the photodiode formation region 1B (i.e., the area where the n-type semiconductor region NR is formed) is covered with a photoresist pattern (not shown) during the ion implantation for forming the $n^+$-type semiconductor region SD1 so that the $n^+$-type semiconductor region SD1 is not formed therein. As a result, the $n^+$-type semiconductor region SD1 is formed in the one of the areas of the semiconductor substrate SUB located on both sides of the gate electrode GE1 which is not adjacent to the photodiode formation region 1B (i.e., the area opposite to the area where the n-type semiconductor region NR is formed).

Also, in the ion implantation for forming the n⁺-type semiconductor regions SD2, the gate electrode GE2 and the sidewall spacers SW over the side walls thereof function as a mask (ion implantation blocking mask) in the pixel transistor formation region 1D. Therefore, in the area of the semiconductor substrate SUB located immediately under the gate electrode GE2 and the sidewall spacers SW over the side walls thereof, the implantation of the impurity is prevented. As a result, in the pixel transistor formation region 1D, the n-type impurity is ion-implanted into the areas of the semiconductor substrate SUB located on both sides of the gate electrode GE2 and the sidewall spacers SW over the side walls thereof to form the n⁺-type semiconductor regions SD2. Accordingly, in the pixel transistor formation region 1D, the n⁺-type semiconductor regions SD2 are formed by self alignment with respect to the side surfaces of the sidewall spaces SW over the side walls of the gate electrode GE2.

Also, in the ion implantation for forming the n⁺-type semiconductor regions SD3, the gate electrode GE3 and the sidewall spacers SW over the side walls thereof function as a mask (ion implantation blocking mask) in the peripheral circuit formation region 1E. Therefore, in the area of the semiconductor substrate SUB located immediately under the gate electrode GE3 and the sidewall spacers SW over the side walls thereof, the implantation of the impurity is prevented. As a result, in the peripheral circuit formation region 1E, the n-type impurity is ion-implanted into the areas of the semiconductor substrate SUB located on both sides of the gate electrode GE3 and the sidewall spacers SW over the side walls thereof to form the n⁺-type semiconductor regions SD3. Accordingly, in the peripheral circuit formation region 1E, the n⁺-type semiconductor regions SD3 are formed by self alignment with respect to the side surfaces of the sidewall spaces SW over the side walls of the gate electrode GE3.

The n⁺-type semiconductor region SD1 of the transfer transistor formation region 1C, the n⁺-type semiconductor regions SD2 of the pixel transistor formation region 1D, and the n⁺-type semiconductor regions SD3 of the peripheral circuit formation region 1E can be formed by the same ion implantation step or by different ion implantation steps.

The n⁺-type semiconductor region SD1 has the same conductivity type (which is an n type herein) as that of the extension region EX1, while having an impurity concentration (which is an n-type impurity concentration) higher than that of the extension region EX1, and a depth (junction depth) larger than that of the extension region EX1.

As a result, in the transfer transistor formation region 1C, an n-type semiconductor region (impurity diffusion layer) which functions as the drain region of the transfer transistor TX is formed of the n⁺-type semiconductor region SD1 and the extension region EX1. Consequently, the drain region of the transfer transistor TX is formed of the extension region EX1 and the n⁺-type semiconductor region SD1 having an impurity concentration higher than that thereof to have an LDD (Lightly doped Drain) structure. The n⁺-type semiconductor region SD1 and the extension region EX1 function as the drain region of the transfer transistor TX, but can also be regarded as the floating diffusion (floating diffusion layer).

The n-type semiconductor region NR is a component of the photodiode PD, but can also function as a semiconductor region for the source of the transfer transistor TX. That is, the source region of the transfer transistor TX is formed of the n-type semiconductor region NR. As a result, the n-type semiconductor region NR and the gate electrode GE1 have a positional relationship therebetween in which a part (closer to the source) of the gate electrode GE1 overlaps a part of the n-type semiconductor region NR in two dimensions (in planar view).

Consequently, the n-type semiconductor region NR and the extension region EX1 are formed to be spaced apart from each other via the channel formation region (corresponding to the area located immediately under the gate electrode GE1) of the transfer transistor TX. This results in a state where the n-type semiconductor region NR adjoins the channel formation region of the transfer transistor TX on the source side thereof, the extension region EX1 adjoins the channel formation region of the transfer transistor TX on the drain side thereof, and the n⁺-type semiconductor region SD1 is formed at a position which is apart from the channel formation region of the transfer transistor TX by a distance corresponding to the extension region EX1 and at which the n⁺-type semiconductor region SD1 is in contact with the extension region EX1.

The n⁺-type semiconductor regions SD2 have the same conductivity type (which is the n type herein) as that of the extension regions EX2, while having an impurity concentration (which is the n-type impurity concentration) higher than that of the extension regions EX2, and a depth (junction depth) larger than that of the extension regions EX2.

As a result, in the pixel transistor formation region 1D, n-type semiconductor regions (impurity diffusion layers) each of which functions as the source or drain of the pixel transistor Q1 are formed of the n⁺-type semiconductor regions SD2 and the extension regions EX2. Consequently, each of the source region and the drain region of the pixel transistor Q1 has an LDD structure. This results in a state where, in the pixel transistor formation region 1D, in the areas of the semiconductor substrate SUB which are spaced apart from each other via the channel formation region, the (pair of) extension regions EX2 are formed and, outside the extension regions EX2 (on the side of each thereof distant from the channel formation region), the n⁺-type semiconductor regions SD2 having the impurity concentration higher than that of the extension regions EX2 are formed.

The n⁺-type semiconductor regions SD3 have the same conductivity type (which is the n type herein) as that of the extension regions EX3, while having an impurity concentration (which is the n-type impurity concentration) higher than that of the extension regions EX3, and a depth (junction depth) larger than that of the extension regions EX3.

As a result, in the peripheral circuit formation region 1E, n-type semiconductor regions (impurity diffusion layers) each of which functions as the source or drain of the peripheral transistor Q2 are formed of the n⁺-type semiconductor regions SD3 and the extension regions EX3. Consequently, each of the source region and the drain region of the peripheral transistor Q2 has an LDD structure. This results in a state where, in the peripheral circuit formation region 1E, in the areas of the semiconductor substrate SUB which are spaced apart from each other via the channel formation region, the (pair of) extension regions EX3 are formed and, outside the extension regions EX3 (on the side of each thereof distant from the channel formation region), the n⁺-type semiconductor regions SD3 having the impurity concentration higher than that of the extension regions EX3 are formed.

Next, annealing treatment (heat treatment) for activating the impurities introduced in the previous ion implantation is performed.

In this manner, the photodiode PD and the transfer transistor TX are formed in the photodiode formation region 1B and the transfer transistor formation region 1C of each of the pixel regions 1A of the semiconductor substrate SUB, the pixel transistor Q1 is formed in the pixel transistor formation region 1D, and the peripheral transistor Q2 is formed in the peripheral circuit formation region 1E.

The photodiode PD has the function of photoelectrically converting light input thereto to generate charges and storing therein the generated charges. The transfer transistor TX has the role of a switch when the charges stored in the photodiode PD are transferred therefrom.

Figure 11:
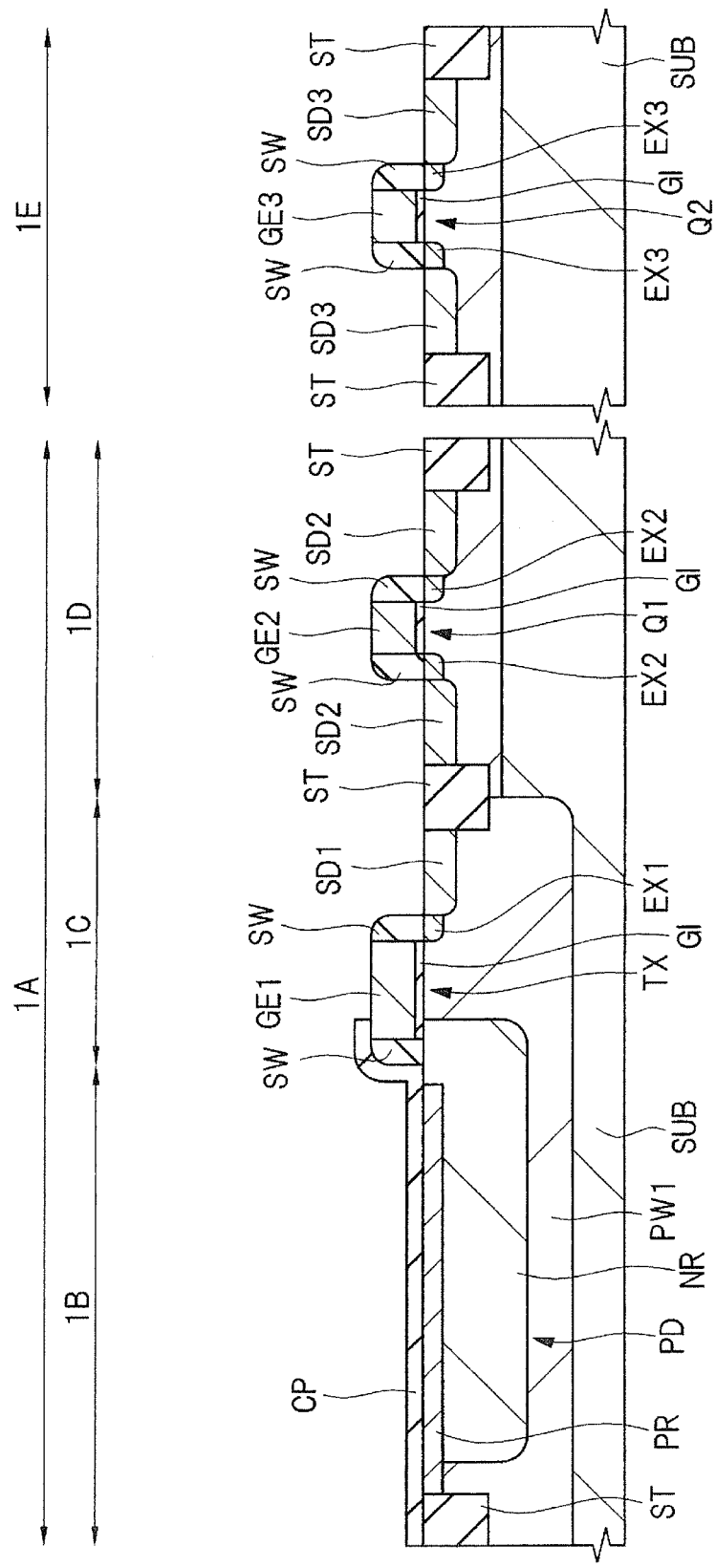
FIG. 11 is a main-portion cross-sectional view of the semiconductor device during the manufacturing process thereof, which is subsequent to FIG. 10.

Next, as shown in FIG. 11, an insulating film is formed over the main surface of the semiconductor substrate SUB and then patterned using a photolithographic method and a dry etching method to form a protective film CP in the pixel region 1A. The protective film CP can be formed of, e.g., a silicon oxide film or the like.

Next, using a salicide (Self Aligned Silicide) technique, a low-resistance metal silicide layer (not shown) can also be formed in each of the upper portions (surface layer portions) of the $n^+$-type semiconductor regions SD1, SD2, and SD3, each of the upper portions (surface layer portions) of the gate electrodes GE1, GE2, and GE3, and the like. For example, after a metal film for forming the metal silicide layer is formed over the semiconductor substrate SUB, heat treatment is performed to cause the metal film to react with the upper layer portion of each of the $n^+$-type semiconductor regions SD1, SD2, and SD3 and the gate electrodes GE1, GE2, and GE3, and then the unreacted portion of the metal film is removed. This allows the metal silicide layer (not shown) to be formed in the upper portion (surface layer portion) of each of the $n^+$-type semiconductor regions SD1, SD2, and SD3, the gate electrodes GE1, GE2, and GE3, and the like. By forming the metal silicide layer, the diffusion resistance of each of the $n^+$-type semiconductor regions SD1, SD2, and SD3, the contact resistance thereof, and the like can be reduced. The metal silicide layer need not be formed. Alternatively, it may also be possible to form the metal silicide layer in any of the $n^+$-type semiconductor regions SD1, SD2, and SD3 and the gate electrodes GE1, GE2, and GE3 and in none of the others.

By the steps performed thus far, the semiconductor elements (which are the photodiode PD, the transfer transistor TX, the pixel transistor Q1, and the peripheral transistor Q2) including the light receiving element (which is the photodiode PD herein) are formed in the semiconductor substrate SUB in Step S2.

Note that, here, the description has been given of the specific example of the case where, in Step S2, the photodiode PD and the transfer transistor TX are formed in the photodiode formation region 1B and the transfer transistor formation region 1C of each of the pixel regions 1A of the semiconductor substrate SUB, the pixel transistor Q1 is formed in the pixel transistor formation region 1D, and the peripheral transistor Q2 is formed in the peripheral circuit formation region 1E. However, Step S2 can be variously modified as necessary. For example, the plurality of impurity ion implantation steps have been performed thus far, but the order of the ion implantation steps is not limited to the order shown above. Also, the plurality of semiconductor regions of the same conductivity type may possibly be formed by a common ion implantation step.

For example, the description has been given of the case where, after the formation of the isolation region ST, the p-type well PW1, the n-type semiconductor region NR, and the $p^+$-type semiconductor region PR are formed but, in another form, it is also possible to form the p-type well PW1, the n-type semiconductor region NR, and the $p^+$-type semiconductor region PR before the formation of the isolation region ST. In other words, it is also possible to form the photodiode PD in the semiconductor substrate SUB before the formation of the isolation region ST. Also, the description has been given of the case where, before the formation of the gate electrodes GE1, GE2, and GE3, the $p^+$-type semiconductor region PR is formed but, in another form, it is also possible to form the $p^+$-type semiconductor region PR after the formation of the gate electrodes GE1, GE2, and GE3. Also, the description has been given of the case where, before the formation of the gate electrodes GE1, GE2, and GE3, the n-type semiconductor region NR is formed but, in another form, it is also possible to form the n-type semiconductor region NR after the formation of the gate electrodes GE1, GE2, and GE3.

Figure 12:
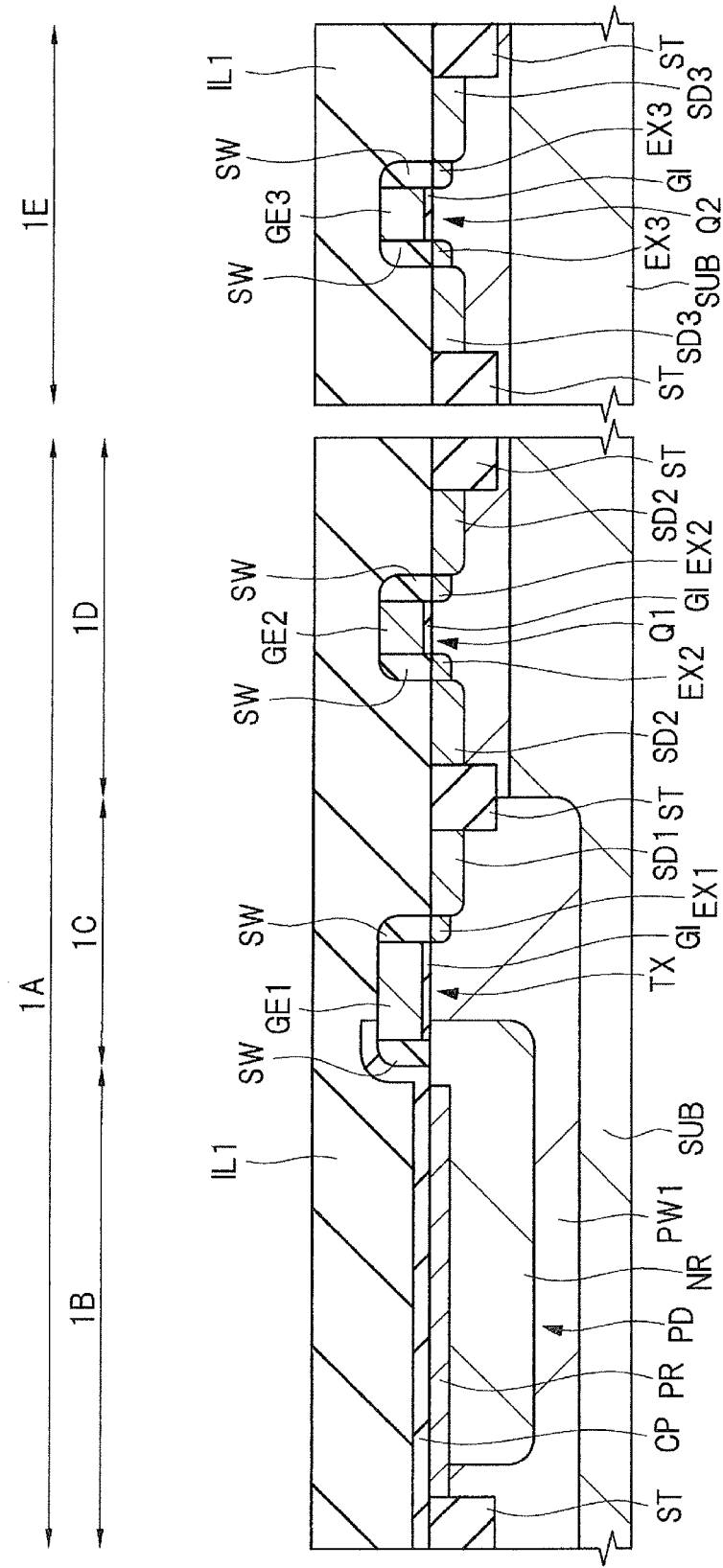
FIG. 12 is a main-portion cross-sectional view of the semiconductor device during the manufacturing process thereof, which is subsequent to FIG. 11.

Thus, after the semiconductor elements including the light receiving element (which is the photodiode PD here) are formed in the semiconductor substrate SUB in Step S2, as shown in FIG. 12, an insulating film (interlayer insulating film) IL1 is formed as an interlayer insulating film over the main surface of the semiconductor substrate SUB (Step S3 in FIG. 3). That is, the insulating film IL1 is formed over the semiconductor substrate SUB so as to cover the gate electrodes GE1, GE2, GE3, the sidewall spacers SW, and the protective film CP.

The insulating film IL1 can be formed of a single-layer film (single-layer insulating film) or a laminated film (laminated insulating film). For example, the insulating film IL1 can be formed of a silicon oxide film. The silicon oxide film can be formed of, e.g., a silicon oxide film produced using, e.g., TEOS (tetra ethyl ortho silicate) as a raw material by, e.g., a CVD method or the like.

After the deposition of the insulating film IL, through the polishing of the surface (upper surface) of the insulating film IL1 by a CMP method or the like, the top surface of the insulating film IL1 is planarized. Even when the surface of the insulating film IL1 is formed with an uneven shape resulting from an underlying level difference at the stage at which the insulating film IL1 is deposited, by polishing the surface of the insulating film IL1 by a CMP method after the deposition thereof, an interlayer insulating film (insulating film IL1) having the planarized surface can be obtained.

Figure 13:
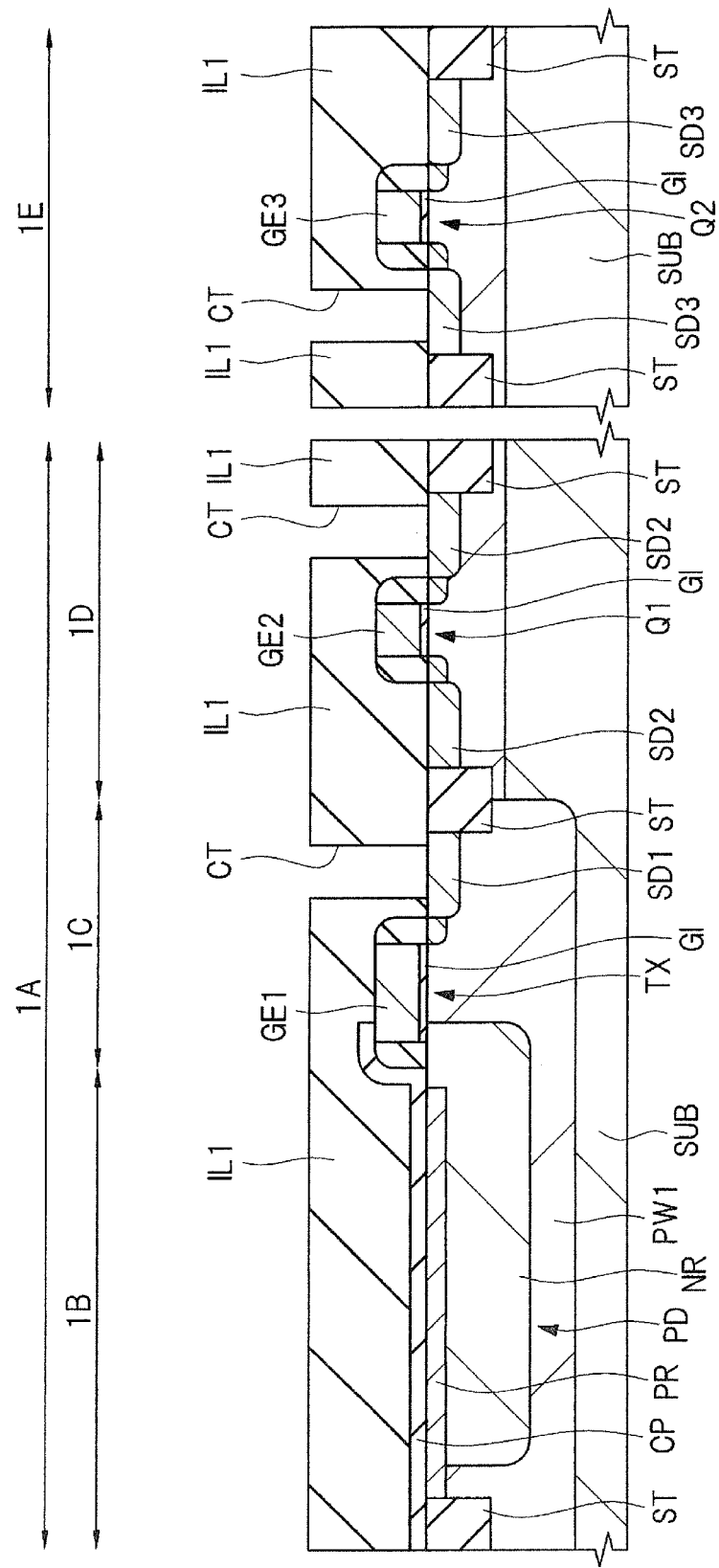
FIG. 13 is a main-portion cross-sectional view of the semiconductor device during the manufacturing process thereof, which is subsequent to FIG. 12.

Next, as shown in FIG. 13, using a photoresist pattern (not shown) formed over the insulating film IL1 as an etching mask, the insulating film IL1 is subjected to dry etching to be formed with contact holes (through holes, holes, or openings) CT each as an opening (Step S4 in FIG. 13).

The contact holes CT are formed so as to extend through the insulating film IL1. At the bottom portions of the contact holes CT, parts of the main surface of the semiconductor substrate SUB, e.g., parts of the surfaces of the $n^+$-type semiconductor regions SD1, SD2, and SD3 (or the surfaces of metal silicide layers in the case where the metal silicide layers are formed), parts of the surfaces of the gate electrodes GE1, GE2, and GE3 (or the surfaces of metal silicide layers in the case where the metal silicide layers are formed), or the like are exposed.

Figure 14:
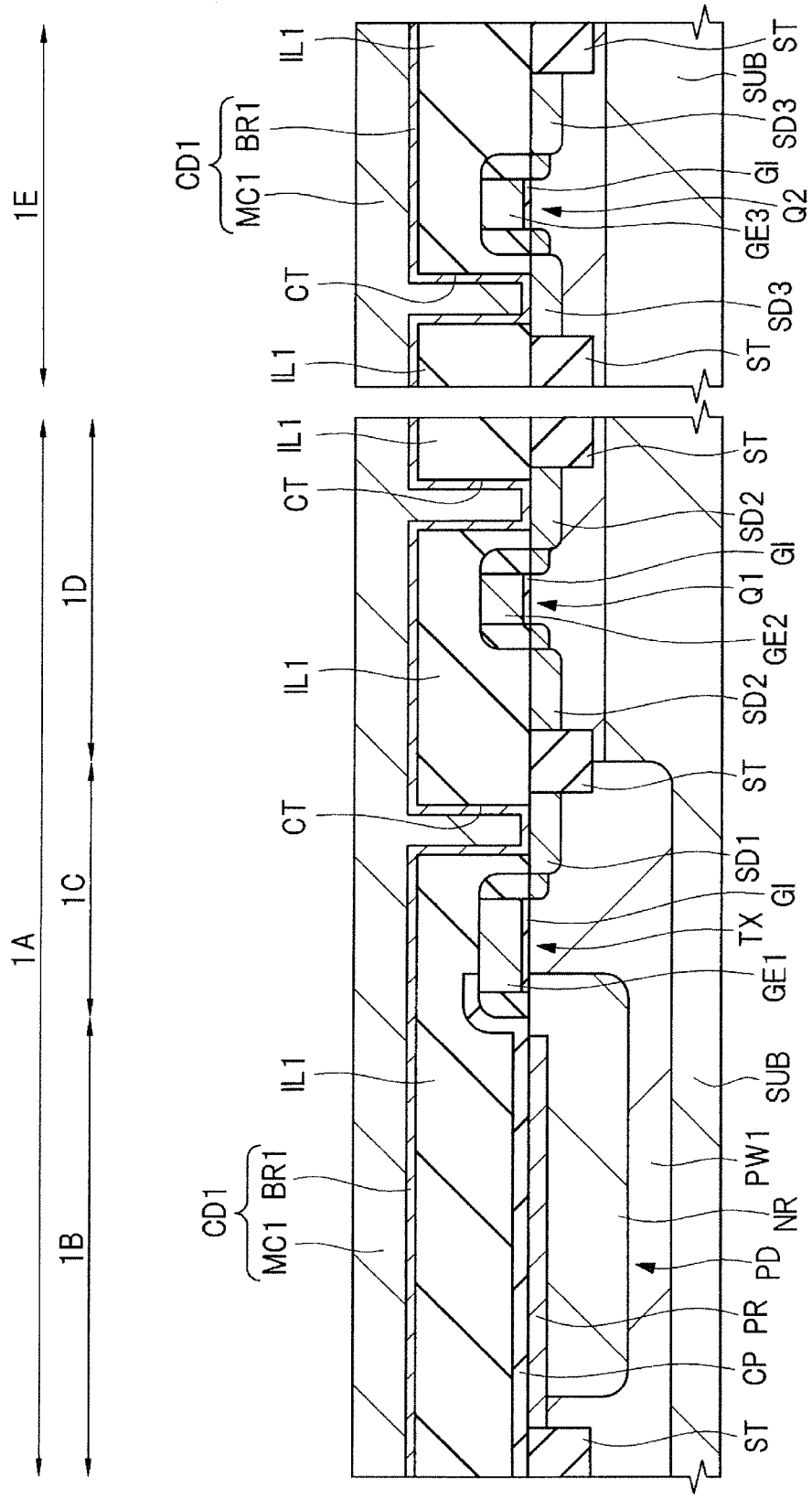
FIG. 14 is a main-portion cross-sectional view of the semiconductor device during the manufacturing process thereof, which is subsequent to FIG. 13.

Next, as shown in FIG. 14, a conductive film (metal film) CD1 for forming plugs PG is formed over the insulating film IL1 to be embedded in (to fill) the contact holes CT (Step S5 in FIG. 3).

The conductive film CD1 includes a barrier conductor film (barrier metal film) BR1, and a main conductor film MC1 over the barrier conductor film BR1. The main conductor film MC1 is thicker than the barrier conductor film BR1. The barrier conductor film BR1 is formed of, e.g., a titanium film, a titanium nitride film, or a laminated film thereof and can be formed by, e.g., a sputtering method, a plasma CVD method, or the like. The main conductor film MC1 is formed of, e.g., a tungsten film or the like and can be formed by, e.g., a CVD method or the like.

Accordingly, the step of forming the conductive film CD1 in Step S5 has the step of forming the barrier conductor film BR1 over the insulating film IL1 including the inside (bottom portions and side walls) of the contact holes CT, and the step of forming, after the foregoing step, the main conductor film MC1 over the barrier conductor film BR1 so as to fill the contact holes CT therewith. Note that, since the conductive film CD1 is formed of a metal or a metal compound showing metal conduction, the conductive film CD1 can be regarded as a metal film. Also, a metal compound film showing metal conduction such as a titanium nitride film or a tantalum nitride film can also be regarded as a metal film. The barrier film BR1 has the function of, e.g., improving the adhesion between the conductive film CD1 and the insulating film IL1 or the like.

Figure 15:
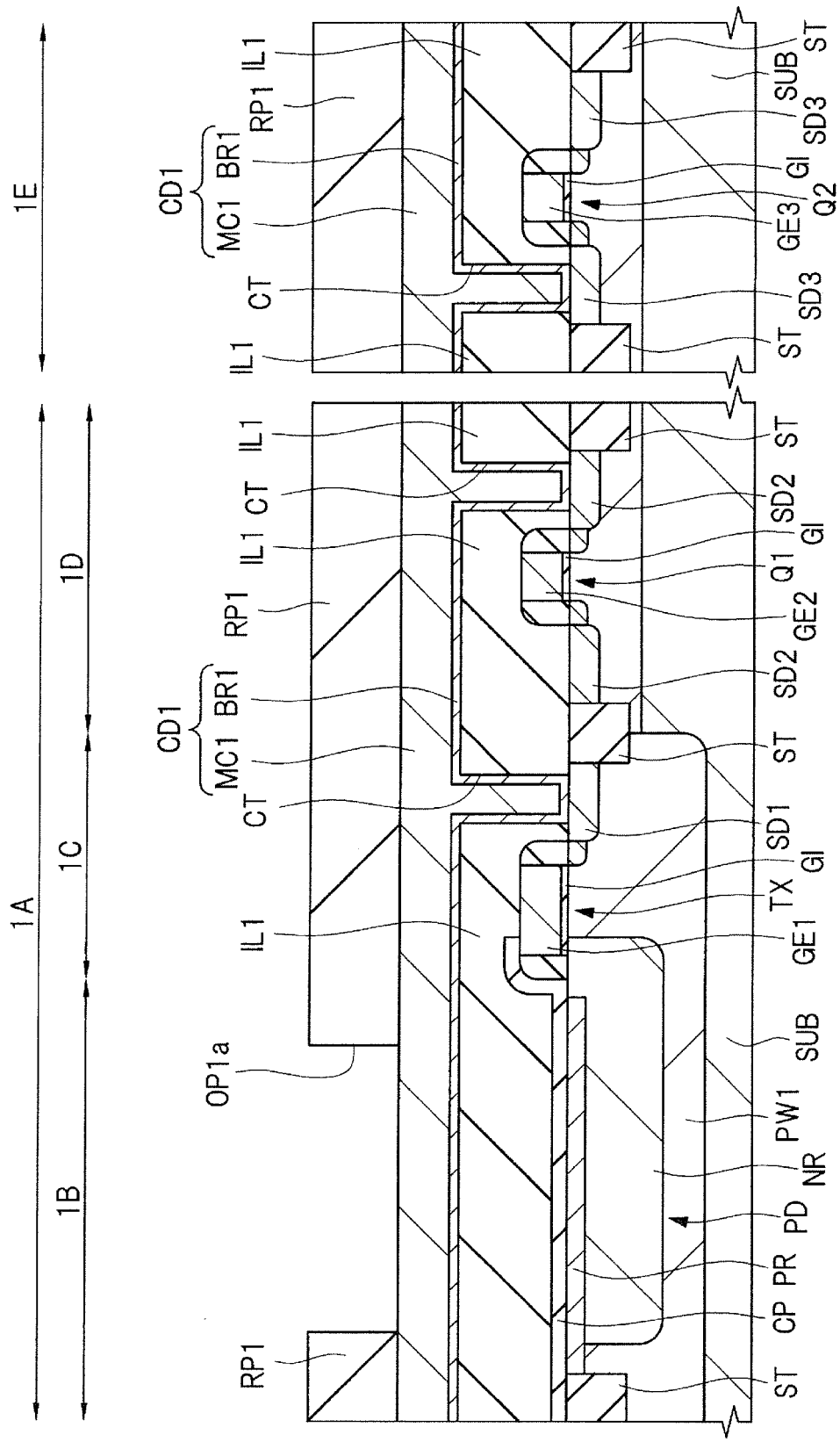
FIG. 15 is a main-portion cross-sectional view of the semiconductor device during the manufacturing process thereof, which is subsequent to FIG. 14.

Next, as shown in FIG. 15, over the conductive film CD1, a photoresist pattern (resist pattern) PR1 is formed using a photolithographic method (Step S6 in FIG. 3). The photoresist pattern RP1 has an opening OP1a in a region where an opening OP1b described later is to be formed. The opening OP1a of the photoresist pattern RP1 does not overlap any of the contact holes CT in planar view.

Note that "in planar view" refers to the case where an object of concern is viewed in a plan view parallel with the main surface of the semiconductor substrate SUB. Also, "two-dimensionally overlaps" refers to the case where the object of concern overlaps something in planar view and "does not two-dimensionally overlap" refers to the case where the object of concern does not overlap something in planar view.

Figure 16:
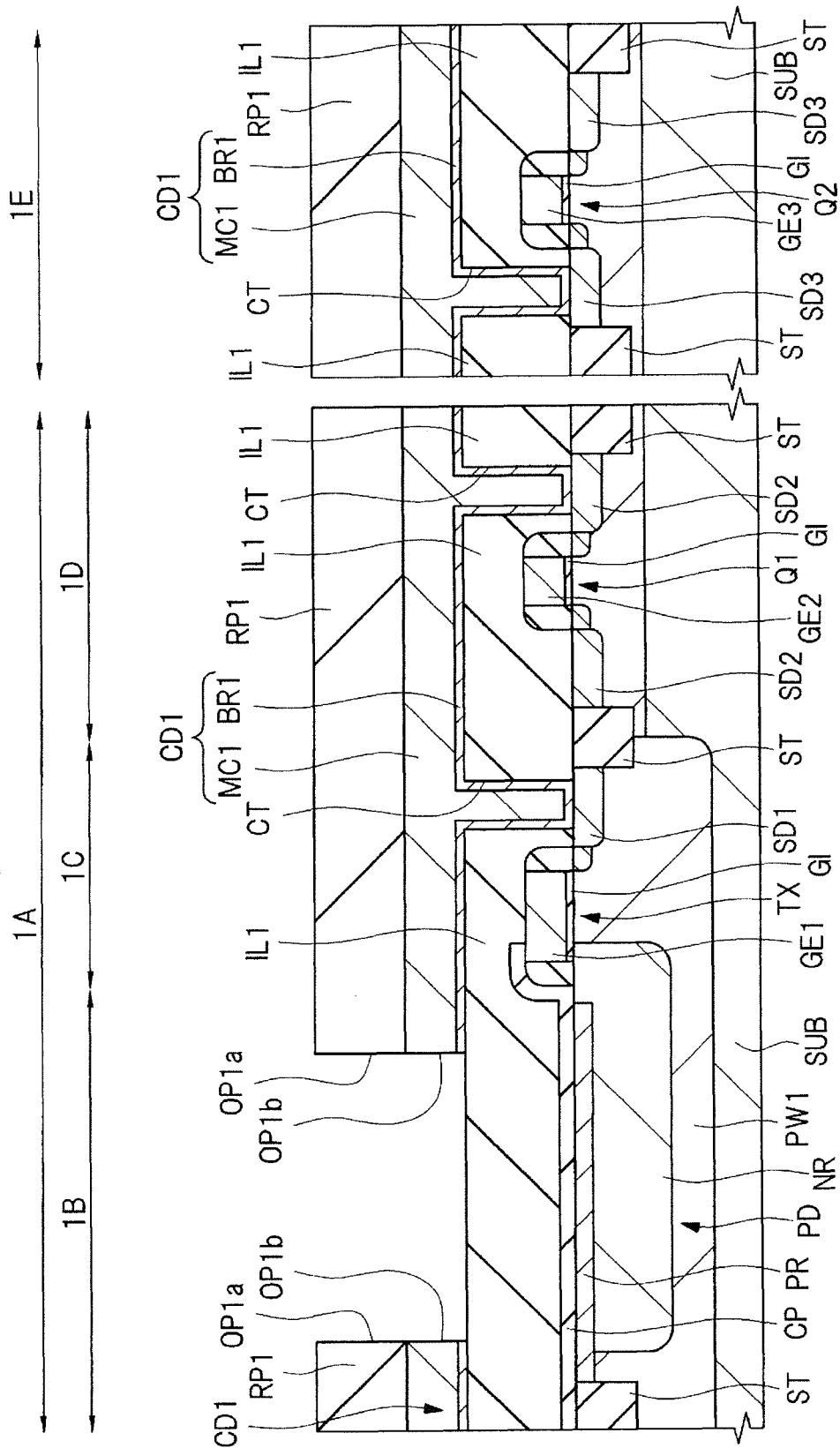
FIG. 16 is a main-portion cross-sectional view of the semiconductor device during the manufacturing process thereof, which is subsequent to FIG. 15.

Next, as shown in FIG. 16, using the photoresist pattern RP1 as a mask (etching mask), the conductive film CD1 is etched (Step S7 in FIG. 3). Since the etching is preferably rather anisotropic, dry etching is used preferably.

In Step S7, the portion of the conductive film CD1 exposed from the opening OP1a of the photoresist pattern RP1 is etched, while the portion of the conductive film CD1 covered with the photoresist pattern RP1 is prevented from being etched. Accordingly, when the etching in Step S7 is performed, the conductive film CD1 located in the region exposed from the opening OP1a of the photoresist pattern RP1 is selectively etched to be formed with the opening OP1b. The two-dimensional position and two-dimensional shape of the opening OP1b formed in the conductive film CD1 substantially coincide with the two-dimensional position and two-dimensional shape of the opening OP1a of the photoresist pattern RP1. The opening OP1b is formed so as to extend through the conductive film CD1. At the bottom portion of the opening OP1b of the conductive film CD1, the insulating film IL1 (the upper surface thereof) is exposed. In Step S7, the insulating film IL1 can be used as an etching stopper. After the etching in Step S7, the photoresist pattern RP1 is removed.

Figure 17:
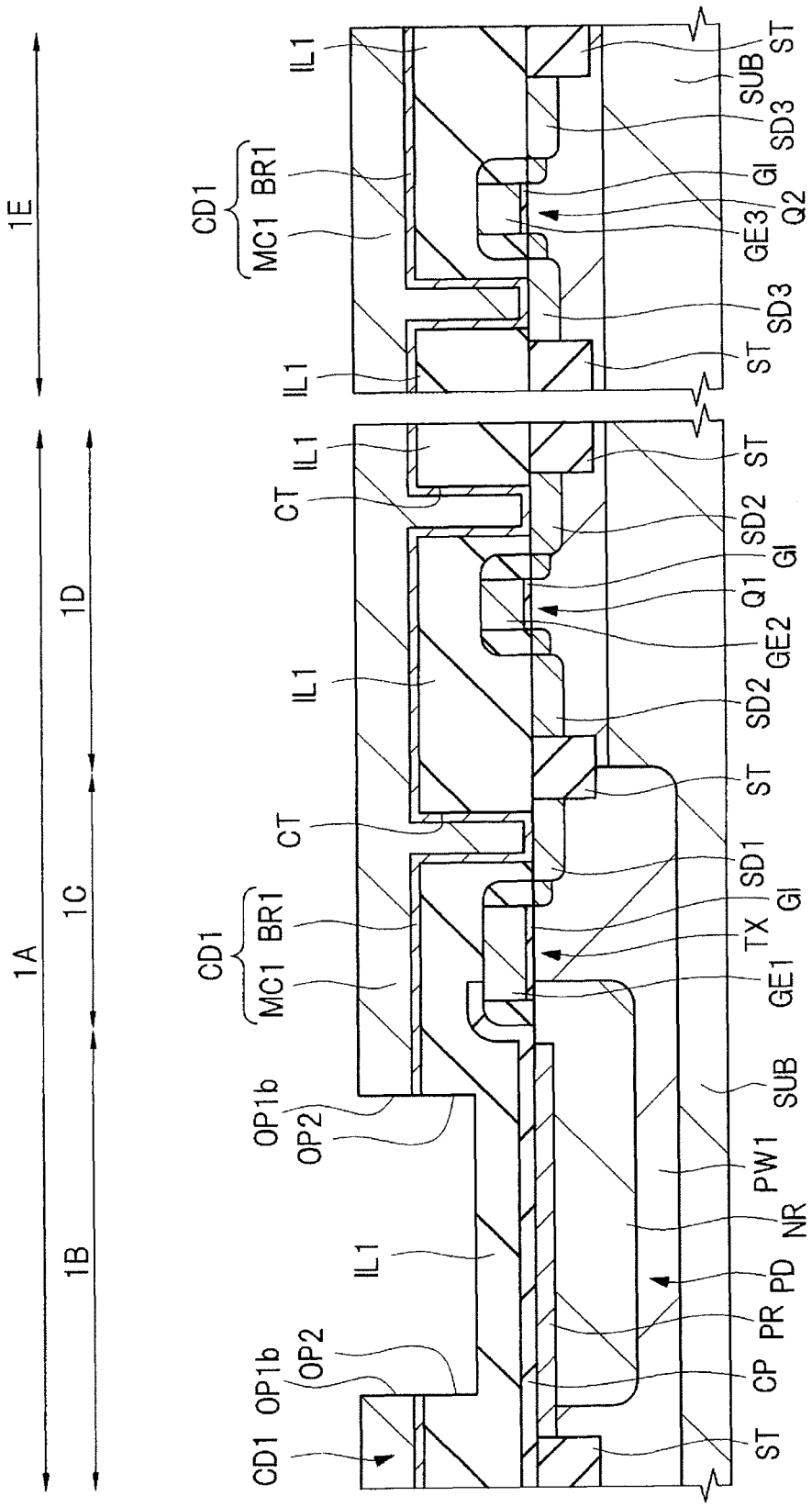
FIG. 17 is a main-portion cross-sectional view of the semiconductor device during the manufacturing process thereof, which is subsequent to FIG. 16.

Next, as shown in FIG. 17, using the conductive film CD1 as a mask (etching mask), the insulating film IL1 is etched (Step S8 in FIG. 3). Since the etching is preferably rather anisotropic, dry etching is used preferably.

In Step S8, the portion of the insulating film IL1 exposed from the opening OP1b of the conductive film CD1 is etched, while the portion of the insulating film IL1 covered with the conductive film CD1 is prevented from being etched. Accordingly, when the etching in Step S8 is performed, the insulating film IL1 located in the region exposed from the opening OP1b of the conductive film CD1 is selectively etched to be formed with an opening (recessed portion, depressed portion, hole, or trench portion) OP2. The two-dimensional position and two-dimensional shape of the opening OP2 formed in the insulating film IL1 substantially coincide with the two-dimensional position and two-dimensional shape of the opening OP1b of the conductive film CD1.

However, the opening OP2 of the insulating film IL1 does not extend through the insulating film IL1 and, at the bottom portion of the opening OP2, a part of the insulating film IL1 remains. That is, the thickness of the insulating film IL1 in the opening OP2 is smaller than the thickness of the insulating film IL1 in the region thereof other than the opening OP2. Accordingly, in Step S8, it is preferable to control an amount of etching (depth of etching) of the insulating film IL1 by performing the adjustment of an etching time or the like such that the insulating film IL1 having a predetermined thickness remains at the bottom portion of the opening OP2. The opening OP2 can also be regarded as a recessed portion or a depressed portion.

Note that, in the present embodiment, after the photoresist pattern RP1 is removed, the insulating film IL1 is etched using the conductive film CD1 as an etching mask in Step S8 to be formed with the opening OP2. In another form, it is also possible to etch the insulating film IL1 using the photoresist pattern RP1 as an etching mask, without removing the photoresist pattern RP1, to form the opening OP2 in Step S8 and then remove the photoresist pattern RP1.

Figure 18:
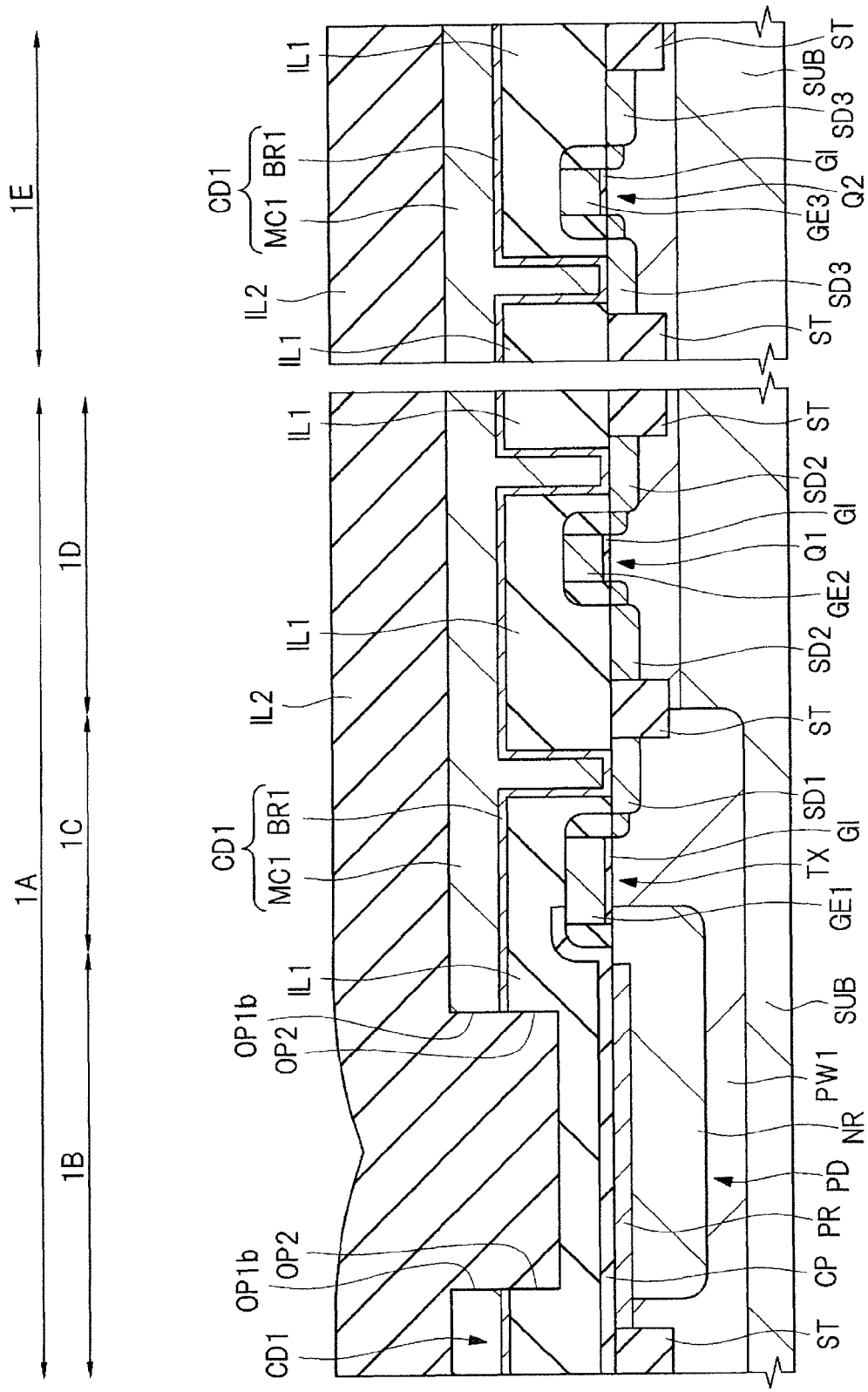
FIG. 18 is a main-portion cross-sectional view of the semiconductor device during the manufacturing process thereof, which is subsequent to FIG. 17.

Next, as shown in FIG. 18, an insulating film IL2 is formed over the conductive film CD1 so as to be embedded in (to fill) each of the opening OP2 of the insulating film IL1 and the opening OP1b of the conductive film CD1 (Step S9 in FIG. 3).

The insulating film IL2 is an insulating film used as a material for filling the opening OP2 of the insulating film IL1. Preferably, the insulating film IL2 is higher in refractivity and translucency with respect to light (light caused to be incident on the photodiode PD) than the insulating film IL1.

Here, when a comparison is made between the magnitudes of translucencies of the two films, the film having a higher light transmittance when the thicknesses of the two films are assumed to be the same can be determined to have a higher translucency. That is, it can be said that the film showing smaller attenuation in the intensity of light when the light passes through the two films over the same distance (the intensities of light incident on the two films are assumed to be the same) has a higher translucency.

As the insulating film IL2, a silicon nitride film can be used appropriately. The insulating film IL2 can be formed using, e.g., a CVD method or the like.

Figure 19:
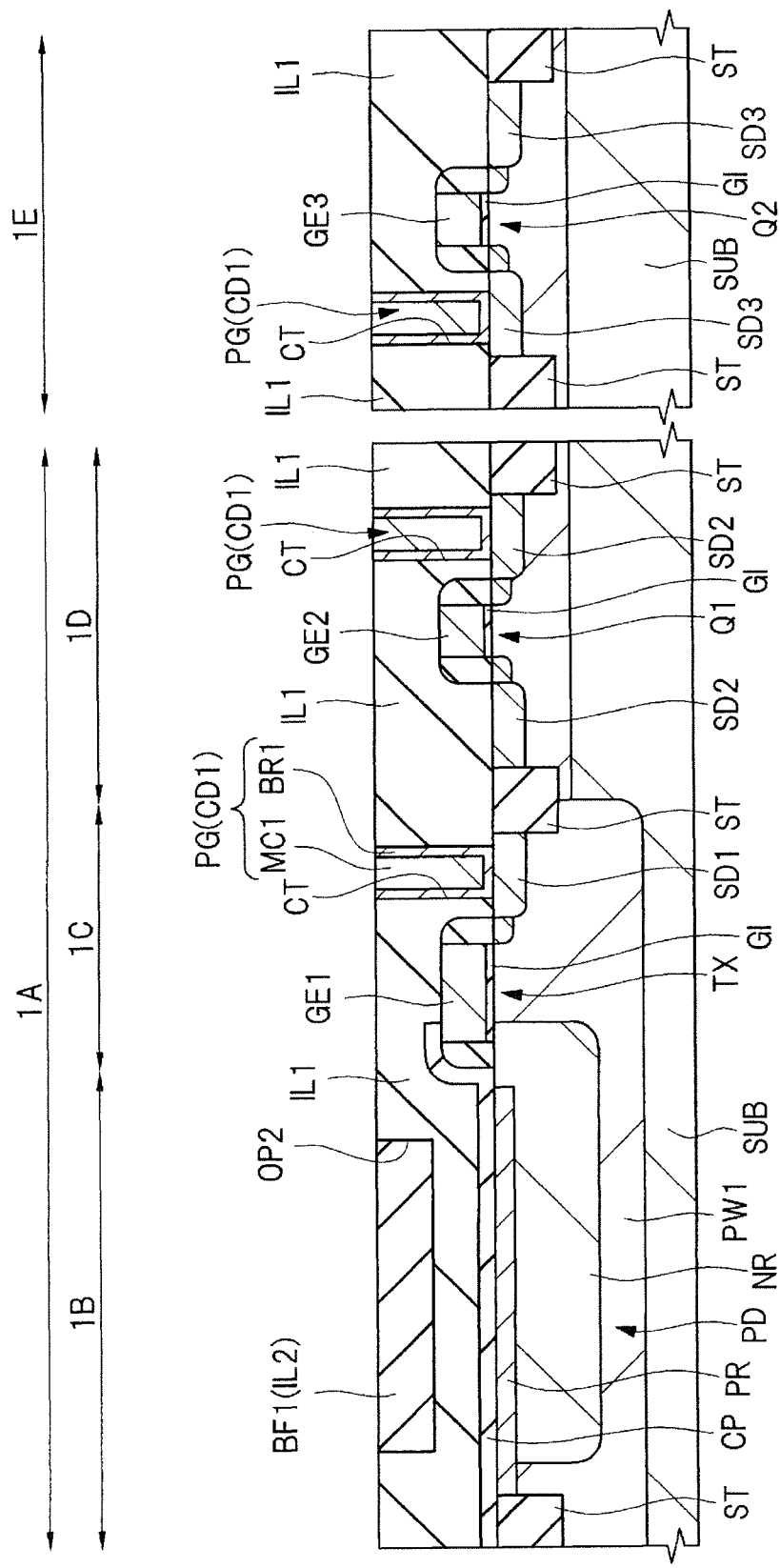
FIG. 19 is a main-portion cross-sectional view of the semiconductor device during the manufacturing process thereof, which is subsequent to FIG. 18.

Next, as shown in FIG. 19, by polishing the insulating film IL2 and the conductive film CD1 by a CMP method, the insulating film IL2 located outside the opening OP2 and the conductive film CD1 located outside the contact holes CT are removed (Step S10 in FIG. 3).

By the CMP step in Step S10, the upper surface of the insulating film IL1 is exposed, the conductive film CD1 is embedded in each of the contact holes CT of the insulating film IL1 to remain, and the insulating film IL2 is embedded in the opening OP2 of the insulating film IL1 to remain, while the other portions of the conductive film CD1 and the insulating film IL2 are removed.

The conductive film CD1 embedded and remaining in the contact holes CT of the insulating film IL1 forms the plugs PG, and the insulating film IL2 embedded and remaining in the opening OP2 of the insulating film IL1 forms an embedded insulating film BF1. That is, when the CMP step in Step S10 is performed, a structure is obtained in which the plugs PG are embedded in the contact holes CT of the insulating film IL1 and the embedded insulating film BF1 is embedded in the opening OP2 of the insulating film IL1.

The plugs PG are each formed of the conductive film CD1 embedded in the contact holes CT. However, since the conductive film CD1 is formed of the barrier conductor film BR1 and the main conductor film MC1, the plugs have the side surfaces and bottom surfaces thereof each formed of the barrier conductor film BR1 and the inner portions thereof each formed of the main conductor film MC1.

The embedded insulating film BF1 functions as a waveguide for light caused to be incident on the photodiode PD which is a light receiving element. Accordingly, the embedded insulating film BF1 is preferably formed over the light receiving element. As optical properties, the embedded insulating film BF1 preferably has a refractivity higher than that of the interlayer insulating film (which is the insulating film IL1 herein) in which the embedded insulating film BF1 is embedded and a property (high translucency) which allows the light (light caused to be incident on the photodiode PD) to easily pass therethrough.

Figure 20:
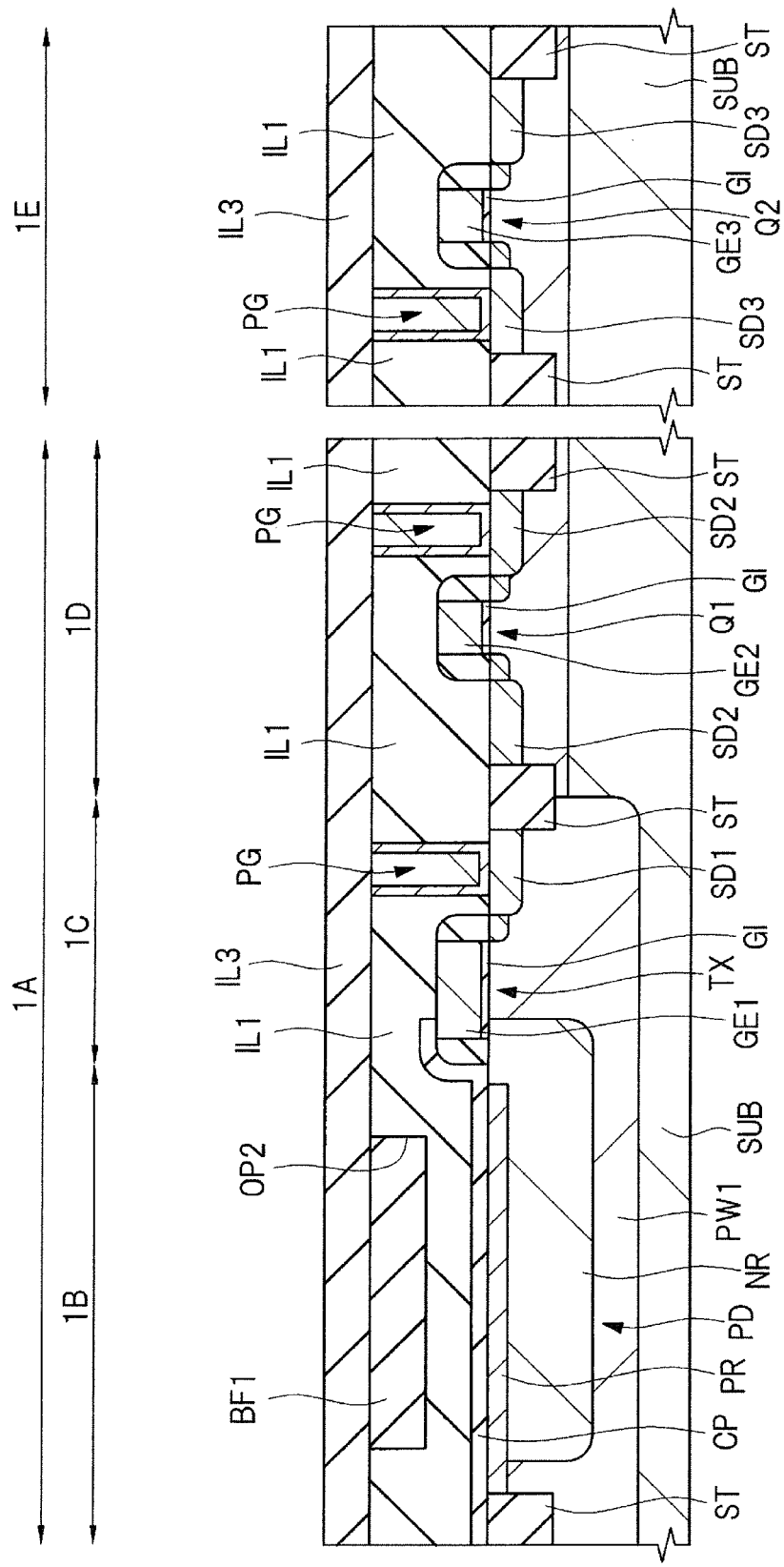
FIG. 20 is a main-portion cross-sectional view of the semiconductor device during the manufacturing process thereof, which is subsequent to FIG. 19.

Next, as shown in FIG. 20, over the insulating film IL2 in which the plugs PG and the embedded insulating film BF1 are embedded, an insulating film (interlayer insulating film) IL3 is formed as an interlayer insulating film (Step S11 in FIG. 4). The insulating film IL3 can be formed of a single-layer film (single-layer insulating film) or a laminated film (laminated insulating film). For example, the insulating film IL3 can be formed of a silicon oxide film, but can also be formed of a silicon oxide film containing at least one or more of carbon (C), nitrogen (N), and fluorine (F) so as to have a dielectric constant lower than that of a silicon oxide.

Figure 21:
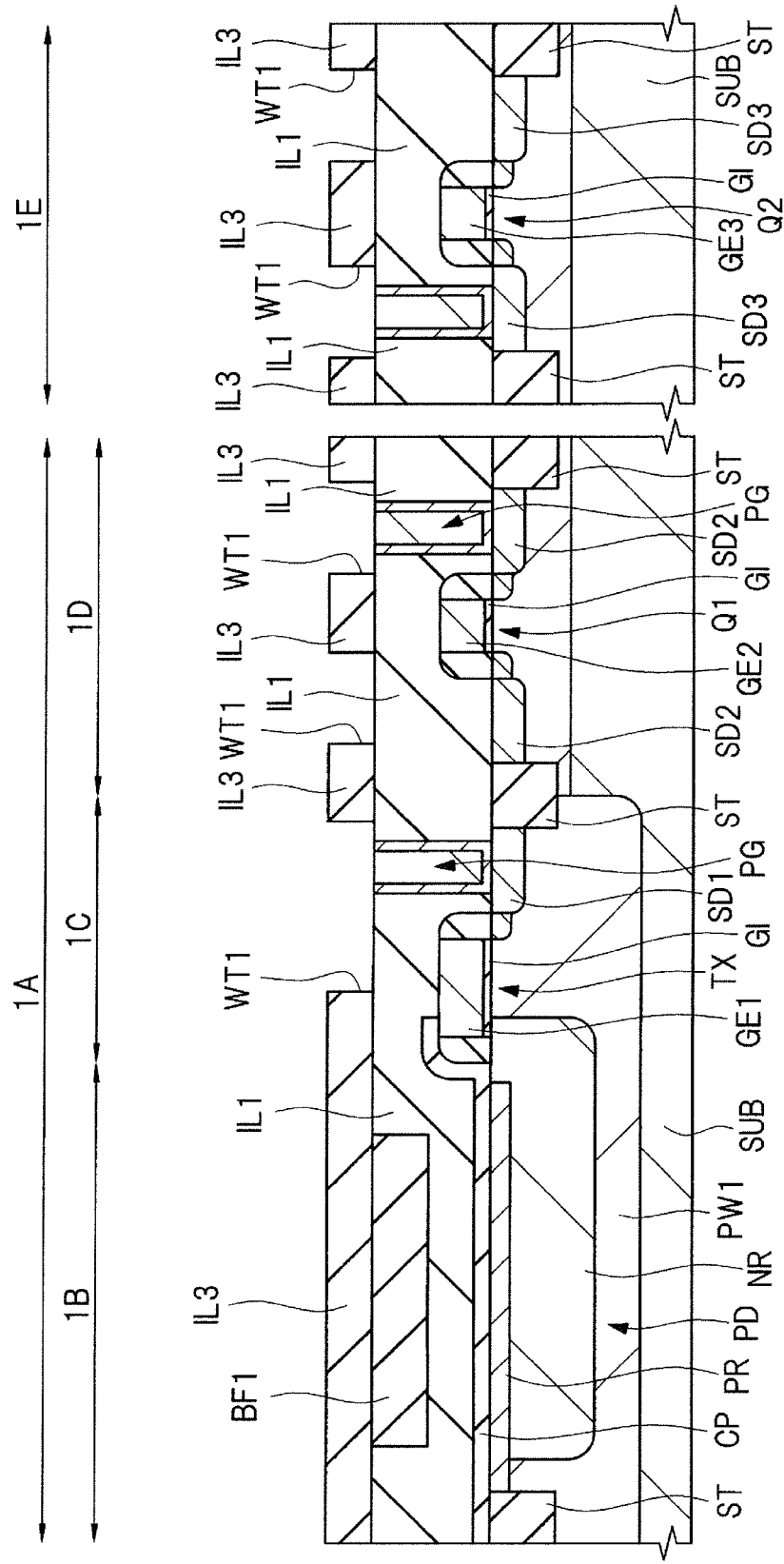
FIG. 21 is a main-portion cross-sectional view of the semiconductor device during the manufacturing process thereof, which is subsequent to FIG. 20.

Next, as shown in FIG. 21, using a photoresist pattern (not shown) formed over the insulating film IL3 as an etching mask, the insulating film IL3 is subjected to dry etching to be formed with wire trenches (wire openings) WT1 as openings (Step S12 in FIG. 4).

The wire trenches WT1 are trenches in which wires M1 described later are to be embedded and which are formed so as to extend through the insulating film IL3. The wire trenches WT can also be regarded as openings (wire openings) in which the wires M1 are to be embedded. The plugs PG overlap the wire trenches WT1 in planar view and the upper surfaces of the plugs PG are exposed from the wire trenches WT1. On the other hand, over the embedded insulating film BF1, the wire trenches WT are not formed. Accordingly, the embedded insulating film BF1 is not exposed from the wire trenches WT1. That is, the wire trenches WT1 are formed so as not to overlap the embedded insulating film BF1 in planar view.

Figure 22:
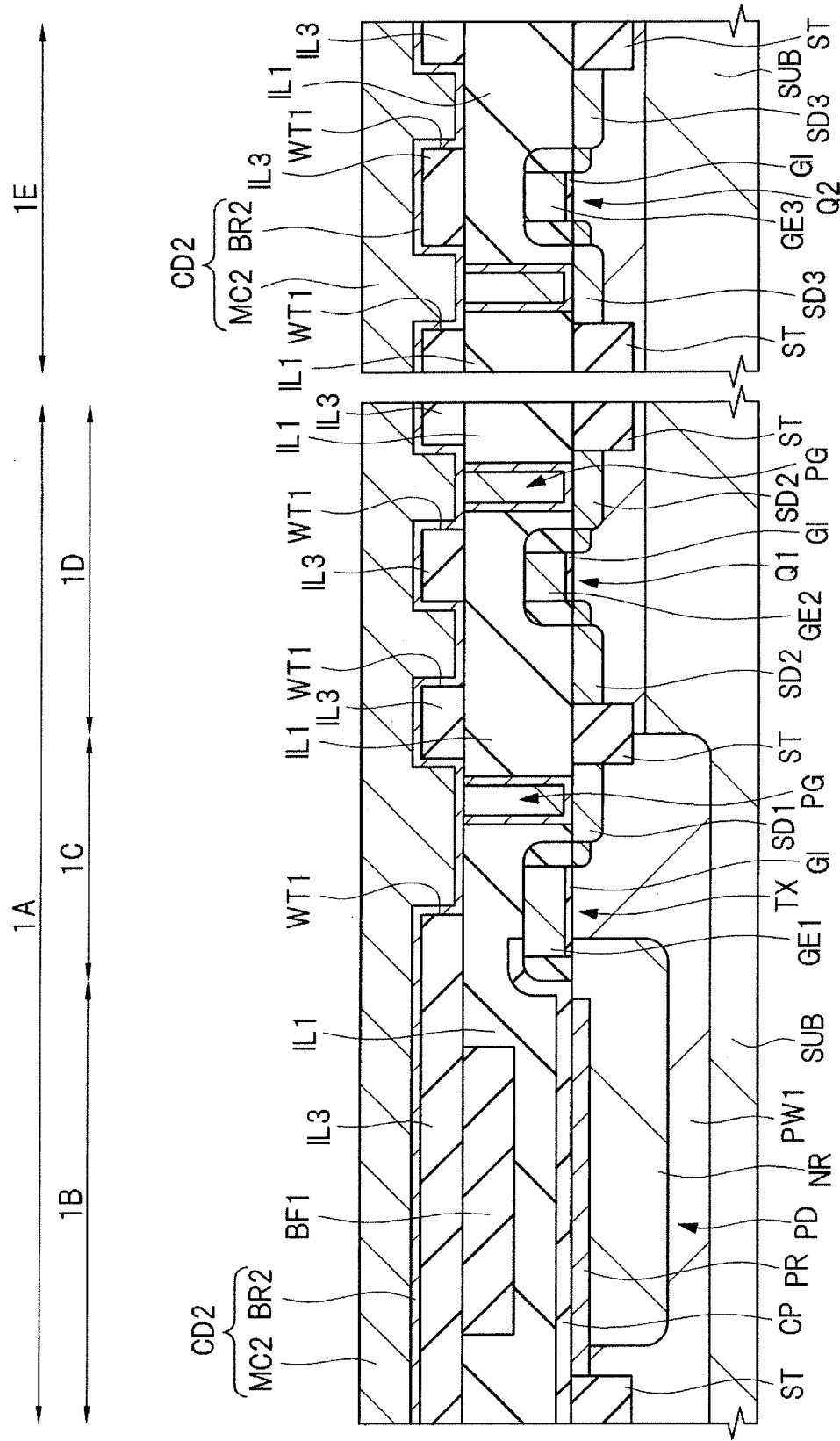
FIG. 22 is a main-portion cross-sectional view of the semiconductor device during the manufacturing process thereof, which is subsequent to FIG. 21.

Next, as shown in FIG. 22, a conductive film (metal film) CD2 for forming the wires M1 is formed over the insulating film IL3 so as to be embedded in (to fill) the wire trenches WT1 (Step S13 in FIG. 4).

The conductive film CD2 includes a barrier conductor film (barrier metal film) BR2, and a main conductor film MC2 over the barrier conductor film BR2. The main conductor film MC2 is thicker than the barrier conductor film BR2. The barrier conductor film BR2 is formed of, e.g., a tantalum film, a tantalum nitride film, or a laminated film thereof and can be formed by, e.g., a sputtering method, a plasma CVD method, or the like. The main conductor film MC2 is formed of a copper (Cu) film containing copper as a main component or the like and can be formed by a plating method (e.g., an electrolytic plating method) or the like.

Accordingly, the step of forming the conductive film CD2 in Step S13 has the step of forming the barrier conductor film BR2 over the insulating film IL3 including the inside (bottom portions and side walls) of the wire trenches WT1, and the step of forming, after the foregoing step, the main conductor film MC2 over the barrier conductor film BR2 so as to fill the wire trenches WT1 therewith. Note that, since the conductive film CD2 is formed of a metal or a metal compound showing metal conduction, the conductive film CD2 can be regarded as a metal film. On the other hand, the barrier film BR2 has the function of, e.g., improving the adhesion between the conductive film CD2 and the interlayer insulating film (insulating film IL3) and preventing copper in the main conductor film CD2 from being diffused into the interlayer insulating film (insulating film IL3) or the like. The same applies to barrier films described later BR3 and BR4 described later.

In Step S13, it is also possible to first form the barrier conductor film BR2 over the insulating film IL3 including the inside (bottom portions and side walls) of the wire trenches WT1, subsequently form a copper seed layer over the barrier conductor film BR2 by a CVD method, a sputtering method, or the like, and then form a copper plating film over the seed layer using an electrolytic plating method or the like to fill the wire trenches WT1 therewith. In this case, a combination of the copper seed layer and the copper plating film serves as the main conductor film MC2.

Figure 23:
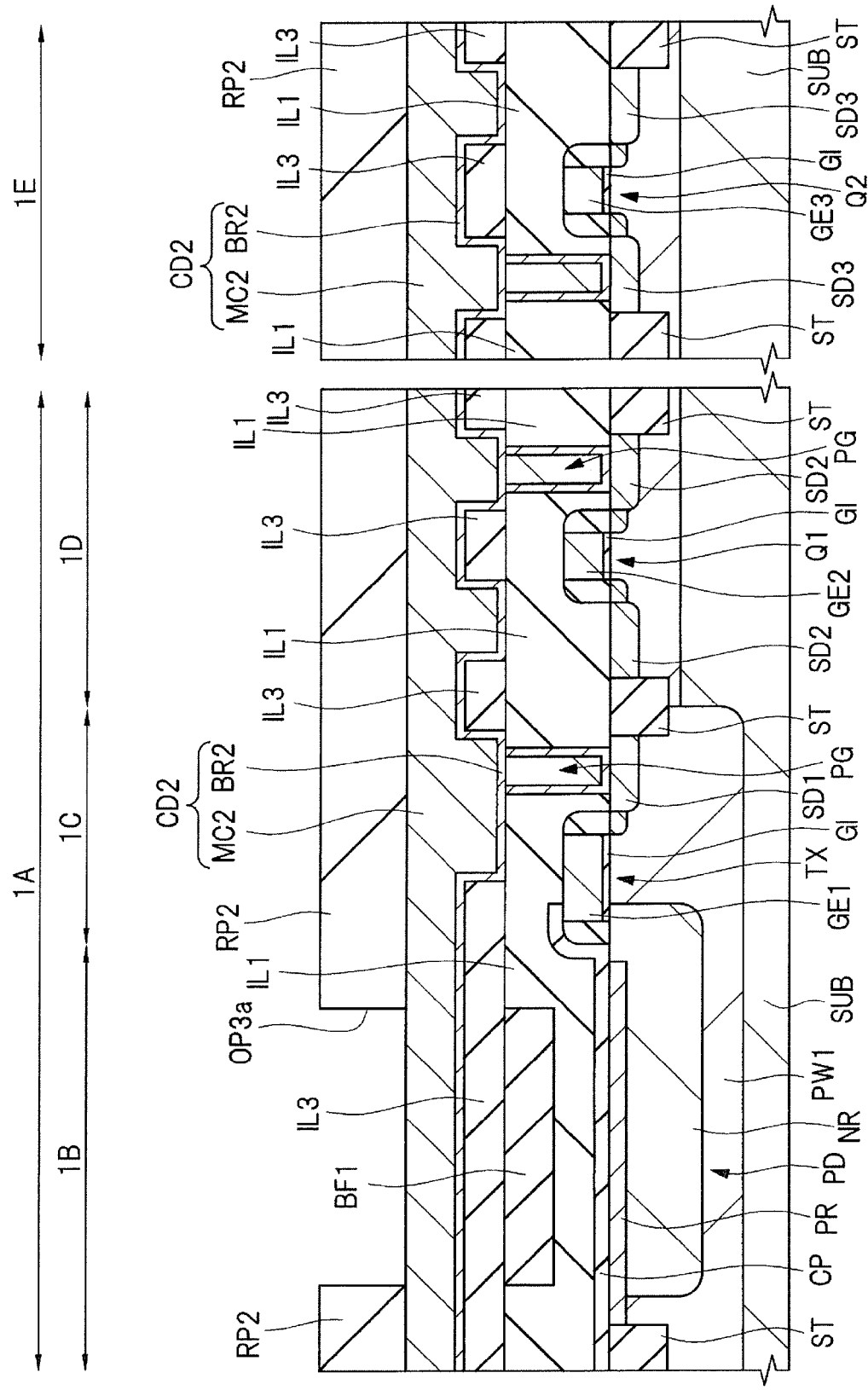
FIG. 23 is a main-portion cross-sectional view of the semiconductor device during the manufacturing process thereof, which is subsequent to FIG. 22.

Then, as shown in FIG. 23, a photoresist pattern (resist pattern) PR2 is formed over the conductive film CD2 using a photolithographic method (Step S14 in FIG. 4). The photoresist pattern PR2 has an opening OP3a. The opening OP3a of the photoresist pattern RP2 does not overlap any of the wire trenches WT1 in planar view.

The opening OP3a of the photoresist pattern RP2 has a two-dimensional position and a two-dimensional shape which substantially coincide with those of the foregoing opening OP1a of the foregoing photoresist pattern RP1. Therefore, for the photoresist pattern RP2 and the foregoing photoresist pattern RP1, the same photomask can be used in an exposure step of exposing an applied photoresist layer to light to allow a reduction in the manufacturing cost of the semiconductor device.

Figure 24:
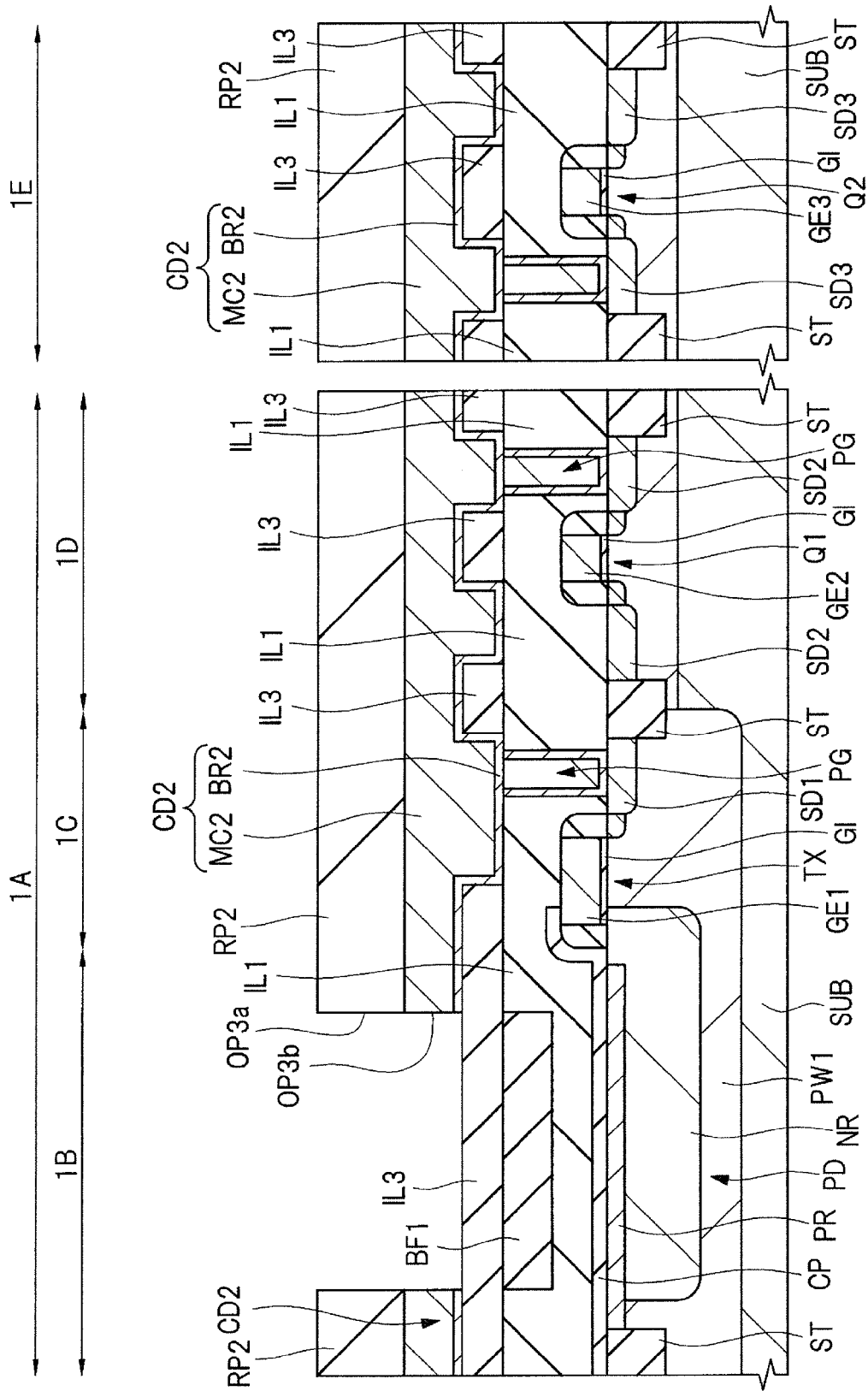
FIG. 24 is a main-portion cross-sectional view of the semiconductor device during the manufacturing process thereof, which is subsequent to FIG. 23.

Next, as shown in FIG. 24, using the photoresist pattern RP2 as a mask (etching mask), the conductive film CD2 is etched (Step S15 in FIG. 4). Since the etching is preferably rather anisotropic, dry etching is used preferably.

In Step S15, the portion of the conductive film CD2 exposed from the opening OP3a of the photoresist pattern RP2 is etched, while the portion of the conductive film CD2 covered with the photoresist pattern RP2 is prevented from being etched. Accordingly, when the etching in Step S15 is performed, the conductive film CD2 located in the region exposed from the opening OP3a of the photoresist pattern RP2 is selectively etched to be formed with an opening OP3b. The two-dimensional position and two-dimensional shape of the opening OP3b formed in the conductive film CD2 substantially coincide with the two-dimensional position and two-dimensional shape of the opening OP3a of the photoresist pattern RP2. The opening OP3b is formed so as to extend through the conductive film CD2. At the bottom portion of the opening OP3b of the conductive film CD2, the insulating film IL3 (the upper surface thereof) is exposed. In Step S15, the insulating film IL3 can be used as an etching stopper. After the etching in Step S15, the photoresist pattern RP2 is removed.

Figure 25:
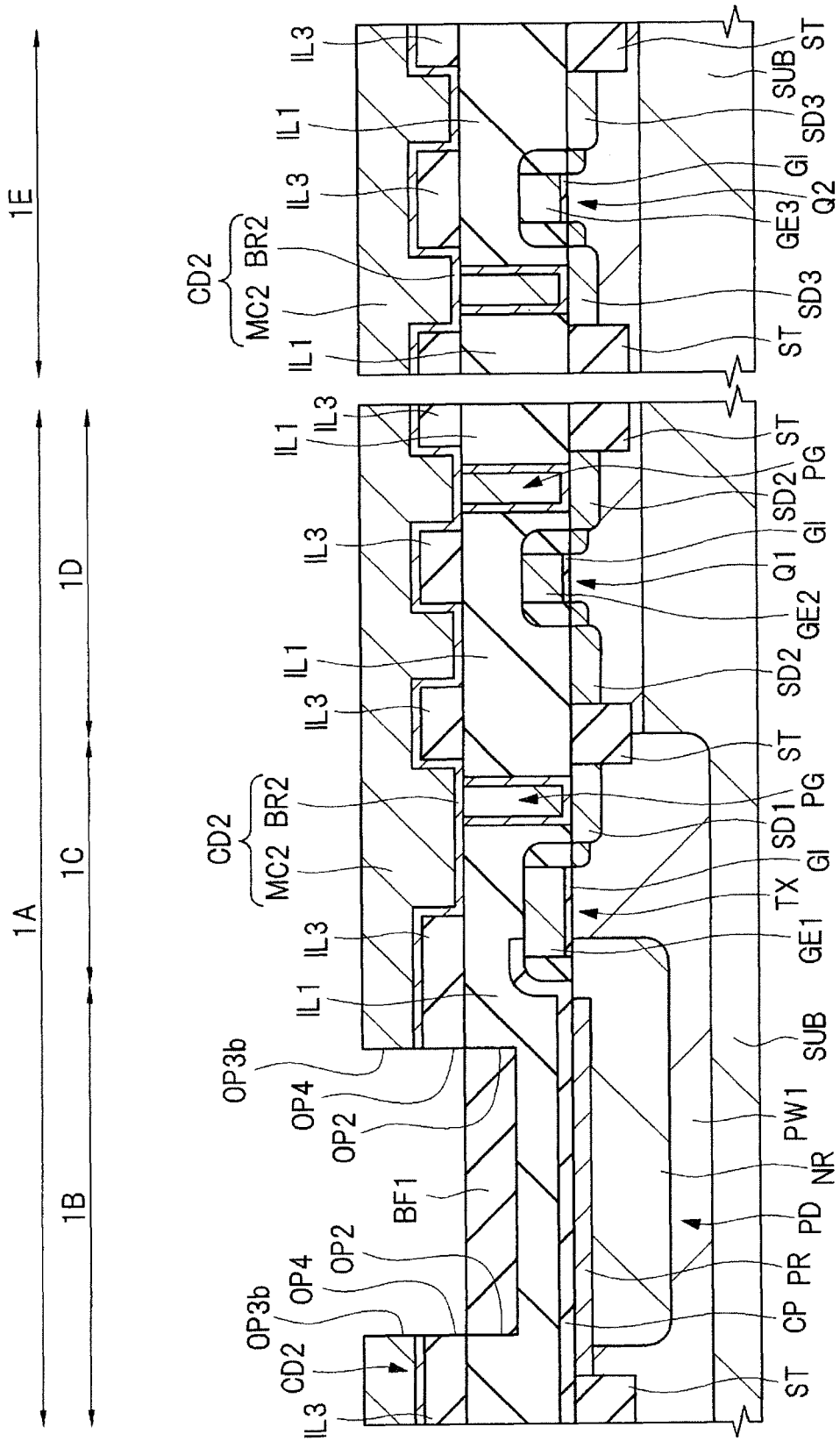
FIG. 25 is a main-portion cross-sectional view of the semiconductor device during the manufacturing process thereof, which is subsequent to FIG. 24.

Next, as shown in FIG. 25, using the conductive film CD2 as a mask (etching mask), the insulating film IL3 is etched (Step S16 in FIG. 4). Since the etching is preferably rather anisotropic, dry etching is used preferably.

In Step S16, the portion of the insulating film IL3 exposed from the opening OP3b of the conductive film CD2 is etched, while the portion of the insulating film IL3 covered with the conductive film CD2 is prevented from being etched. Accordingly, when the etching in Step S16 is performed, the insulating film IL3 located in the region exposed from the opening OP3b of the conductive film CD2 is selectively etched to be formed with an opening OP4. The two-dimensional position and two-dimensional shape of the opening OP4 formed in the conductive film CD2 substantially coincide with the two-dimensional position and two-dimensional shape of the opening OP3b of the conductive film CD2.

The opening OP4 of the insulating film IL3 extends through the insulating film IL3 and, at the bottom portion of the opening OP4, the embedded insulating film BF1 (the upper surface thereof) is exposed. This is because the two-dimensional position and two-dimensional shape of the opening OP4 of the insulating film IL3 substantially coincide with the two-dimensional position and two-dimensional shape of the opening OP2 in which the embedded insulating film BF1 is embedded. In other words, the opening OP4 of the insulating film IL3 is formed so as to overlap the opening OP2 of the insulating film IL1 in planar view. That is, the opening OP4 of the insulating film IL3 is formed over the opening OP2 (or the embedded insulating film BF1 embedded in the opening OP2) of the insulating film IL1. To achieve this, as described above, the foregoing opening OP3a of the foregoing photoresist pattern RP2 may be formed appropriately to have a two-dimensional position and a two-dimensional shape which substantially coincide with those of the foregoing opening OP1a of the foregoing photoresist pattern RP1.

Note that, in the present embodiment, after the photoresist pattern RP2 is removed, the insulating film IL3 is etched using the conductive film CD2 as an etching mask in Step S16 to be formed with the opening OP4. In another form, it is also possible to etch the insulating film IL3 using the photoresist pattern RP2 as an etching mask, without removing the photoresist pattern RP2, to form the opening OP4 in Step S16 and then remove the photoresist pattern RP2.

Figure 26:
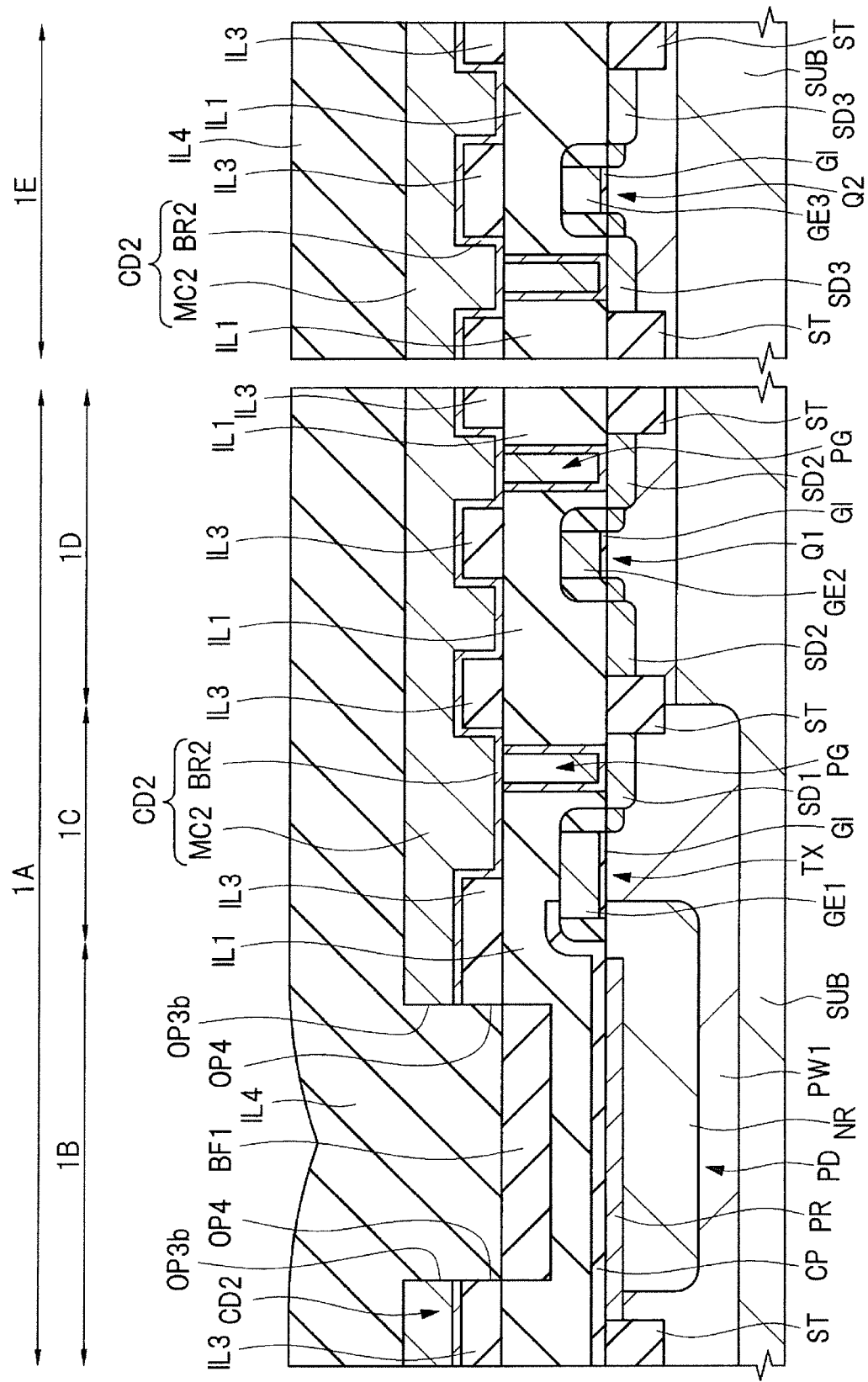
FIG. 26 is a main-portion cross-sectional view of the semiconductor device during the manufacturing process thereof, which is subsequent to FIG. 25.

Next, as shown in FIG. 26, an insulating film IL4 is formed over the conductive film CD2 so as to be embedded in (to fill) each of the opening OP4 of the insulating film IL3 and the opening OP3b of the conductive film CD2 (Step S17 in FIG. 4).

The insulating film IL4 is an insulating film used as a material for filling the opening OP4 of the insulating film IL3. Preferably, the insulating film IL4 is higher in refractivity and translucency with respect to light (light caused to be incident on the photodiode PD) than the insulating film IL3. As the insulating film IL4, a silicon nitride film can be used appropriately. Preferably, the insulating film IL4 is formed of the same material as that of the foregoing insulating film IL2. Therefore, each of the insulating film IL4 and the foregoing insulating film IL2 is preferably a silicon nitride film. The insulating film IL4 can be formed using, e.g., a CVD method or the like.

Figure 27:
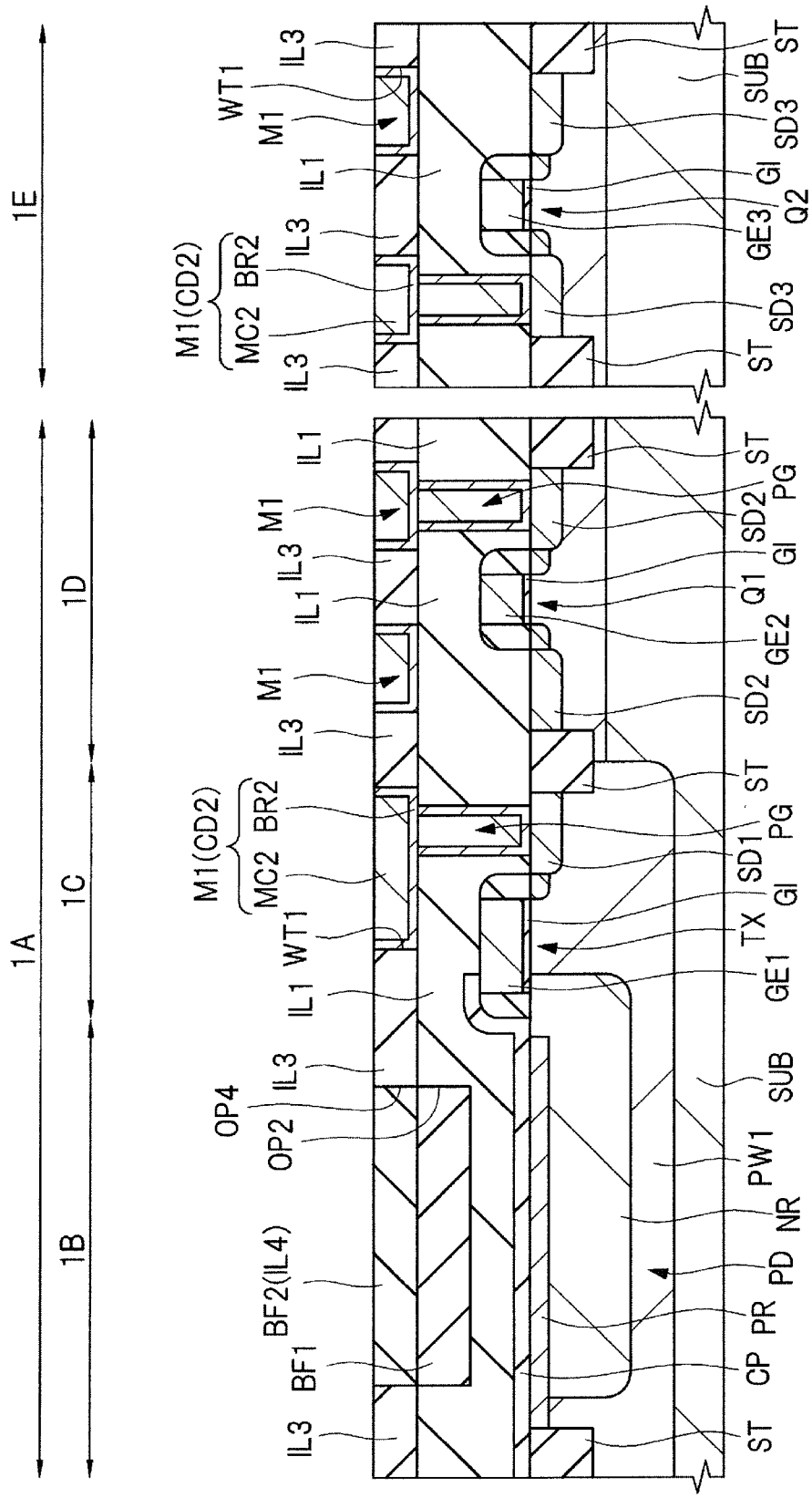
FIG. 27 is a main-portion cross-sectional view of the semiconductor device during the manufacturing process thereof, which is subsequent to FIG. 26.

Next, as shown in FIG. 27, by polishing the insulating film IL4 and the conductive film CD2 by a CMP method, the insulating film IL4 located outside the opening OP4 and the conductive film CD2 located outside the wire trenches WT1 are removed (Step S18 in FIG. 4).

By the CMP step in Step S18, the upper surface of the insulating film IL3 is exposed, the conductive film CD2 is embedded in each of the wire trenches WT1 of the insulating film IL3 to remain, and the insulating film IL4 is embedded in the opening OP4 of the insulating film IL3 to remain, while the other portions of the conductive film CD2 and the insulating film IL4 are removed.

The conductive film CD2 embedded and remaining in the wire trenches WT1 of the insulating film IL3 forms the wires (embedded wires) M1, and the insulating film IL4 embedded and remaining in the opening OP4 of the insulating film IL3 forms an embedded insulating film BF2. That is, when the CMP step in Step S18 is performed, a structure is obtained in which the wires M1 are embedded in the wire trenches WT1 of the insulating film IL3 and the embedded insulating film BF2 is embedded in the opening OP4 of the insulating film IL3.

The wires M1 are each formed of the conductive film CD2 embedded in the wire trenches WT1. However, since the conductive film CD2 is formed of the barrier conductor film BR2 and the main conductor film MC2, the wires M1 have the side surfaces and bottom surfaces thereof each formed of the barrier conductor film BR2 and the inner portions thereof each formed of the main conductor film MC2.

The positions at which the wires M1 and the plugs PG are formed are designed such that the plugs PG overlap the wires M1 in planar view. Thus, the plugs PG are electrically coupled to the wires M1 with the upper surfaces thereof being in contact with the wires M1. The wires M1 are coupled to the plugs PG and electrically coupled to the $n^+$-type semiconductor regions SD1, SD2, and SD3, the gate electrodes GE1, GE2, and GE3, or the like via the plugs PG.

The embedded insulating film BF2 is formed over the embedded insulating film BF1, and the bottom surface of the embedded insulating film BF2 is in contact with the upper surface of the embedded insulating film BF1. The two-dimensional position and two-dimensional shape of the embedded insulating film BF2 substantially coincide with the two-dimensional position and two-dimensional shape of the embedded insulating film BF1. That is, the opening OP4 overlaps the opening OP2 in planar view, while the embedded insulating film BF2 overlaps the embedded insulating film BF1 in planar view.

The embedded insulating film BF2 functions, together with the embedded insulating film BF1, as a waveguide for light caused to be incident on the photodiode PD which is the light receiving element. Accordingly, the embedded insulating film BF2 is preferably formed over the embedded insulating film BF1 located over the photodiode PD as the light receiving element. As optical properties, the embedded insulating film BF2 preferably has a refractivity higher than that of the interlayer insulating film (which is the insulating film IL3 herein) in which the embedded insulating film BF2 is embedded and a property (high translucency) which allows the light (light caused to be incident on the photodiode PD) to easily pass therethrough.

Figure 28:
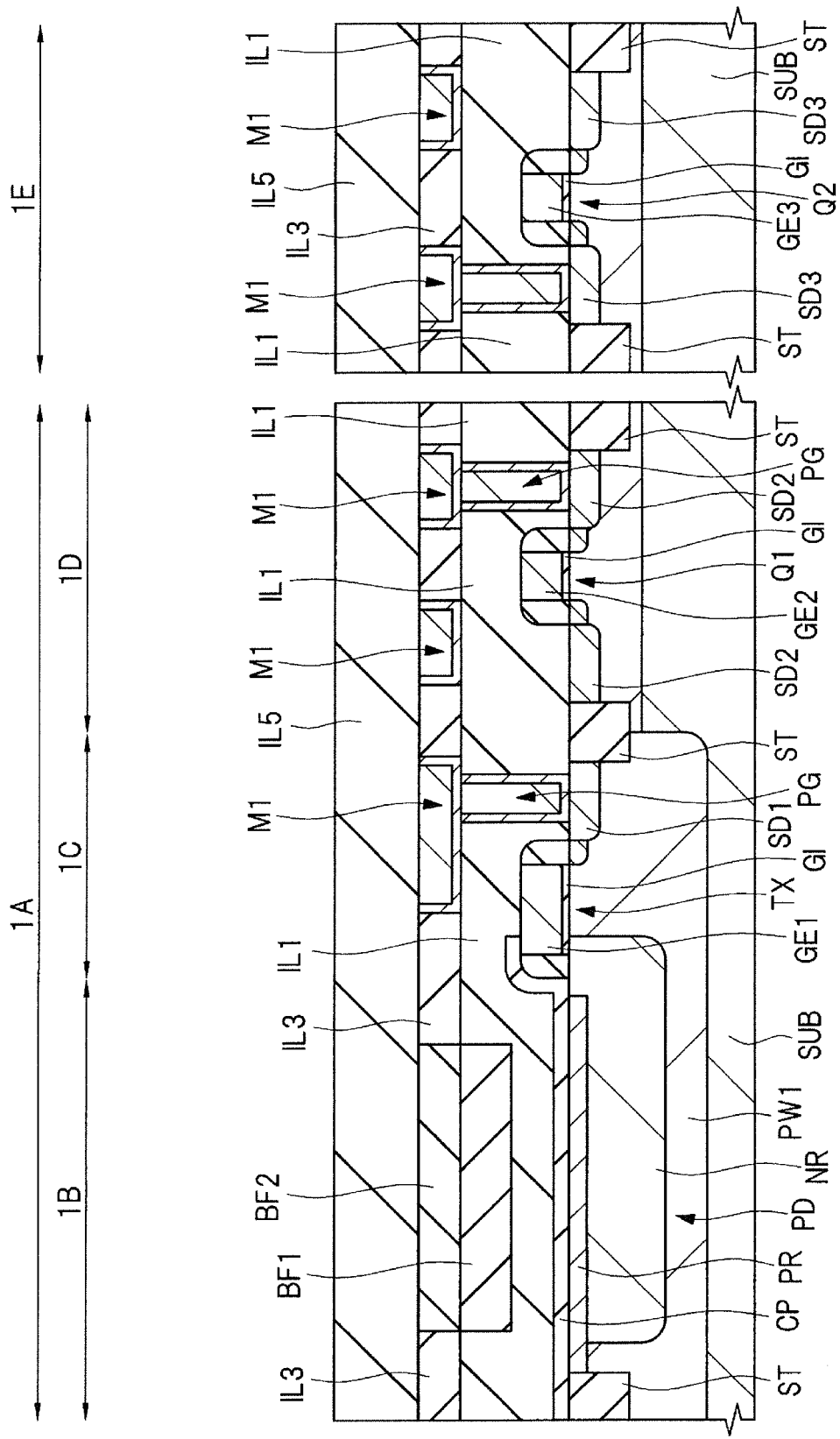
FIG. 28 is a main-portion cross-sectional view of the semiconductor device during the manufacturing process thereof, which is subsequent to FIG. 27.

Next, as shown in FIG. 28, over the insulating film IL3 in which the wires M1 and the embedded insulating film BF2 are embedded, an insulating film (interlayer insulating film) IL5 is formed as an interlayer insulating film (Step S19 in FIG. 4). The insulating film IL5 can be formed of a single-layer film (single-layer insulating film) or a laminated film (laminated insulating film). For example, the insulating film IL5 can be formed of a silicon oxide film, but can also be formed of a silicon oxide film containing at least one or more of carbon (C), nitrogen (N), and fluorine (F) so as to have a dielectric constant lower than that of a silicon oxide.

Figure 29:
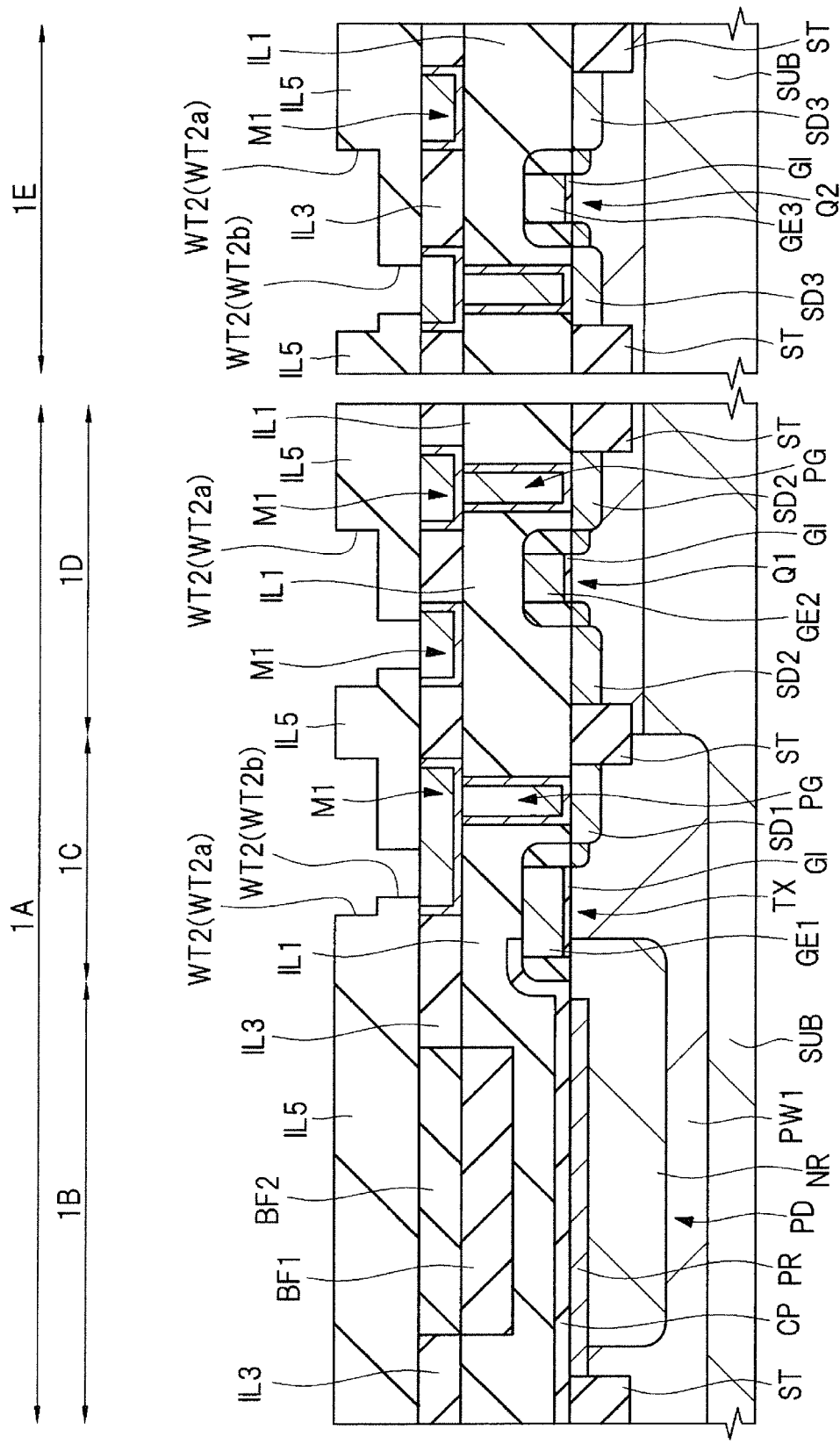
FIG. 29 is a main-portion cross-sectional view of the semiconductor device during the manufacturing process thereof, which is subsequent to FIG. 28.

Next, as shown in FIG. 29, using a photolithographic technique, a dry etching technique, or the like, wire openings (wire openings) WT2 are formed as openings in the insulating film IL5 (Step S20 in FIG. 4).

Each of the wire openings WT2 has a wire trench WT2a and a hole WT2b. The wire openings WT2a are trenches in which wires M2 described later are to be embedded. The holes WT2b are holes in which via portions for coupling the wires M2 and M1 described later are to be embedded. The wire trenches WT2a do not extend through the insulating film IL5. Each of the wire trenches WT2a has a bottom surface thereof located halfway in the thickness direction of the insulating film IL5. The holes WT2b are formed to be included in the wire trenches WT2a in planar view and extend from the bottom portions of the wire trenches WT2a through the insulating film IL5. At the bottom portions of the holes WT2b, the upper surfaces of the wires M1 are exposed. On the other hand, the wire openings WT2 are not formed over the embedded insulating film BF2 so that the embedded insulating film BF2 is not exposed from the wire openings WT2. That is, the wire openings WT2 are formed so as not to overlap the embedded insulating film BF2 in planar view.

Figure 30:
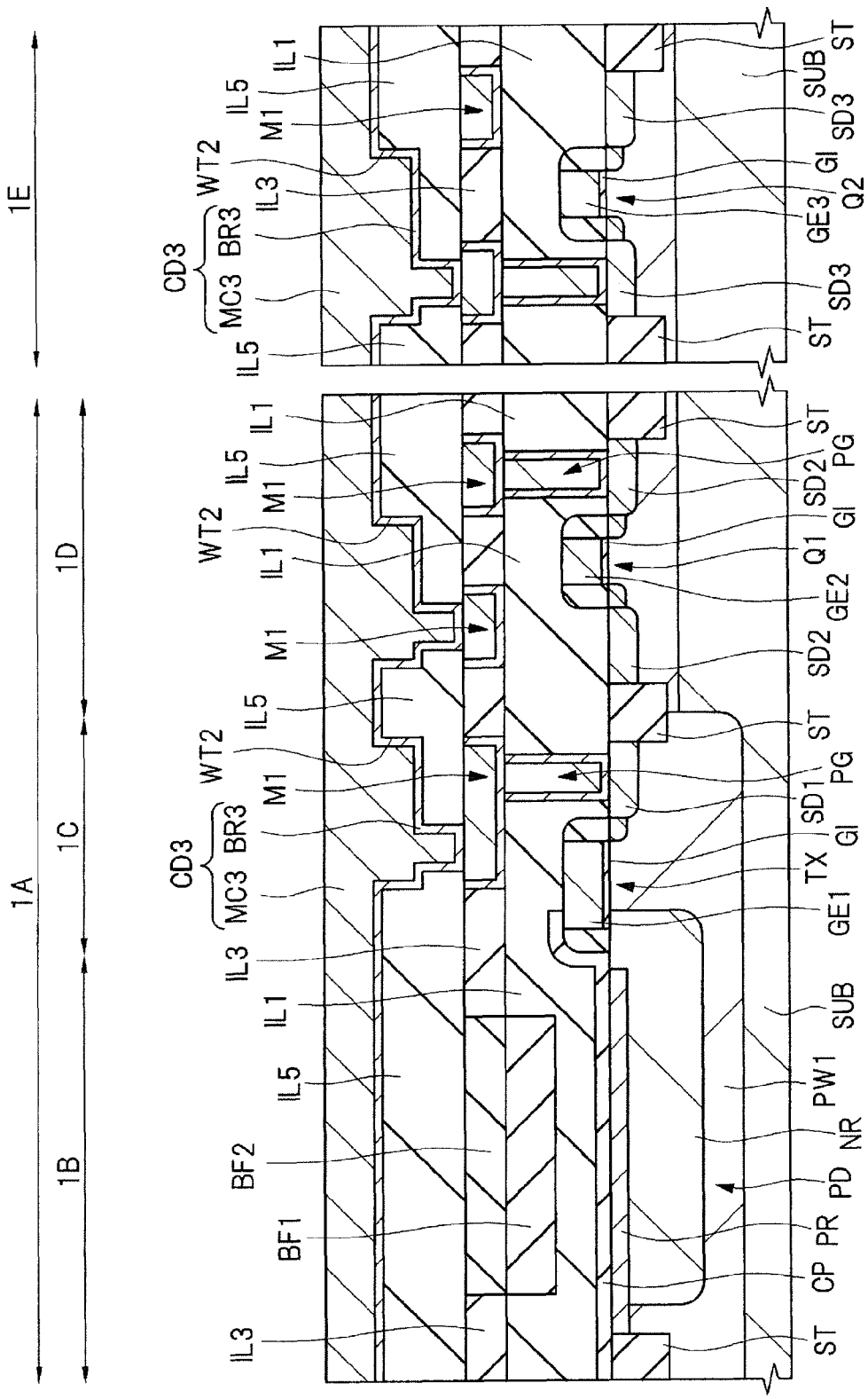
FIG. 30 is a main-portion cross-sectional view of the semiconductor device during the manufacturing process thereof, which is subsequent to FIG. 29.

Next, as shown in FIG. 30, a conductive film (metal film) CD3 for forming the wires M2 is formed over the insulating film IL5 so as to be embedded in (to fill) the wire openings WT2 (Step S21 in FIG. 5). That is, the conductive film CD3 is formed over the insulating film IL5 so as to be embedded in (to fill) the wire trenches WT2a and the holes WT2b.

The conductive film CD3 has the same configuration as that of the foregoing conductive film CD2. That is, the conductive film CD3 includes a barrier conductor film (barrier metal film) BR3, and a main conductor film MC3 over the barrier conductor film BR3. The main conductor film MC3 is thicker than the barrier conductor film BR3. Similarly to the foregoing barrier conductor film BR2, the barrier conductor film BR3 is formed of, e.g., a tantalum film, a tantalum nitride film, or a laminated film thereof and can be formed by, e.g., a sputtering method, a plasma CVD method, or the like. Similarly to the foregoing main conductor film MC2, the main conductor film MC3 is formed of a copper (Cu) film containing copper as a main component or the like and can be formed by a plating method (e.g., an electrolytic plating method) or the like. Accordingly, the step of forming the conductive film CD3 in Step S21 has the step of forming the barrier conductor film BR3 over the insulating film IL5 including the inside of the wire openings WT2 (the bottom portions and side walls of the wire trenches WT2a and the bottom portions and side walls of the holes WT2b), and the step of forming, after the foregoing step, the main conductor film MC3 over the barrier conductor film BR3 so as to fill the wire openings WT2 therewith. Note that, since the conductive film CD3 is formed of a metal or a metal compound showing metal conduction, the conductive film CD3 can be regarded as a metal film.

In Step S21, it is also possible to first form the barrier conductor film BR3 over the insulating film IL5 including the inside of the wire openings WT2 (the bottom portions and side walls of the wire trenches WT2a and the bottom portions and side walls of the holes WT2b), subsequently form a copper seed layer over the barrier conductor film BR3 by a CVD method, a sputtering method, or the like, and then form a copper plating film over the seed layer using an electrolytic plating method or the like to fill the wire openings WT2. In this case, a combination of the copper seed layer and the copper plating film serves as the main conductor film MC3.

Figure 31:
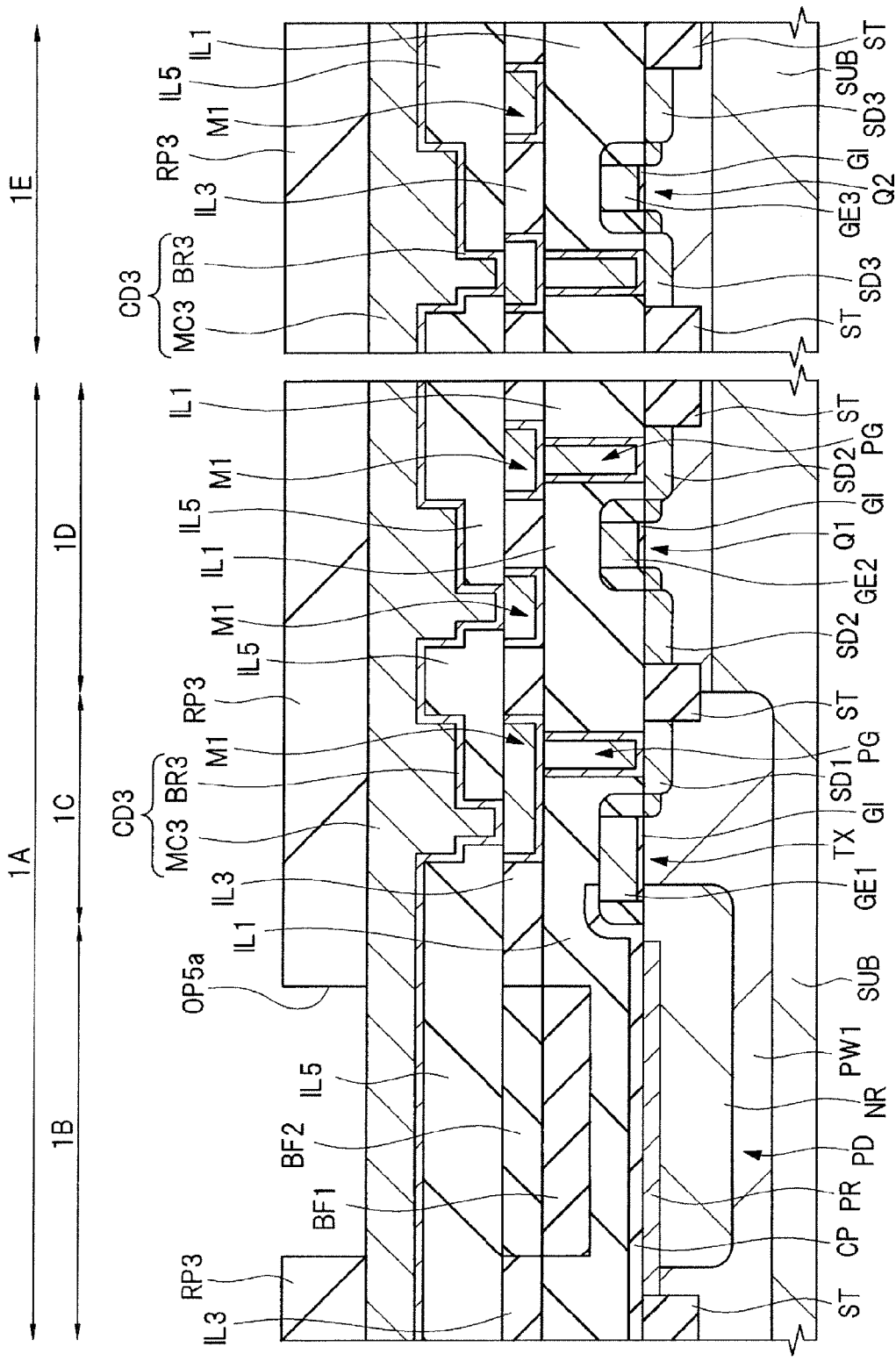
FIG. 31 is a main-portion cross-sectional view of the semiconductor device during the manufacturing process thereof, which is subsequent to FIG. 30.

Then, as shown in FIG. 31, a photoresist pattern (resist pattern) PR3 is formed over the conductive film CD3 using a photolithographic method (Step S22 in FIG. 5). The photoresist pattern PR3 has an opening OP5a. The opening OP5a of the photoresist pattern RP3 does not overlap any of the wire openings WT2 in planar view.

The opening OP5a of the photoresist pattern RP3 has a two-dimensional position and a two-dimensional shape which substantially coincide with those of the opening OP3a of the foregoing photoresist pattern RP2 and the foregoing opening OP1a of the foregoing photoresist pattern RP1. Therefore, for the photoresist pattern RP3, the foregoing photoresist pattern RP2, and the foregoing photoresist pattern RP1, the same photomask can be used in an exposure step of exposing an applied photoresist layer to light to allow a reduction in the manufacturing cost of the semiconductor device.

Figure 32:
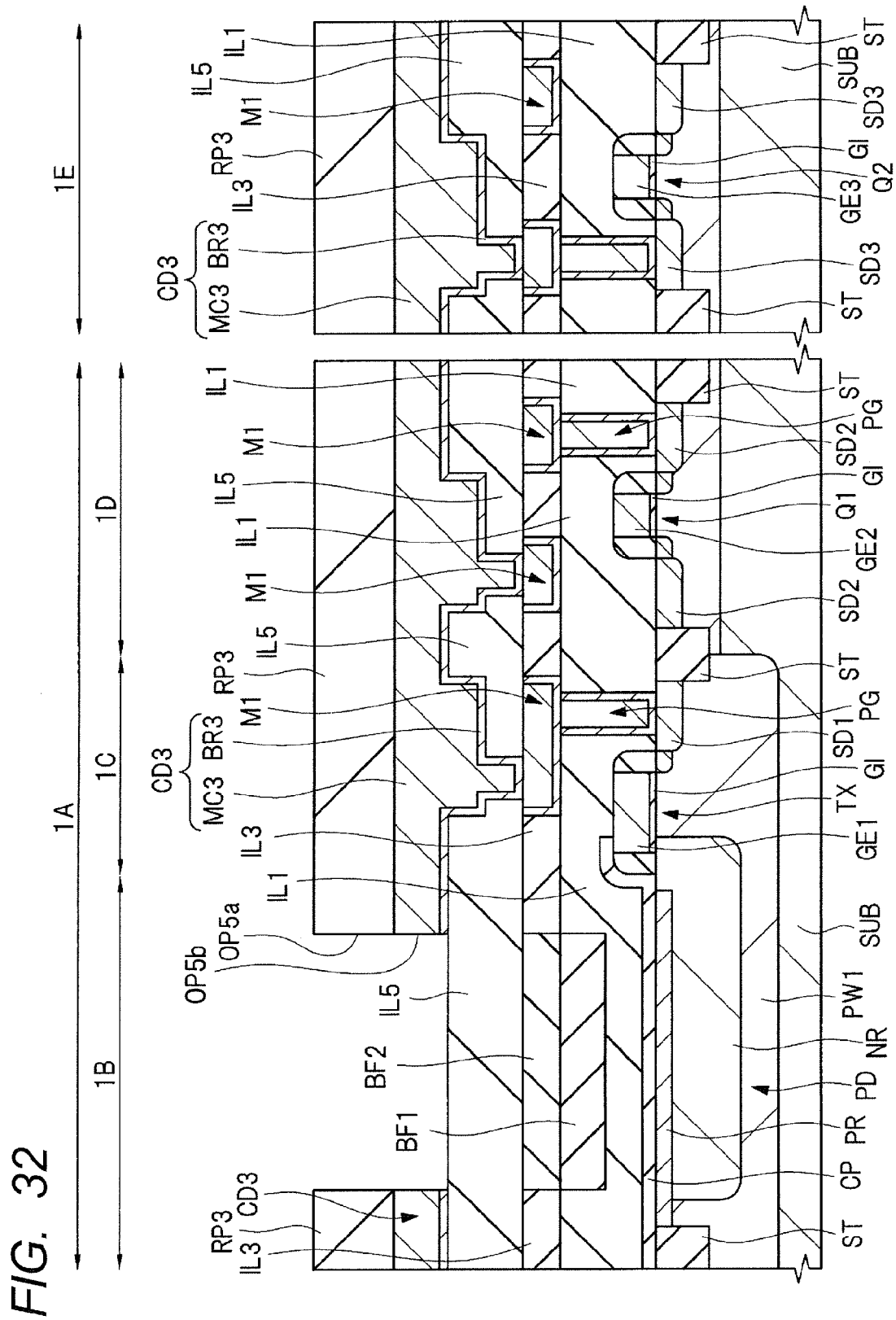
FIG. 32 is a main-portion cross-sectional view of the semiconductor device during the manufacturing process thereof, which is subsequent to FIG. 31.

Next, as shown in FIG. 32, using the photoresist pattern RP3 as a mask (etching mask), the conductive film CD3 is etched (Step S23 in FIG. 5). Since the etching is preferably rather anisotropic, dry etching is used preferably.

In Step S23, the portion of the conductive film CD3 exposed from the opening OP5a of the photoresist pattern RP3 is etched, while the portion of the conductive film CD3 covered with the photoresist pattern RP3 is prevented from being etched. Accordingly, when the etching in Step S23 is performed, the conductive film CD3 located in the region exposed from the opening OP5a of the photoresist pattern RP3 is selectively etched to be formed with an opening OP5b. The two-dimensional position and two-dimensional shape of the opening OP5b formed in the conductive film CD3 substantially coincide with the two-dimensional position and two-dimensional shape of the opening OP5a of the photoresist pattern RP3. The opening OP5b is formed so as to extend through the conductive film CD3. At the bottom portion of the opening OP5b of the conductive film CD3, the insulating film IL5 (the upper surface thereof) is exposed. In Step S23, the insulating film IL5 can be used as an etching stopper. After the etching in Step S23, the photoresist pattern RP3 is removed.

Figure 33:
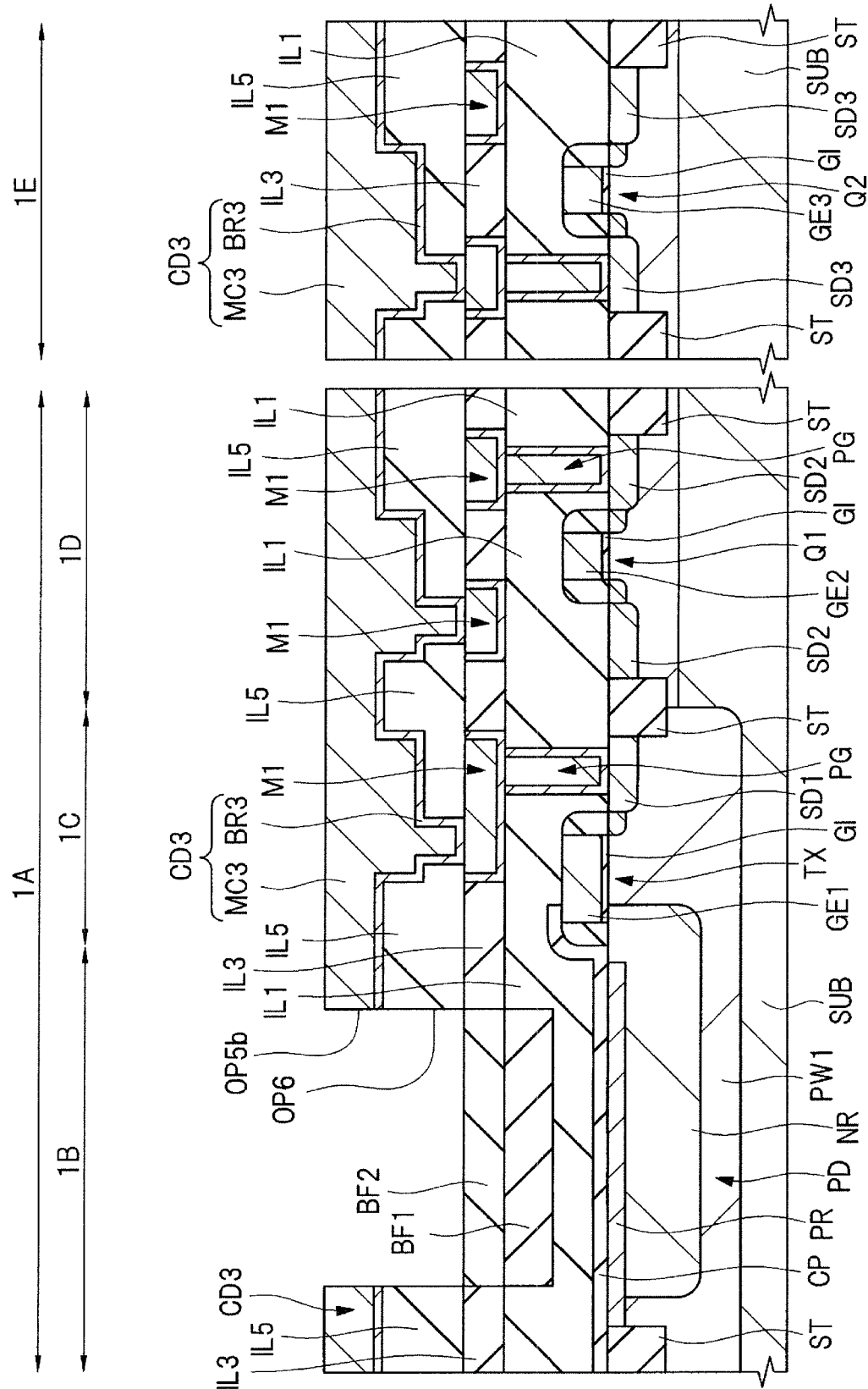
FIG. 33 is a main-portion cross-sectional view of the semiconductor device during the manufacturing process thereof, which is subsequent to FIG. 32.

Next, as shown in FIG. 33, using the conductive film CD3 as a mask (etching mask), the insulating film IL5 is etched (Step S24 in FIG. 5). Since the etching is preferably rather anisotropic, dry etching is used preferably.

In Step S24, the portion of the insulating film IL5 exposed from the opening OP5b of the conductive film CD3 is etched, while the portion of the insulating film IL5 covered with the conductive film CD3 is prevented from being etched. Accordingly, when the etching in Step S24 is performed, the insulating film IL5 located in the region exposed from the opening OP5b of the conductive film CD3 is selectively etched to be formed with an opening OP6. The two-dimensional position and two-dimensional shape of the opening OP6 formed in the insulating film IL5 substantially coincide with the two-dimensional position and two-dimensional shape of the opening OP5b of the conductive film CD3.

The opening OP6 of the insulating film IL5 extends through the insulating film IL5 and, at the bottom portion of the opening OP6, the embedded insulating film BF2 (the upper surface thereof) is exposed. This is because the two-dimensional position and two-dimensional shape of the opening OP6 of the insulating film IL5 substantially coincide with the two-dimensional position and two-dimensional shape of the opening OP4 in which the embedded insulating film BF2 is embedded. In other words, the opening OP6 of the insulating film IL5 is formed so as to overlap the opening OP4 of the insulating film IL3 in planar view. That is, the opening OP6 of the insulating film IL5 is formed over the opening OP4 (or the embedded insulating film BF2 embedded in the opening OP4) of the insulating film IL3. To achieve this, as described above, the foregoing opening OP5a of the foregoing photoresist pattern RP3 may be formed appropriately to have a two-dimensional position and a two-dimensional shape which substantially coincide with those of the foregoing opening OP3a of the foregoing photoresist pattern RP2.

Note that, in the present embodiment, after the photoresist pattern RP3 is removed, the insulating film IL5 is etched using the conductive film CD3 as an etching mask in Step S24 to be formed with the opening OP6. In another form, it is also possible to etch the insulating film IL5 using the photoresist pattern RP3 as an etching mask in Step S24 without removing the photoresist pattern RP3 to form the opening OP6 and then remove the photoresist pattern RP3.

Figure 34:
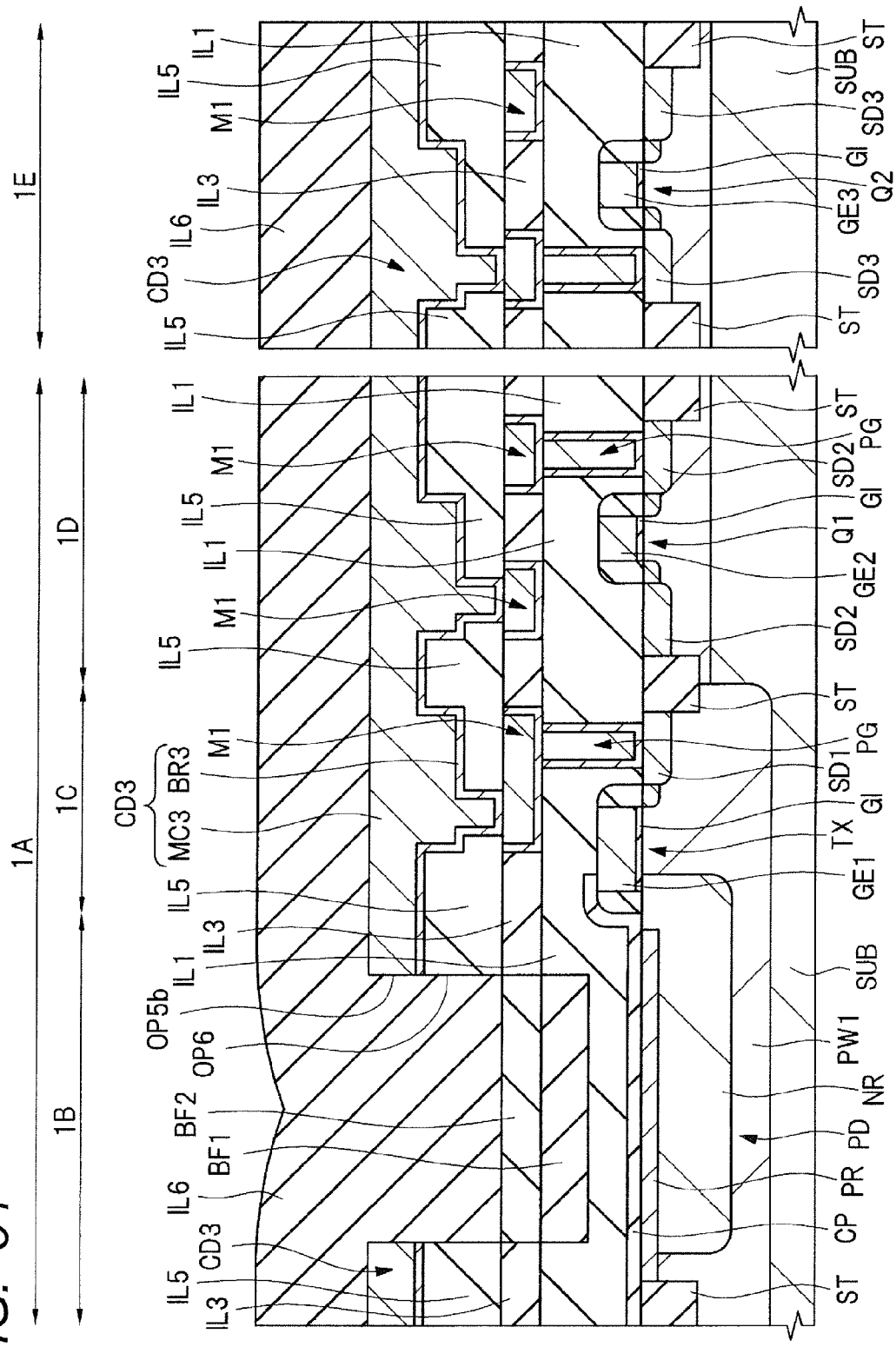
FIG. 34 is a main-portion cross-sectional view of the semiconductor device during the manufacturing process thereof, which is subsequent to FIG. 33.

Next, as shown in FIG. 34, an insulating film IL6 is formed over the conductive film CD3 so as to be embedded in (to fill) each of the opening OP6 of the insulating film IL5 and the opening OP5b of the conductive film CD3 (Step S25 in FIG. 5).

The insulating film IL6 is an insulating film used as a material for filling the opening OP6 of the insulating film IL5. Preferably, the insulating film IL6 is higher in refractivity and translucency with respect to light (light caused to be incident on the photodiode PD) than the insulating film IL5. As the insulating film IL6, a silicon nitride film can be used appropriately. Preferably, the insulating film IL6 is formed of the same material as that of each of the foregoing insulating films IL2 and IL4. Therefore, each of the insulating film IL6, the foregoing insulating film IL4, and the foregoing insulating film IL2 is preferably a silicon nitride film. The insulating film IL6 can be formed using, e.g., a CVD method or the like.

Figure 35:
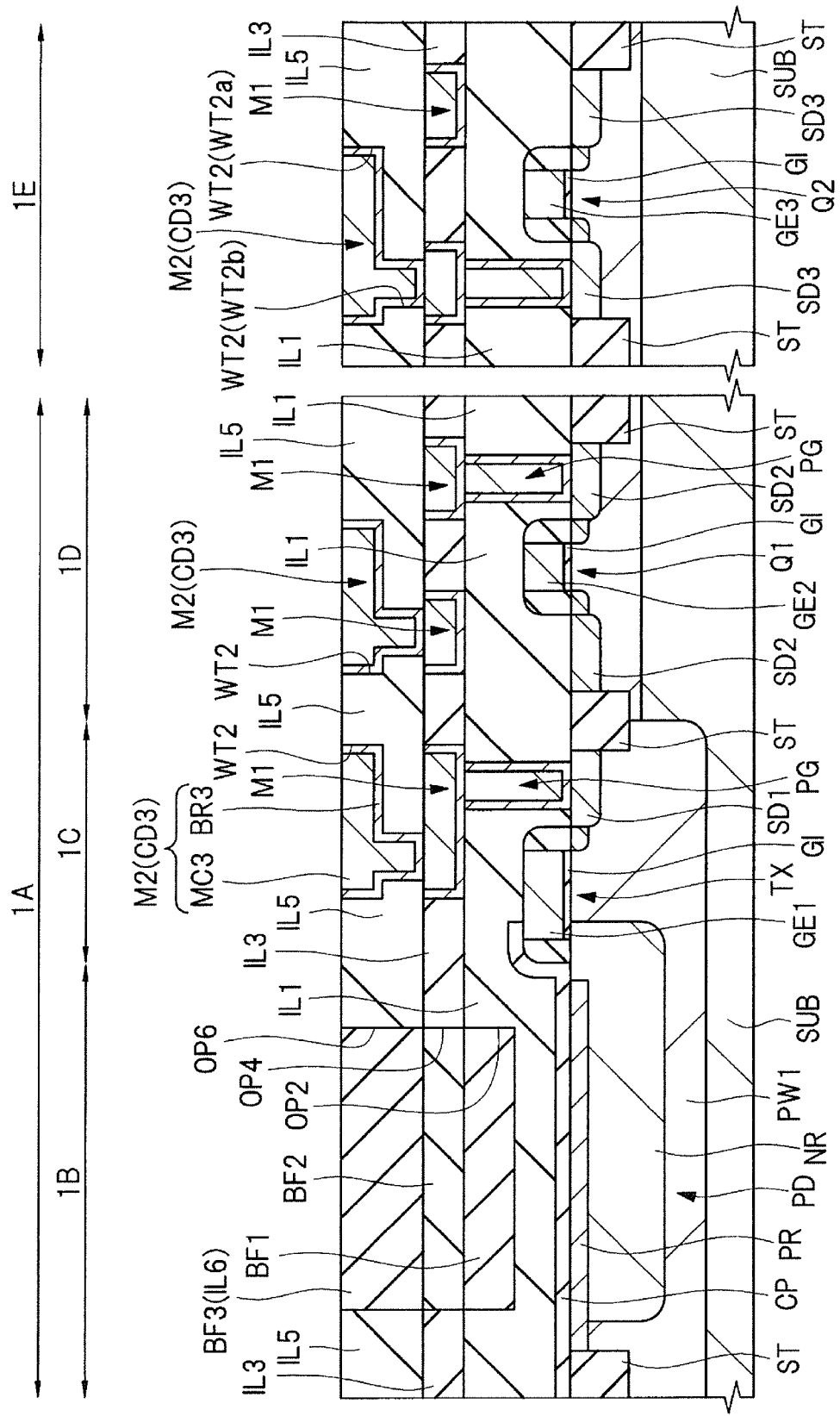
FIG. 35 is a main-portion cross-sectional view of the semiconductor device during the manufacturing process thereof, which is subsequent to FIG. 34.

Next, as shown in FIG. 35, by polishing the insulating film IL6 and the conductive film CD3 by a CMP method, the insulating film IL6 located outside the opening OP6 and the conductive film CD3 located outside the wire openings WT2 are removed (Step S26 in FIG. 5). By the CMP step in Step S26, the upper surface of the insulating film IL5 is exposed, the conductive film CD3 is embedded in each of the wire openings WT2 of the insulating film IL5 to remain, and the insulating film IL6 is embedded in the opening OP6 of the insulating film IL5 to remain, while the other portions of the conductive film CD3 and the insulating film IL6 are removed.

The conductive film CD3 embedded and remaining in the wire openings WT2 of the insulating film IL5 forms the wires (embedded wires) M2. Each of the wires M2 integrally includes a wire portion embedded in the wire trench WT2a of the wire opening WT2, and the via portion embedded in the hole WT2b of the wire opening WT2. Also, the insulating film IL6 embedded and remaining in the opening OP6 of the insulating film IL5 forms an embedded insulating film BF3. That is, when the CMP step in Step S26 is performed, a structure is obtained in which the wires M2 are embedded in the wire openings WT2 of the insulating film IL5 and the embedded insulating film BF3 is embedded in the opening OP6 of the insulating film IL5.

The wires M2 are each formed of the conductive film CD3 embedded in the wire openings WT2. However, since the conductive film CD3 is formed of the barrier conductor film BR3 and the main conductor film MC3, the wires M2 have the side surfaces and bottom surfaces thereof each formed of the barrier conductor film BF3 and the inner portions thereof each formed of the main conductor film MC23.

The positions at which the wires M2 are formed are designed such that the via portions of the wires M2 overlap the wires M1 in planar view. Thus, the wires M2 are electrically coupled to the wires M1 with the bottom surfaces of the via portions thereof being in contact with the wires M1. As a result, the wires M2 are coupled to the wires M1 via the via portions thereof.

The embedded insulating film BF3 is formed over the embedded insulating film BF2, and the bottom surface of the embedded insulating film BF3 is in contact with the upper surface of the embedded insulating film BF2. The two-dimensional position and two-dimensional shape of the embedded insulating film BF3 substantially coincide with the two-dimensional position and two-dimensional shape of the embedded insulating film BF2. That is, the opening OP6 overlaps the opening OP4 in planar view, while the embedded insulating film BF3 overlaps the embedded insulating film BF2 in planar view.

Consequently, the embedded insulating films BF1, BF2, and BF3 have substantially the same two-dimensional positions and two-dimensional shapes and overlap each other in planar view. Over the embedded insulating film BF1, the embedded insulating film BF2 is formed and, over the embedded insulating film BF2, the embedded insulating film BF3 is formed. The embedded insulating film BF1 (the upper surface thereof) is in contact with the embedded insulating film BF2 (the bottom surface thereof), and the embedded insulating film BF2 (the upper surface thereof) is in contact with the embedded insulating film BF3 (the bottom surface thereof).

The embedded insulating film BF3 functions, together with the embedded insulating films BF2 and BF1, as a waveguide for light caused to be incident on the photodiode PD which is the light receiving element. Accordingly, the embedded insulating film BF3 is preferably formed over the embedded insulating film BF2 located over the photodiode PD as the light receiving element. As optical properties, the embedded insulating film BF3 preferably has a refractivity higher than that of the interlayer insulating film (which is the insulating film IL5 herein) in which the embedded insulating film BF3 is embedded and a property (high translucency) which allows the light (light caused to be incident on the photodiode PD) to easily pass therethrough.

Figure 36:
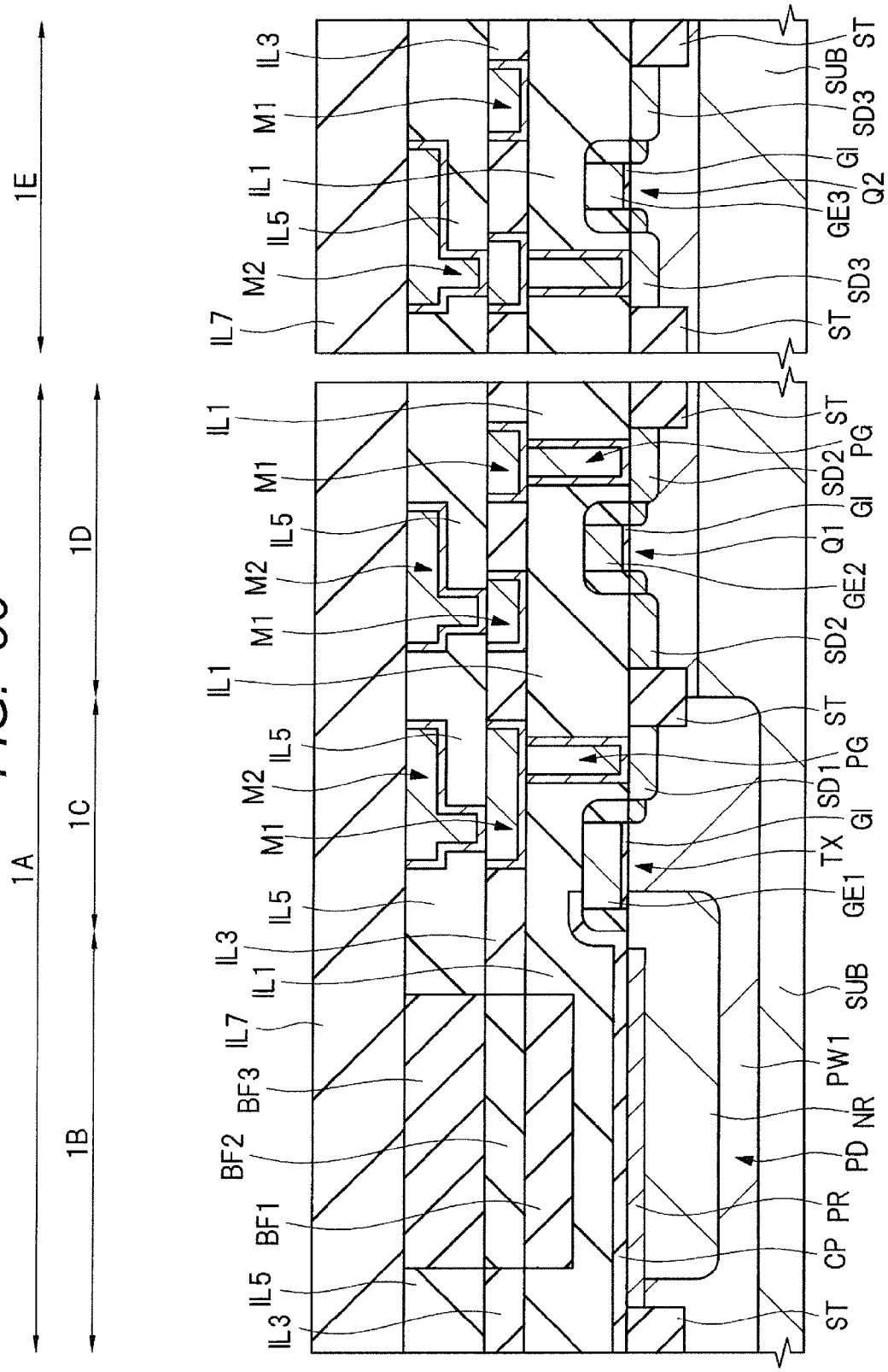
FIG. 36 is a main-portion cross-sectional view of the semiconductor device during the manufacturing process thereof, which is subsequent to FIG. 35.

Next, as shown in FIG. 36, over the insulating film IL5 in which the wires M2 and the embedded insulating film BF3 are embedded, an insulating film (interlayer insulating film) IL7 is formed (Step S27 in FIG. 5). The insulating film IL7 can be formed of a single-layer film (single-layer insulating film) or a laminated film (laminated insulating film). For example, the insulating film IL7 can be formed of a silicon oxide film, but can also be formed of a silicon oxide film containing at least one or more of carbon (C), nitrogen (N), and fluorine (F) so as to have a dielectric constant lower than that of a silicon oxide.

Figure 37:
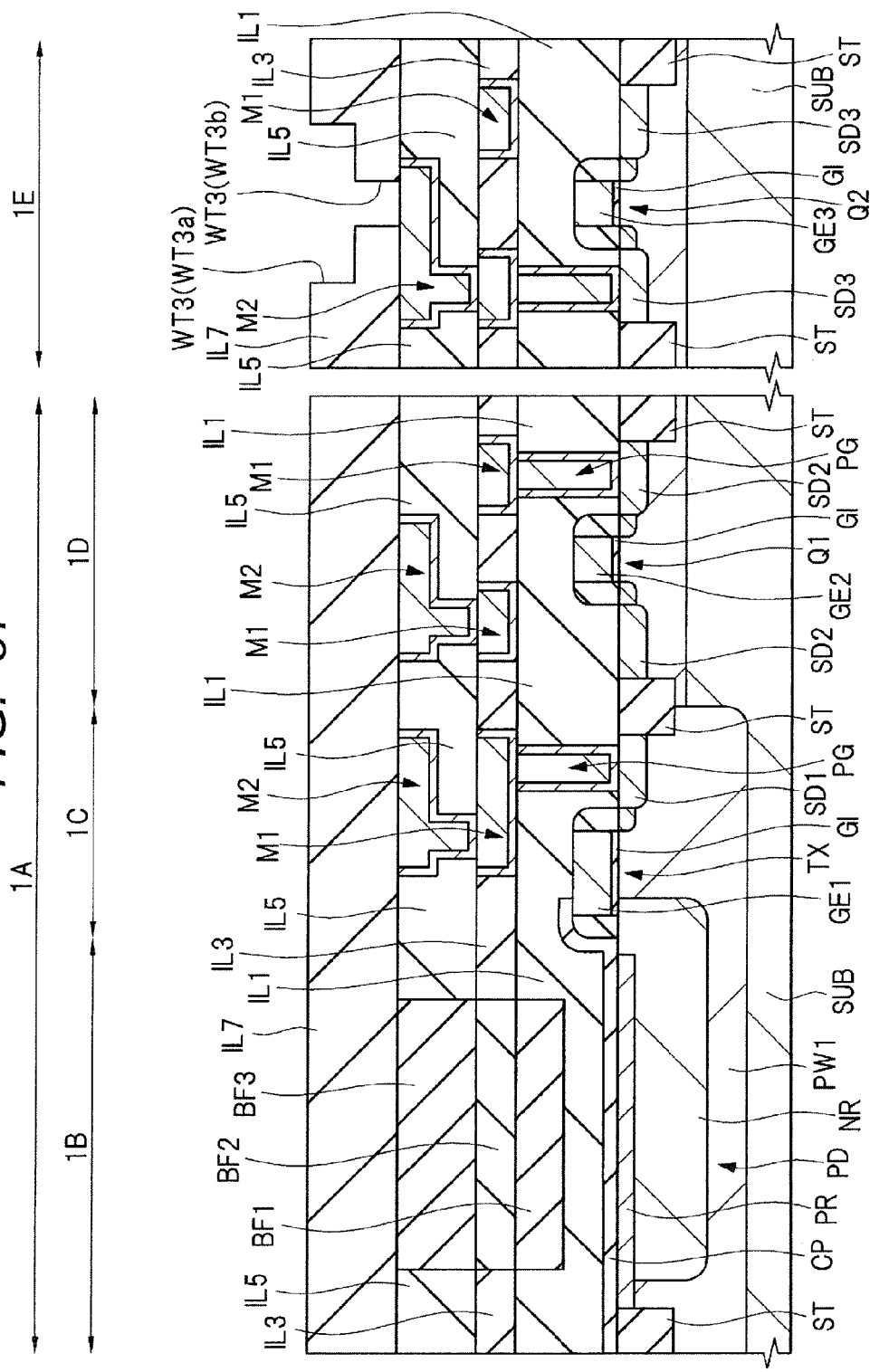
FIG. 37 is a main-portion cross-sectional view of the semiconductor device during the manufacturing process thereof, which is subsequent to FIG. 36.

Next, as shown in FIG. 37, using a photolithographic technique, a dry etching technique, or the like, a wire opening WT3 is formed in the insulating film IL7 (Step S28 in FIG. 5). The wire opening WT3 is formed in the peripheral circuit formation region 1E, but is not formed in the pixel region 1A.

The wire opening WT3 has a wire trench WT3a and a hole WT3b. The wire opening WT3a is a trench in which a wire M3 described later is to be embedded. The hole WT3b is a hole in which a via portion for coupling the wires M3 and M2 described later is to be embedded. The wire trench WT3a does not extend through the insulating film IL7. The wire trench WT3a has a bottom surface thereof located halfway in the thickness direction of the insulating film IL7. The hole WT3b is formed to be included in the wire trench WT3a in planar view and extend from the bottom portion of the wire trench WT3a through the insulating film IL7. At the bottom portion of the hole WT3b, the upper surface of the wire M2 is exposed. On the other hand, the wire opening WT3 is not formed over the embedded insulating film BF3 so that the embedded insulating film BF3 is not exposed from the wire opening WT3. That is, the wire opening WT3 is formed so as not to overlap the embedded insulating film BF3 in planar view.

Figure 38:
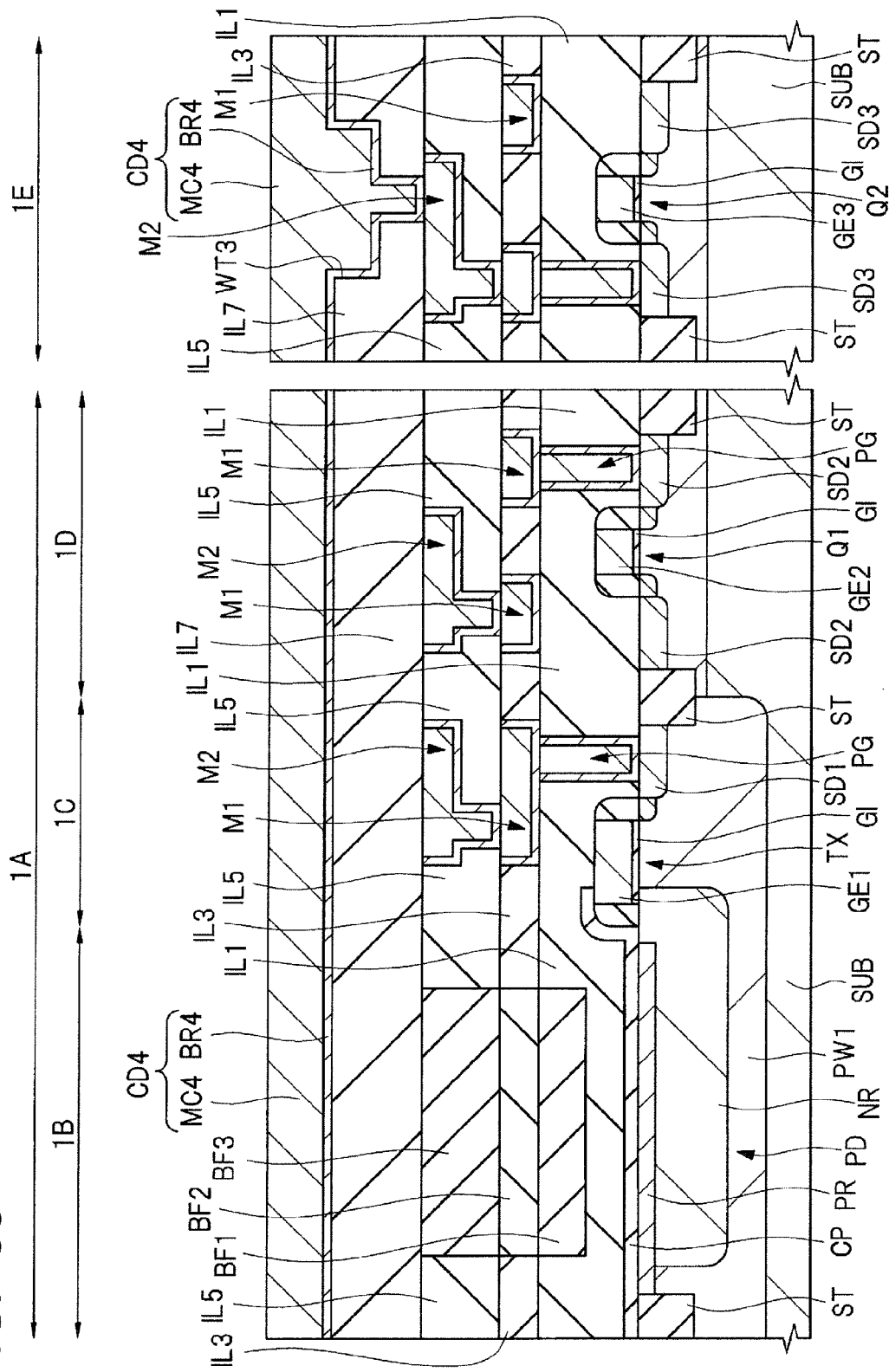
FIG. 38 is a main-portion cross-sectional view of the semiconductor device during the manufacturing process thereof, which is subsequent to FIG. 37.

Next, as shown in FIG. 38, a conductive film CD4 for forming the wire M3 is formed over the insulating film IL7 so as to be embedded in (to fill) the wire opening WT3 (Step S29 in FIG. 5). That is, the conductive film CD4 is formed over the insulating film IL7 so as to be embedded in (to fill) the wire trench WT3a and the hole WT3b.

The conductive film CD4 has the same configuration as that of the foregoing conductive film CD3. That is, the conductive film CD4 includes a barrier conductor film (barrier metal film) BF4 similar to the foregoing barrier conductor film BR3, and a main conductor film MC4 similar to the foregoing main conductor film MC3. The step of forming the conductive film CD4 in Step S29 can be performed in substantially the same manner as the foregoing step of forming the conductive film CD3 in Step S21. Accordingly, the step of forming the conductive film CD4 in Step S29 has the step of forming the barrier conductor film BR4 over the insulating film IL7 including the inside (the bottom portion and side walls of the wire trench WT3a and the bottom portion and side walls of the hole WT3b) of the wire opening WT3, and the step of forming, after the foregoing step, the main conductor film MC4 over the barrier conductor film BR4 so as to fill the wire opening WT3 therewith.

Figure 39:
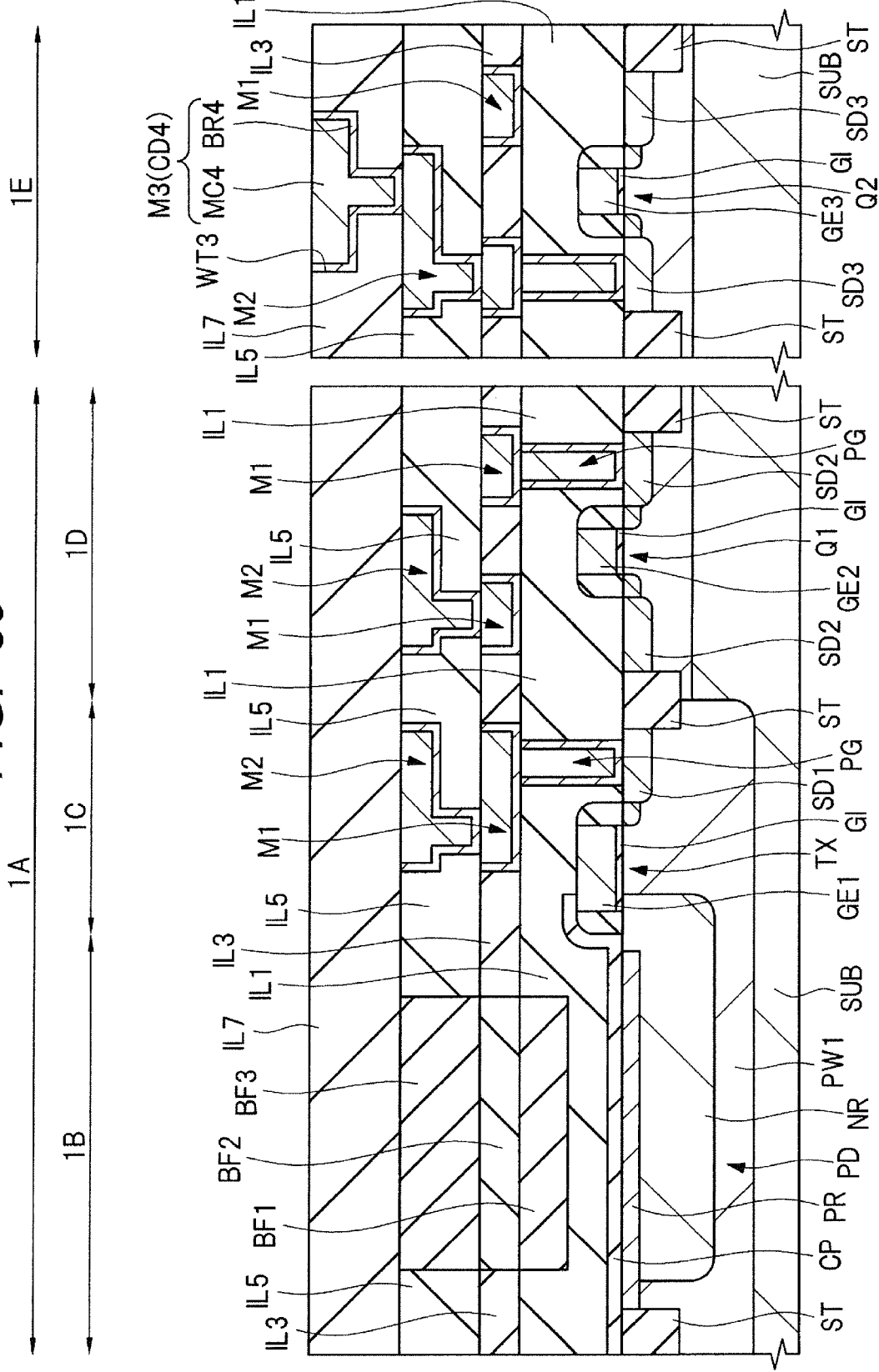
FIG. 39 is a main-portion cross-sectional view of the semiconductor device during the manufacturing process thereof, which is subsequent to FIG. 38.

Next, as shown in FIG. 39, by polishing the conductive film CD4 by a CMP method, the conductive film CD4 located outside the wire opening WT3 is removed (Step S30 in FIG. 5). By the CMP step in Step S30, the upper surface of the insulating film IL7 is exposed, and the conductive film CD4 is embedded in the wire opening WT3 of the insulating film IL7 to remain, while the other portion of the conductive film CD4 is removed.

The conductive film CD4 embedded and remaining in the wire opening WT3 of the insulating film IL7 forms the wire (embedded wire) M3. The wire M3 integrally includes a wire portion embedded in the wire trench WT3a of the wire opening WT3, and the via portion embedded in the hole WT3b of the wire opening WT3. That is, when the CMP step in Step S30 is performed, a structure is obtained in which the wire M3 is embedded in the wire opening WT3 of the insulating film IL7.

The wire M3 is formed of the conductive film CD4 embedded in the wire opening WT3. However, since the conductive film CD4 is formed of the barrier conductor film BR4 and the main conductor film MC4, the wire M3 has the side surfaces and bottom surface thereof each formed of the barrier conductor film BF4 and the inner portion thereof formed of the main conductor film MC4.

The wire M3 is formed in the peripheral circuit formation region 1E and the position at which the wire M3 is formed is designed such that the via portion of the wire M3 overlaps the wire M2 in planar view. Thus, the wire M3 is electrically coupled to the wire M2 with the bottom portion of the via portion thereof being in contact with the wire M2. As a result, the wire M3 is coupled to the wire M2 via the via portion thereof.

Figure 40:
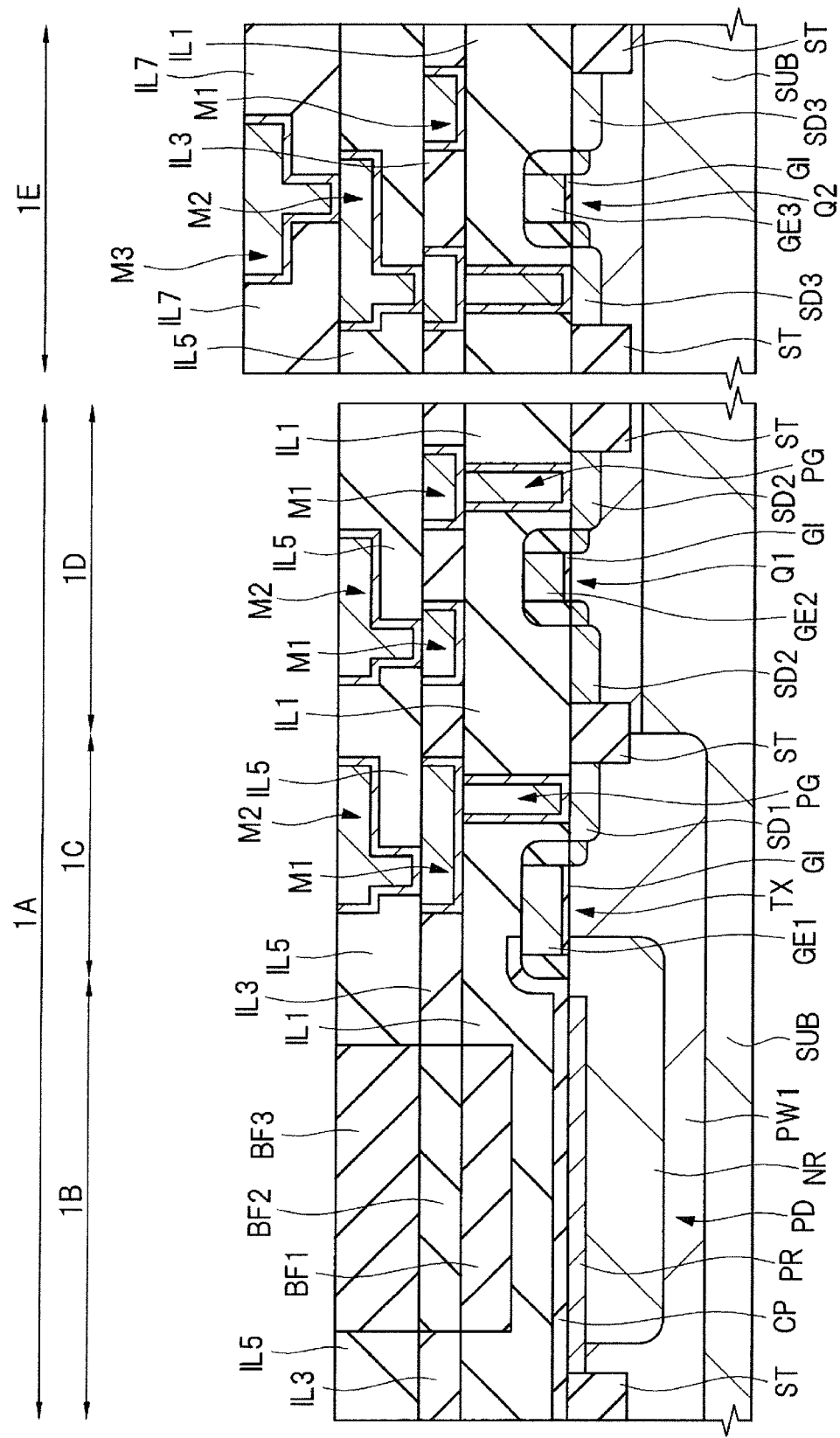
FIG. 40 is a main-portion cross-sectional view of the semiconductor device during the manufacturing process thereof, which is subsequent to FIG. 39.

Next, as shown in FIG. 40, using a photolithographic technique, a dry etching technique, or the like, the insulating film IL7 in each of the pixel regions 1A is removed. At this time, with the peripheral circuit formation region 1E being covered with a photoresist pattern (not shown), the insulating film IL7 in the pixel region 1A is etched to be removed, while the insulating film IL7 and the wire M3 in the peripheral circuit formation region 1E are left. In an actual situation, the pixel regions 1A are arranged in the form of an array so that the insulating film IL7 is removed from all over the plurality of pixel regions 1A arranged in the form of an array. Since the insulating film IL7 is removed from each of the pixel regions 1A, the wire M3 is not preliminarily formed therein.

Figure 41:
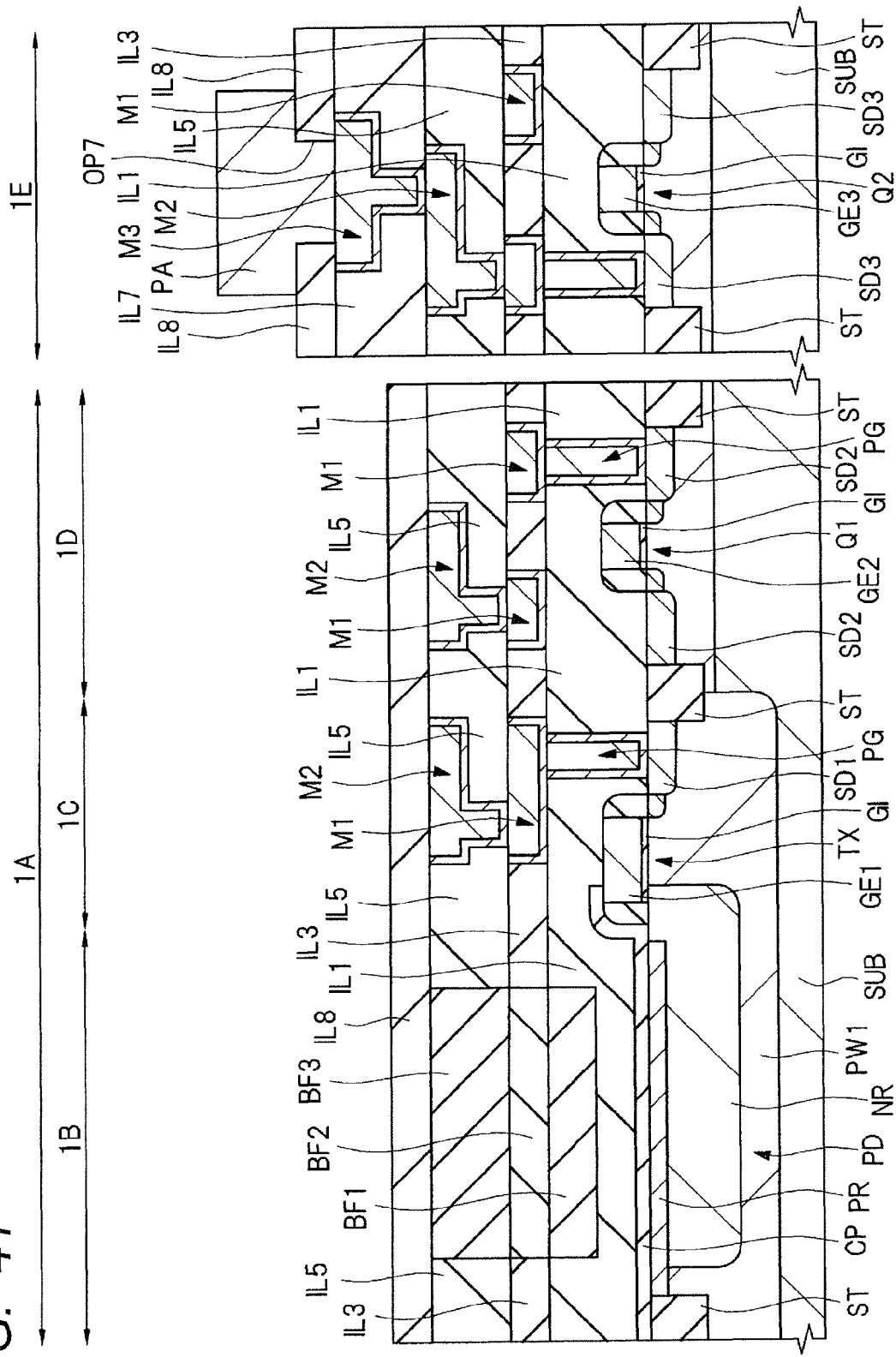
FIG. 41 is a main-portion cross-sectional view of the semiconductor device during the manufacturing process thereof, which is subsequent to FIG. 40.

Next, as shown in FIG. 41, over the main surface of the semiconductor substrate SUB, an insulating film IL8 is formed. The insulating film IL8 can be formed of, e.g., a silicon oxide film. In each of the pixel regions 1A, the insulating film IL8 is formed over the insulating film IL5 while, in the peripheral circuit formation region 1E, the insulating film IL8 is formed over the insulating film IL7.

Next, using a photolithographic technique, a dry etching technique, or the like, an opening OP7 is formed in the insulating film IL8. The opening OP7 is not formed in the pixel regions 1A, but is formed in the peripheral circuit formation region 1E. At the bottom portion of the opening OP7, the wire M3 (the upper surface thereof) is exposed.

Next, over the insulating film IL8 including the inside of the opening OP7, a conductive film (e.g., a conductive film containing aluminum as a main component) is formed and then patterned using a photolithographic technique, a dry etching technique, or the like to form a pad electrode PA. The pad electrode PA is not formed in any of the pixel regions 1A, but is formed in the peripheral circuit formation region 1E. The pad electrode PA two-dimensionally includes the opening OP7 and comes in contact with the wire M3 exposed from the opening OP7 to be electrically coupled thereto.

Figure 42:
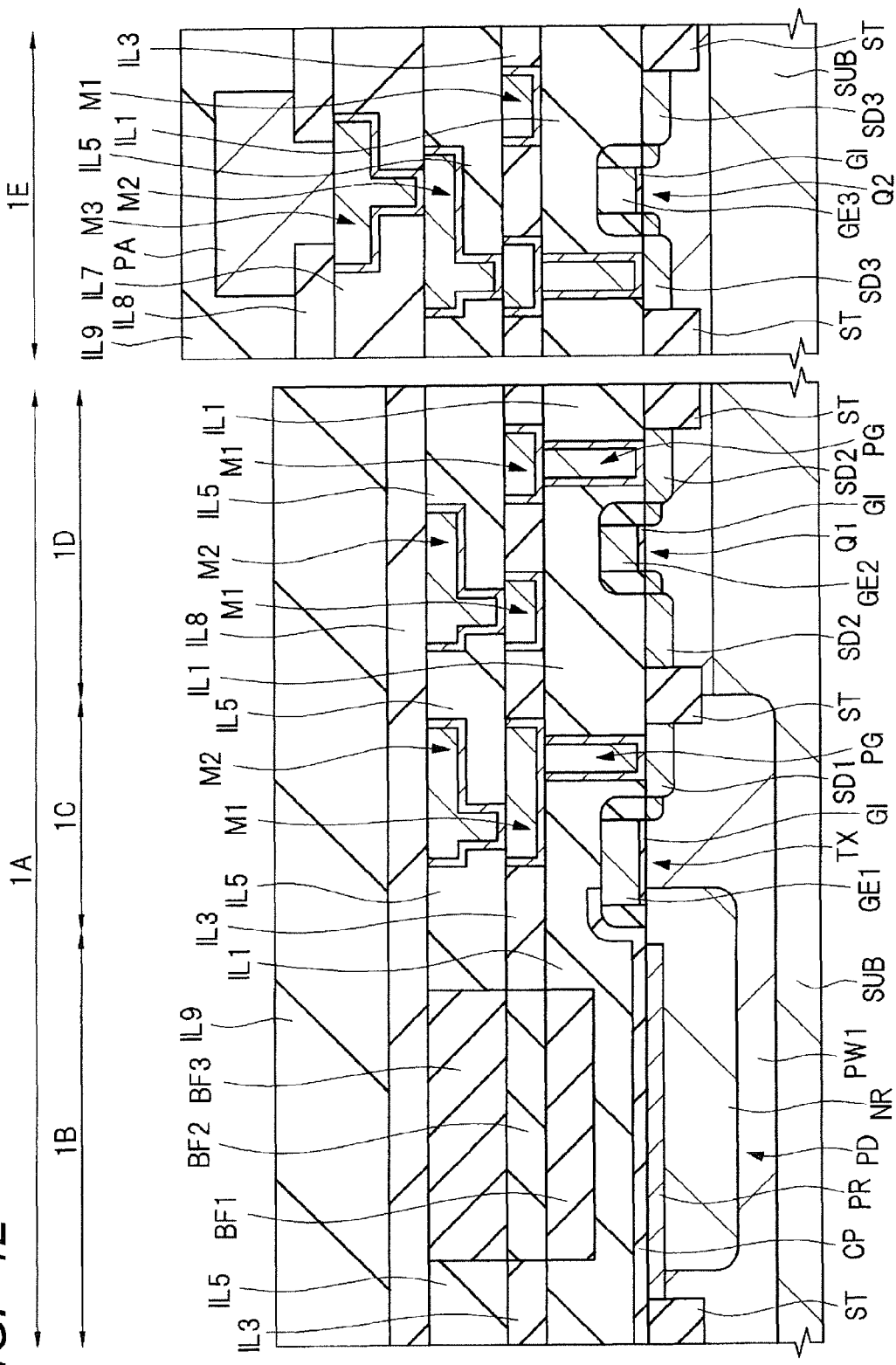
FIG. 42 is a main-portion cross-sectional view of the semiconductor device during the manufacturing process thereof, which is subsequent to FIG. 41.

Next, as shown in FIG. 42, over the insulating film IL8, an insulating film IL9 is formed so as to cover the pad electrode PA. The insulating film IL9 can be formed of, e.g., a silicon oxide film.

Figure 43:
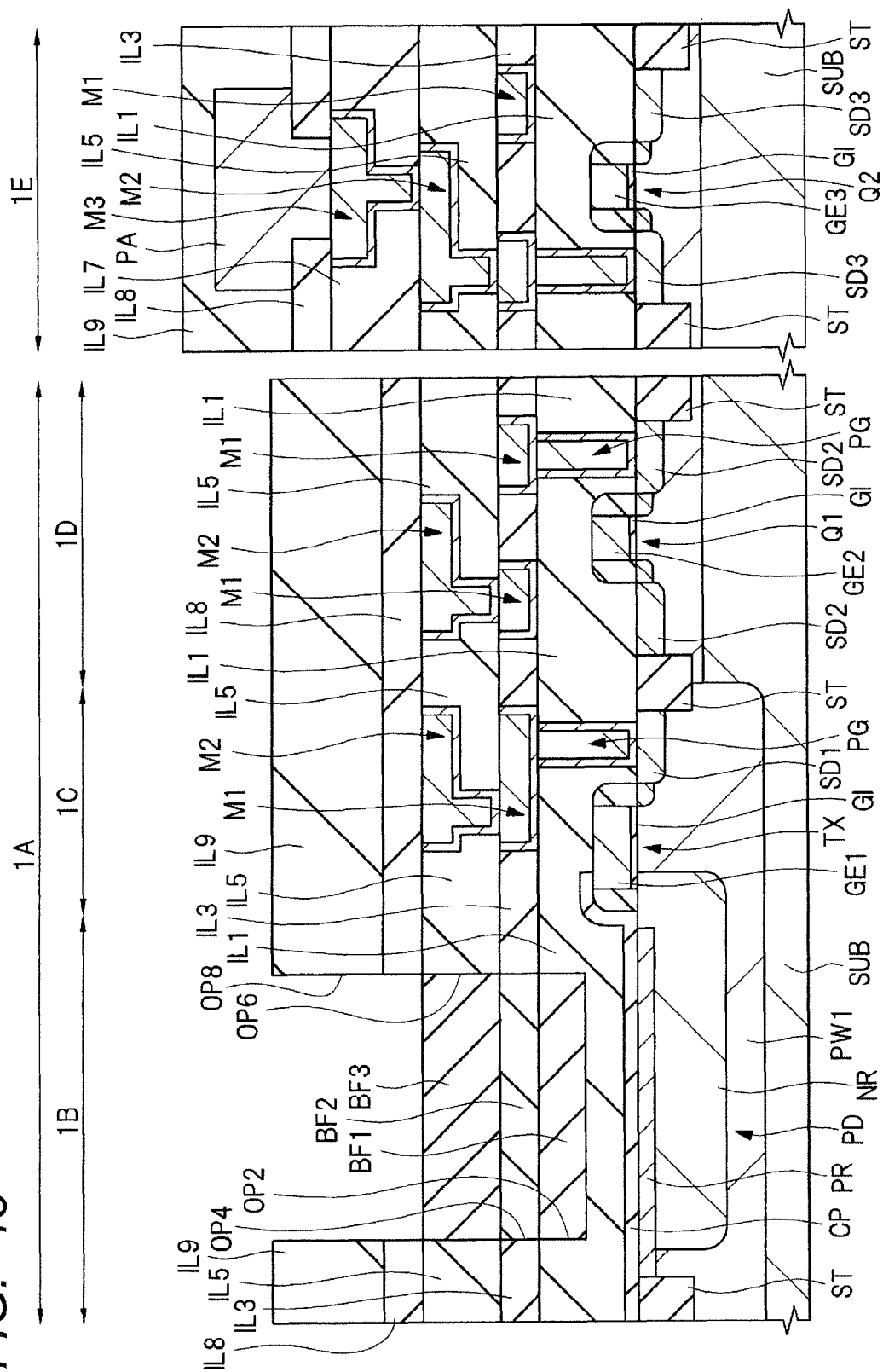
FIG. 43 is a main-portion cross-sectional view of the semiconductor device during the manufacturing process thereof, which is subsequent to FIG. 42.

Next, as shown in FIG. 43, using a photolithographic technique, a dry etching technique, or the like, an opening OP8 is formed in the insulating films IL9 and IL8. The opening OP8 is formed in the photodiode formation region 1B for each of the pixel regions 1A. That is, over the embedded insulating film BF3, the opening OP8 is formed and, at the bottom portion of the opening OP8, the embedded insulating film BF3 is exposed.

Thereafter, by dicing, the semiconductor substrate SUB is singulated into individual semiconductor device regions (regions from which individual semiconductor chips are obtained) so that individual semiconductor devices (semiconductor chips) are obtained.

In each of the semiconductor devices thus manufactured, the embedded insulating films BF1, BF2, and BF3 function as a waveguide for light incident on the photodiode PD. That is, the light incident from the opening OP8 passes through the embedded insulating films BF3, BF2, and BF1 and further passes through the insulating film IL1 and the protective film CP each located under the embedded insulating film BF1 to be incident on (irradiate) the photodiode PD as the light receiving element. In the photodiode PD, the irradiating light is subjected to photoelectrical conversion to generate charges (carriers). The charges generated in the photodiode PD are transferred by the transfer transistor TX, as described above.

Accordingly, the embedded insulating films BF1, BF2, and BF3 are preferably located over the photodiode PD as the light receiving element. Also, the embedded insulating film BF2 is preferably located over the embedded insulating film BF1 and the embedded insulating film BF3 is preferably located over the embedded insulating film BF2.

By providing the waveguide for the light, the efficiency of collection of the light into the light receiving element (photodiode PD) can be improved. This allows an improvement in the sensitivity of the light receiving element (photodiode PD) and an improvement in the performance of the semiconductor device.

The semiconductor device of the present embodiment can also be regarded as a solid-state image sensing device (solid-state image sensing element).

Figure 44:
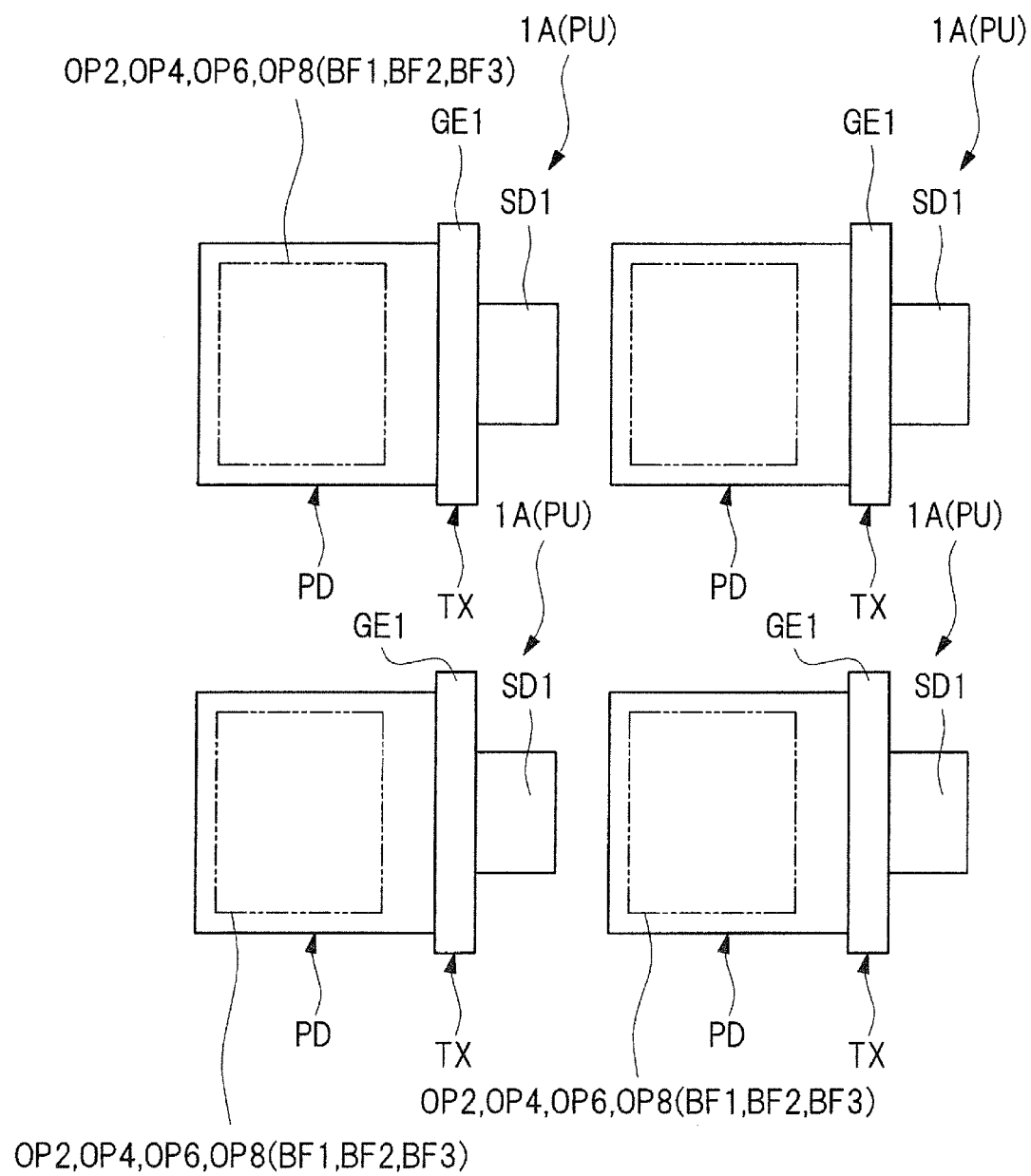
FIG. 44 is a main-portion plan view of the semiconductor device in the embodiment.

FIG. 44 is a main-portion plan view of the semiconductor device of the present embodiment and shows a region where the total of four pixels PU in a 2×2 arrangement. Note that, in FIG. 44, for each of the pixels PU, the photodiode PD and the transfer transistor TX are shown, while the illustration of the other transistors (the foregoing transistors RST, SEL, and AMI) is omitted.

As also shown in FIG. 44, over the main surface of the semiconductor substrate SUB, the plurality of pixels PU (pixel regions 1A) are arranged in the form of an array. Each of the pixels PU (pixel regions 1A) includes the photodiode PD as the light receiving element. This results in a state where the plurality of photodiodes PD are also arranged in the form of an array.

As has been described above with reference to FIGS. 3 to 43, over the photodiode PD (over the foregoing n-type semiconductor region NR), the openings OP2, OP4, OP6, and OP8 and the embedded insulating films BF1, BF2, and BF3 are formed. As shown in FIG. 44, over the main surface of the semiconductor substrate SUB, the plurality of photodiode PD are arranged in the form of an array so that, over each of the photodiodes PD arranged in the form of an array, the openings OP2, OP4, OP6, and OP8 and the embedded insulating films BF1, BF2, and BF3 are formed.

In planar view, the openings OP2, OP4, OP6, and OP8 and the embedded insulating films BF1, BF2, and BF3 overlap each of the photodiodes PD. However, the openings OP2, OP4, OP6, and OP8 and the embedded insulating films BF1, BF2, and BF3 which are formed over a given one of the photodiodes PD do not overlap the other photodiodes PD in planar view. That is, the openings OP2, OP4, OP6, and OP8 and the embedded insulating films BF1, BF2, and BF3 which are formed over the given photodiode PD (referred to as the first diode) overlap the photodiode PD (first diode) in planar view, but do not overlap the other photodiodes PD (the photodiodes PD other than the first diode) in planar view.

As described above, the embedded insulating film BF1 is embedded in the opening OP2, the embedded insulating film BF2 is embedded in the opening OP4, and the embedded insulating film BF3 is embedded in the opening OP6. Accordingly, the embedded insulating film BF1 and the opening OP2 coincide with each other in planar view, the embedded insulating film BF2 and the opening OP4 coincide with each other in planar view, and the embedded insulating film BF3 and the opening OP6 coincide with each other in planar view. The openings OP2, OP4, OP6, and OP8 formed over each of the photodiodes PD overlap each other in planar view so that the embedded insulating films BF1, BF2, and BF3 formed over each of the photodiodes PD also overlap each other in planar view.

As a result, the light incident from each of the openings OP8 can pass through the embedded insulating films BF3, BF2, and BF1, the insulating film IL1 (insulating film IL1 under the embedded insulating film BF1), and the protective film CP and be incident on the photodiode PD.

Preferably, the embedded insulating films BF1, BF2, and BF3 formed over each of the photodiodes PD have respective positions and two-dimensional shapes which substantially coincide with each other in planar view. This allows light to pass through the embedded insulating films BF3, BF2, and BF1 and be more efficiently incident on the photodiodes PD. Therefore, the openings OP2, OP4, and OP6 preferably have respective positions and two-dimensional shapes which substantially coincide with each other in planar view.

About First Studied Example

Next, a description will be given of a first studied example studied by the present inventors. FIGS. 45 to 48 are main-portion cross-sectional views each showing the manufacturing process of a semiconductor device in the first studied example. Note that FIGS. 45 to 48 show the cross-sectional views of the regions corresponding to the foregoing photo-diode formation region 1B and the transfer transistor formation region 1C.

Figure 45:
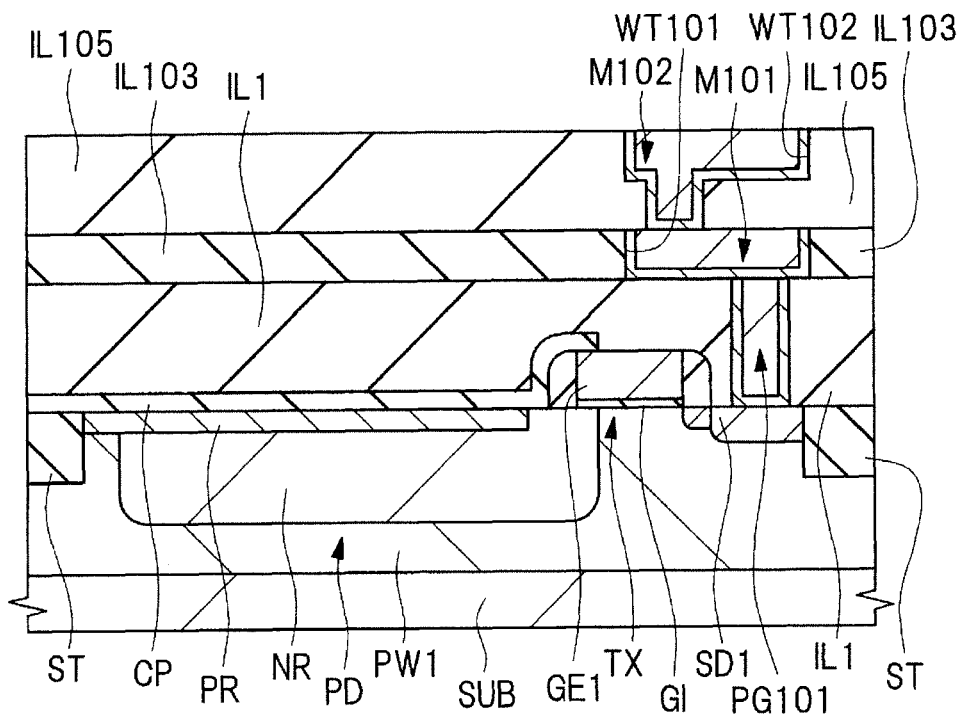
FIG. 45 is a main-portion cross-sectional view of a semiconductor device in a first studied example during the manufacturing process thereof.

The manufacturing process of the first studied example is substantially the same as the manufacturing process of the present embodiment until the structure of FIG. 14 described above is obtained (i.e., until the conductive film CD1 is formed in Step S5 described above). Then, in the manufacturing process of the first studied example, unlike in the present embodiment, the conductive film CD1 is polished by a CMP method without performing Steps S6 to S9 described above to be removed from outside the contact hole CT, while forming a plug PG101 in the contact hole CT, as shown in FIG. 45. Thus, in the manufacturing process of the first studied example, no equivalents to the foregoing opening OP2 and the foregoing embedded insulating film BF1 are formed.

Then, over the insulating film IL1 in which the plug PG101 is embedded, an insulating film IL103 is formed and, in the insulating film IL103, a wire trench WT101 is formed. The insulating film IL103 and the wire trench WT101 respectively correspond to the insulating film IL3 and the wire trench WT1 each described above. Then, a conductive film corresponding to the foregoing conductive film CD2 is formed over the insulating film IL103 so as to fill the wire trench WT101. Then, the conductive film is polished by a CMP method without performing Steps S14 to 17 described above to be removed from outside the wire trench WT101, while forming a wire M101 in the wire trench WT101, as shown in FIG. 45. The wire M101 corresponds to the foregoing wire M1. Thus, in the manufacturing process of the first studied example, no equivalents to the foregoing opening OP4 and the foregoing embedded insulating film BF2 are formed.

Then, over the insulating film IL103 in which the wire M101 is embedded, an insulating film IL105 is formed and, in the insulating film IL105, a wire opening WT102 is formed. The insulating film IL105 and the wire opening WT102 respectively correspond to the insulating film IL5 and the wire opening WT2 each described above. Then, a conductive film corresponding to the foregoing conductive film CD3 is formed over the insulating film IL105 so as to fill the wire opening WT102. Then, the conductive film is polished by a CMP method without performing Steps S22 to S25 described above to be removed from outside the wire opening WT102, while forming a wire M102 in the wire opening WT102, as shown in FIG. 45. The wire M102 corresponds to the foregoing wire M2. Thus, in the manufacturing process of the first studied example, no equivalents to the foregoing opening OP6 and the foregoing embedded insulating film BF3 are formed.

In this manner, the structure of FIG. 45 is obtained but, at this stage, over the photodiode PD, no equivalents to the foregoing openings OP2, OP4, and OP6 and the foregoing embedded insulating films BF1, BF2, and BF3 have been formed.

Figure 46:
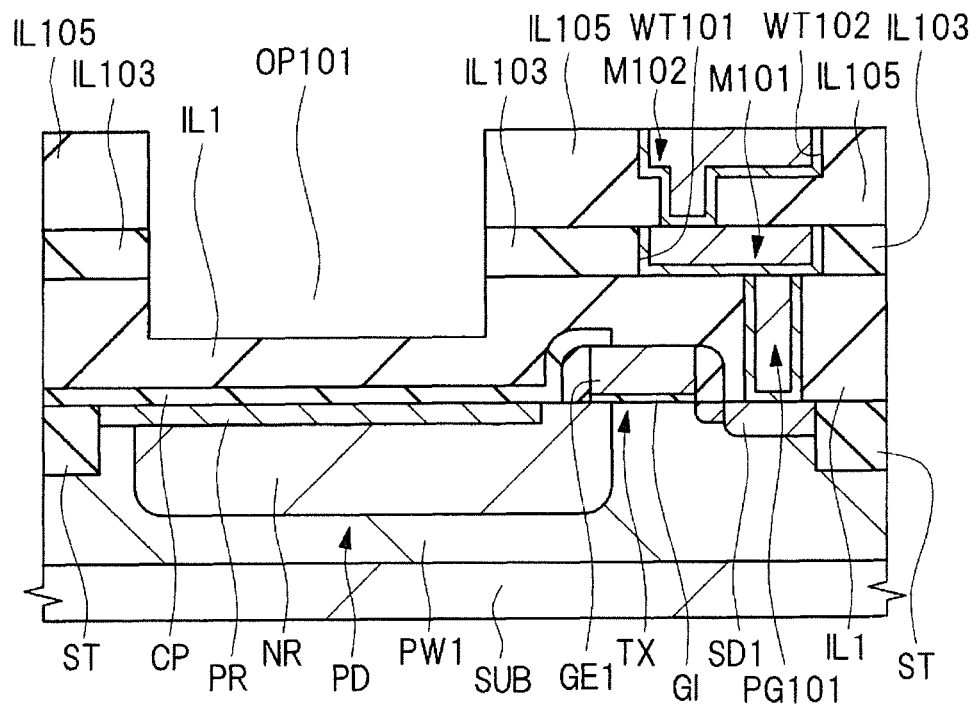
FIG. 46 is a main-portion cross-sectional view of the semiconductor device in the first studied example during the manufacturing process thereof, which is subsequent to FIG. 45.

Then, as shown in FIG. 46, using a photoresist pattern (not shown) formed over the insulating film IL105 as an etching mask, each of the insulating films IL105, IL103, and IL1 is subjected to dry etching to be formed with an opening OP101. The opening OP101 extends through the insulating films IL105 and IL103. On the other hand, the insulating film IL1 is halfway etched in the thickness direction thereof so that a part of the insulating film IL1 remains at the bottom portion of the opening OP101.

Figure 47:
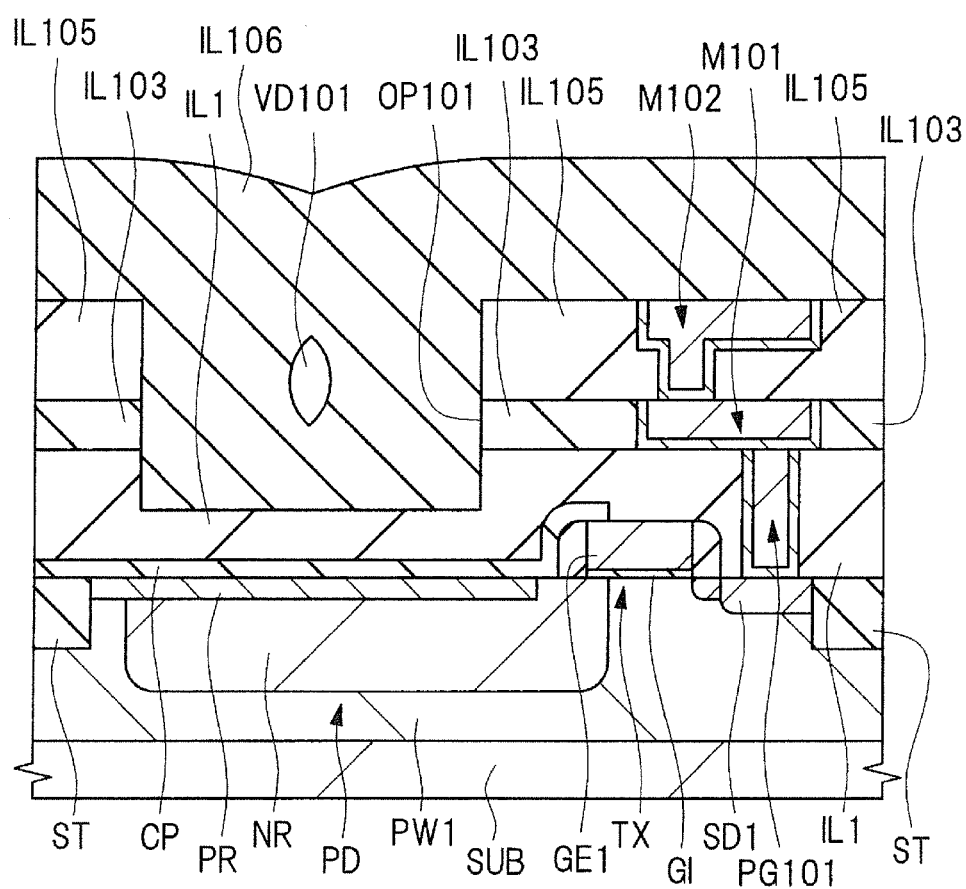
FIG. 47 is a main-portion cross-sectional view of the semiconductor device in the first studied example during the manufacturing process thereof, which is subsequent to FIG. 46.

Then, as shown in FIG. 47, an insulating film IL106 is formed over the insulating film IL105 so as to fill the wire opening WT102. The insulating film IL106 is formed of a silicon nitride film and can be formed by a CVD method or the like.

Then, as shown in FIG. 4, the insulating film IL106 is polished by a CMP method to be removed from outside the opening OP101, while forming the embedded insulating film BF101 in the opening OP101. The embedded insulating film BF101 is formed of the insulating film IL106 embedded and remaining in the opening OP101 of the insulating films IL105, IL103, and IL1. The stage shown in FIG. 48 corresponds to the foregoing stage shown in FIG. 35. The embedded insulating film BF101 corresponds to a combination of the foregoing embedded insulating films BF1, BF2, and BF3. The foregoing process shown in FIG. 36 described above and the drawings subsequent thereto (i.e., the process in Step S27 and the steps subsequent thereto) is performed, whereby the semiconductor device in the first studied example is manufactured.

The embedded insulating film BF101 functions as a waveguide for light incident on the photodiode PD, similarly to the foregoing embedded insulating films BF1, BF2, and BF3. Accordingly, the embedded insulating film BF101 is higher in refractivity and translucency than each of the insulating films IL105, IL103, and IL1 and is preferably formed of a silicon nitride.

However, in the manufacturing process of the first studied example, the insulating film IL106 is formed extensively in the opening OP101 formed in the insulating films IL105, IL103, and IL1 and then subjected to CMP treatment to form the embedded insulating film BF101. Since the opening OP101 is formed extensively in the insulating films IL105, IL103, and IL1, the depth thereof is large and, due to the large depth, the aspect ratio (value obtained by dividing a depth by a width) of the opening OP101 is undesirably increased accordingly. As a result, when the insulating film IL106 is formed, as shown in FIG. 47, the insulating film IL106 may not be able to completely fill the opening OP101 and a void (vacant space) VD101 may be formed in the insulating film IL106 embedded in the opening OP101.

Such formation of the void VD101 may occur irrespective of a method of depositing the insulating film IL106, but is particularly likely to occur when the insulating film IL106 is deposited by a CVD method.

Figure 48:
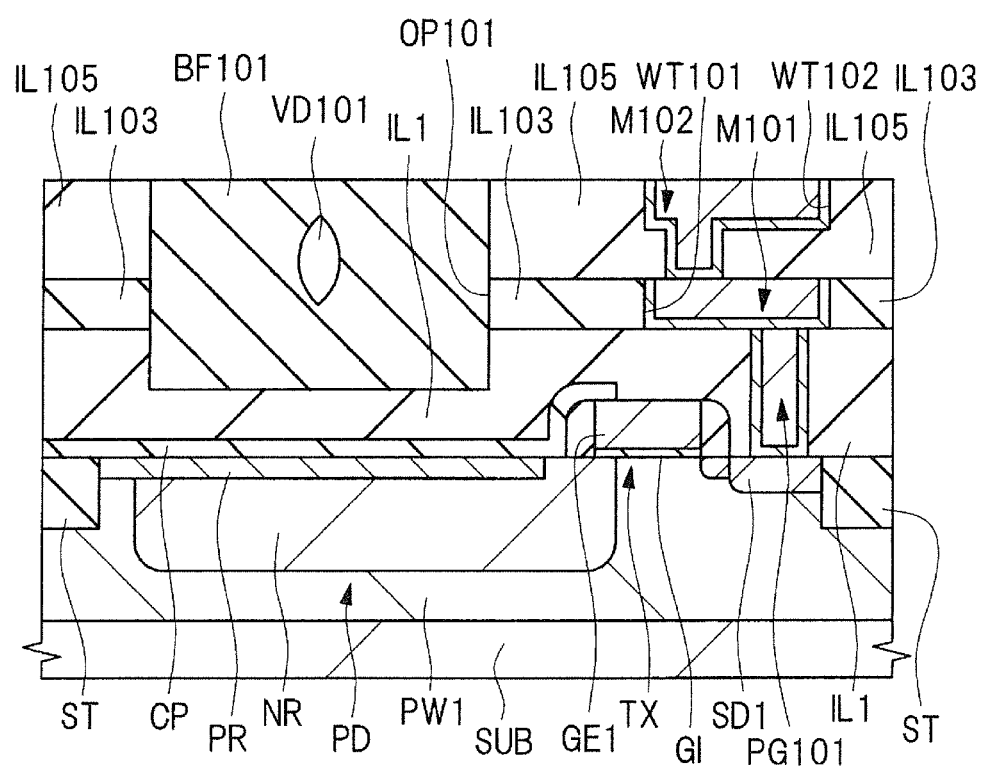
FIG. 48 is a main-portion cross-sectional view of the semiconductor device in the first studied example during the manufacturing process thereof, which is subsequent to FIG. 47.
Figure 49:
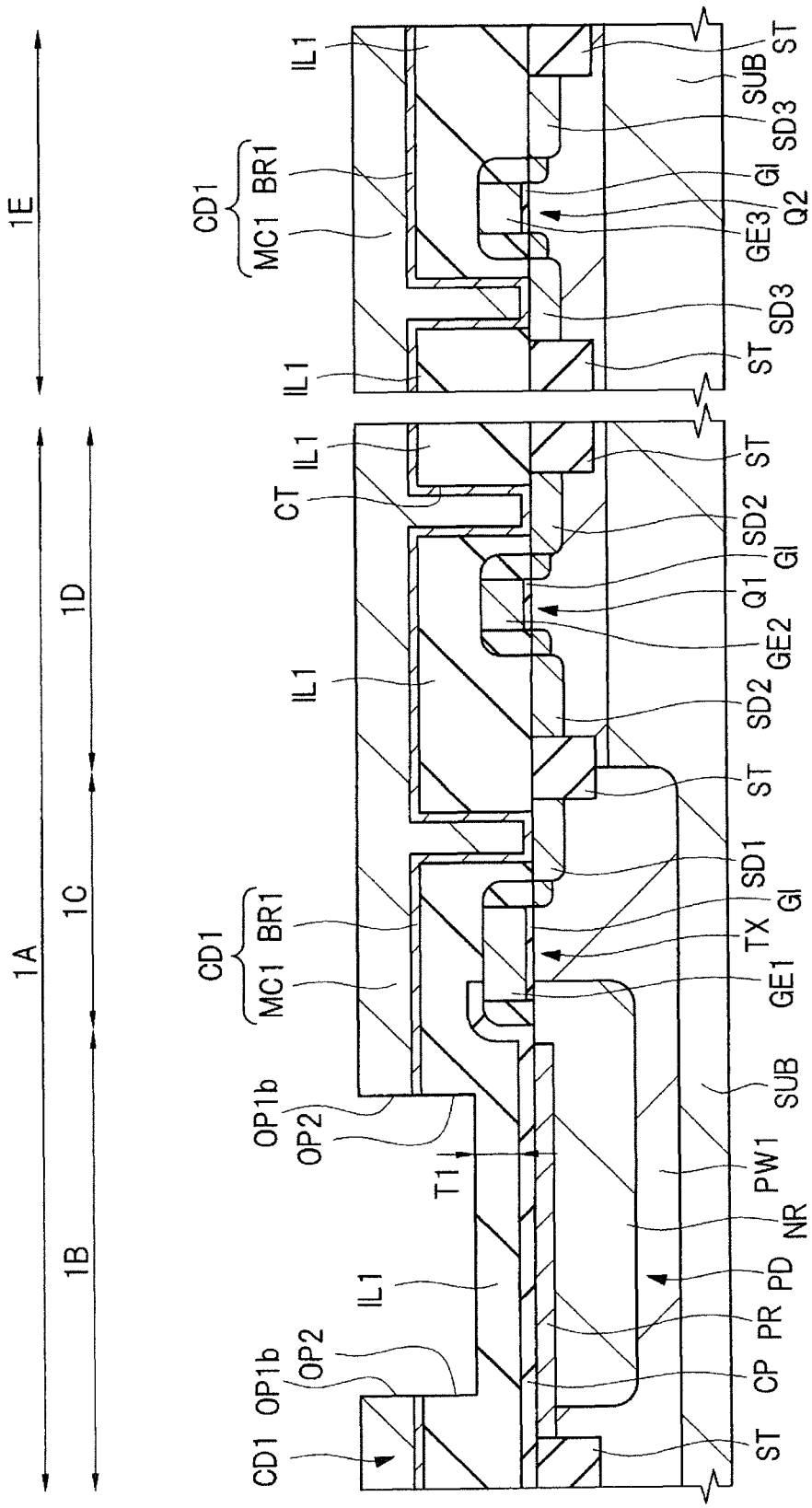
FIG. 49 is a main-portion cross-sectional view of a semiconductor device in a modification during the manufacturing process thereof.

The formation of the void VD101 in the insulating film IL106 embedded in the opening OP101 leads to the presence of the void VD101 in the embedded insulating film BF101, as shown in FIG. 48. When the void VD101 is present in the embedded insulating film BF101, the void VD101 operates to prevent light from passing through (being transmitted by) the embedded insulating film BF101. That is, depending on whether or not the void VD101 is present in the embedded insulating film BF101, the translucency of the embedded insulating film BF101 varies. As a result, depending on the presence or absence of the void VD101, the amount of light incident on the photodiode PD varies. Accordingly, when the void VD101 is present in the embedded insulating film BF101, the performance of the semiconductor device having the light receiving elements (which are the photodiodes PD herein) or the manufacturing yield thereof is consequently degraded. Therefore, it is desired to maximally suppress or prevent the formation of the void VD101 in the embedded insulating film BF101.

As the aspect ratio of the opening OP101 is higher, the void VD101 is more likely to be formed in the insulating film IL106 embedded in the opening OP101. Accordingly, to prevent the formation of the void VD101, it is effective to reduce the aspect ratio of the opening OP101. However, the width of the opening OP101 is set in accordance with the area of the photodiode PD. If the width of the opening OP101 is excessively reduced relative to the area of the photodiode PD, the amount of light incident on the photodiode PD is reduced to degrade the sensitivity of each of the pixels.

On the other hand, the depth of the opening OP101 is set in accordance with the thicknesses of the insulating films IL105, IL103, and IL1. Reducing the respective thicknesses of the insulating films IL105, IL103, and IL1 leads to reducing the thicknesses of the wires M101 and M102 to result in an increase in the resistance of each of the wires M101 and M102. Also, an excessive reduction in the thickness of the insulating film IL1 is not preferable in terms of the reliability of the semiconductor device. Thus, there are considerable limits to a reduction in the aspect ratio of the opening OP101 formed extensively in the insulating films IL105, IL103, and IL1.

Accordingly, it is desired to improve the performance of the semiconductor device having the light receiving elements (which are the photodiodes PD herein) by preventing a void from being formed in the embedded insulating film which functions as a waveguide for light incident on each of the light receiving elements (which are the photodiodes PD herein). It is also desired to improve the manufacturing yield of the semiconductor device having the light receiving elements (which are the photodiodes PD herein).

About Main Characteristic Feature and Effect of Present Embodiment

One of the main characteristic features of the manufacturing process of the present embodiment is that the waveguide for the light incident on the light receiving elements (which are the photodiodes PD herein) is formed by stacking the plurality of embedded insulating films (which are embedded insulating films BF1, BF2, and BF3) and, when a conductive plug or an embedded wire is formed, each of the embedded insulating films is formed simultaneously with the plug or the embedded wire.

Specifically, when the plug PG is formed, the embedded insulating film BF1 is formed simultaneously, when the wire M1 is formed, the embedded insulating film BF2 is formed simultaneously and, when the wire M2 is formed, the embedded insulating film BF3 is formed simultaneously. As a result, the depth of the opening OP2 in which the embedded insulating film BF1 is to be embedded, the depth of the opening OP4 in which the embedded insulating film BF2 is to be embedded, and the depth of the opening OP6 in which the embedded insulating film BF3 is to be embedded can be set smaller than (the depth of the foregoing opening OP101). This allows the aspect ratio of the opening OP2 to be lower (than the aspect ratio of the foregoing opening OP101), allows the aspect ratio of the opening OP4 to be lower (than the aspect ratio of the foregoing opening OP101), and allows the aspect ratio of the opening OP6 to be lower (than the aspect ratio of the foregoing opening OP101). As the aspect ratio of an opening is lower, when the opening is filled with an insulating film, a void is less likely to be formed in the insulating film.

As a result, when the opening is filled with the insulating film for forming an embedded insulating film, it is possible to inhibit or prevent a void from being formed in the insulating film and thereby inhibit or prevent a void from being formed in the embedded insulating film. Specifically, when the opening OP2 is filled with the insulating film IL2 for forming the embedded insulating film BF1, it is possible to inhibit or prevent a void from being formed in the insulating film IL2. Also, when the opening OP4 is filled with the insulating film IL4 for forming the embedded insulating film BF2, it is possible to inhibit or prevent a void from being formed in the insulating film IL4. Also, when the opening OP6 is filled with the insulating film IL6 for forming the embedded insulating film BF3, it is possible to inhibit or prevent a void from being formed in the insulating film IL6. Therefore, it is possible to inhibit or prevent a void from being formed in the embedded insulating film BF1, inhibit or prevent a void from being formed in the embedded insulating film BF2, and inhibit or prevent a void from being formed in the embedded insulating film BF3.

Thus, in the present embodiment, each of the embedded insulating films (BF1, BF2, and BF3) is formed simultaneously when the plug (PG) or the wire (M1 or M2) is formed. Specifically, a method as shown below is used.

That is, by Steps S3 to S10 described above, the plug PG and the embedded insulating film BF1 are formed, by steps S11 to S18 described above, the wire M1 and the embedded insulating film BF2 are formed and, by steps S19 to S26 described above, the wire M2 and the embedded insulating film BF3 are formed. The series of process steps in Steps S3 to S10 described above, the series of process steps in Steps S11 to S18, and the series of process steps in Steps S19 to S26 are basically in a common flow and can be correctively shown as Steps P1 to P7 shown below.

Step P1 is the step of forming an interlayer insulating film IL21.

Step P2 is the step of forming an opening OP21 in the interlayer insulating film IL21.

Step P3 is the step of forming a metal film CD21 over the interlayer insulating film IL21 so as to fill the opening OP21 therewith.

Step P4 is the step of forming an opening OP22 in the metal film CD21.

Step P5 is the step of etching the interlayer insulating film IL21 exposed from the opening OP22 to form an opening OP23 in the interlayer insulating film IL21.

Step P6 is the step of forming an insulating film IL22 over the metal film CD21 so as to fill the openings OP23 and OP22 therewith.

Step P7 is the step of polishing the insulating film IL22 and the metal film CD21 to remove the metal film CD21 outside the opening OP2 and the insulating film IL22 outside the opening OP23, leave the metal film CD21 in the opening OP21, and leave the insulating film IL22 in the opening OP23.

Here, Step P1 corresponds to Steps S3, S11, and S19 described above. The interlayer insulating film IL21 formed in Step P1 corresponds to the insulating film IL1 in Step S3, corresponds to the insulating film IL3 in Step S11, and corresponds to the insulating film IL5 in Step S19. Accordingly, the interlayer insulating film IL21 is not depicted.

Also, Step P2 corresponds to Steps S4, S12, and S20 described above. The opening OP21 formed in Step P2 corresponds to the contact hole CT in Step S4, corresponds to the wire trench WT1 in Step S12, and corresponds to the wire opening WT2 in Step S20. Accordingly, the opening OP21 is not depicted.

Also, Step P3 corresponds to Steps S5, S13, and S21 described above. The metal film CD21 formed in Step P3 corresponds to the conductive film CD1 in Step S5, corresponds to the conductive film CD2 in Step S13, and corresponds to the conductive film CD3 in Step S21. Accordingly, the metal film CD21 is not depicted.

Also, Step P4 corresponds to Steps S7, S15, and S23 described above. The opening OP22 formed in Step P4 corresponds to the opening OP1*b* in Step S7, corresponds to the opening OP3*b* in Step S15, and corresponds to the opening OP5*b* in Step S23. Accordingly, the opening OP22 is not depicted.

Also, Step P5 corresponds to Steps S8, S16, and S24 described above. The opening OP23 formed in Step P5 corresponds to the opening OP2 in Step S8, corresponds to the opening OP4 in Step S16, and corresponds to the opening OP6 in Step S24. Accordingly, the opening OP23 is not depicted.

Also, Step P6 corresponds to Steps S9, S17, and S25 described above. The insulating film IL22 formed in Step P6 corresponds to the insulating film IL2 in Step S9, corresponds to the insulating film IL4 in Step S17, and corresponds to the insulating film IL6 in Step S25. Accordingly, the insulating film IL22 is not depicted.

Also, Step P7 corresponds to Steps S10, S18, and S26 described above. In Step P7, the metal film CD21 is left in the opening OP21, and the insulating film IL22 is left in the opening OP23. When Step P7 is Step S10, the plug PG is formed of the metal film CD21 remaining in the opening OP21, and the embedded insulating film BF1 is formed of the insulating film IL22 remaining in the opening OP23. Alternatively, when Step P7 is Step S18, the wire M1 is formed of the metal film CD21 remaining in the opening OP21, and the embedded insulating film BF2 is formed of the insulating film IL22 remaining in the opening OP23. Otherwise, when Step P7 is Step S26, the wire M2 is formed of the metal film CD21 remaining in the opening OP21, and the embedded insulating film BF3 is formed of the insulating film IL22 remaining in the opening OP23.

In the present embodiment, by performing Steps P1 to P7, when the plug (PG) or the wire (M1 or M2) is formed, the embedded insulating film (BF1, BF2, or BF3) can be formed simultaneously. Then, by assuming that Steps P1 to P7 form one cycle and performing a plurality of the cycles (i.e., not less than two cycles), the embedded insulating films (BF1, BF2, and BF3) in the plurality of layers can be stacked (laminated) over each of the light receiving elements (which are the photodiodes PD herein). This allows each of the embedded insulating films (BF1, BF2, and BF3) to have a smaller thickness than in the case where the embedded insulating film BF101 is formed at a time as in the first studied example shown in FIGS. 45 and 48 described above. As a result, it is possible to inhibit or prevent a void from being formed during the formation of the insulating films (IL2, IL4, and IL6) for forming the embedded insulating films and thereby inhibit or prevent a void from being formed in the embedded insulating films (BF1, BF2, and BF3).

Note that, in the present embodiment, by assuming that Steps P1 to P7 form one cycle and performing the cycle three times, the embedded insulating films BF1, BF2, and BF3 in the three layers are stacked over the light receiving element (which is the photodiode PD herein). As a result, a void is less likely to be formed in each of the embedded insulating films BF1, BF2, and BF3 than in the case where a combination of the embedded insulating films BF1, BF2, and BF3 in the three layers is formed at a time (corresponding to the first studied example shown in FIGS. 45 and 48 described above).

In another form, it is also possible to stack embedded insulating films in two layers over each of the light receiving elements (which are the photodiodes PD herein) by assuming that Steps P1 to P7 form one cycle and performing the cycle twice. In still another form, it is also possible to stack embedded insulating films in four or more layers over each of the light receiving elements (which are the photodiodes PD herein) by performing the cycle four or more times.

When Steps P1 to P7 are assumed to form one cycle and the cycle is performed twice, Steps S3 to S10 described above are performed to form the plug PG and the embedded insulating film BF1, and then Steps S11 to S18 described above are performed to be able to form the wire M1 and the embedded insulating film BF2. This allows the embedded insulating films BF1 and BF2 in the two layers to be stacked over each of the light receiving elements (photodiodes PD). In this case also, a void is less likely to be formed in each of the embedded insulating films BF1 and BF2 than in the case where a combination of the embedded insulating films BF1 and BF2 in the two layers is formed at a time.

When Steps P1 to P7 are assumed to form one cycle and the cycle is performed twice, Steps S11 to S18 describe above are performed to form the wire M1 and the embedded insulating film BF2, and then Steps S19 to S26 described above are performed to be able to form the wire M2 and the embedded insulating film BF3. This allows the embedded insulating films BF2 and BF3 in the two layers to be stacked over each of the light receiving elements (photodiodes PD). In this case also, a void is less likely to be formed in each of the embedded insulating films BF2 and BF3 than in the case where a combination of the embedded insulating films BF2 and BF3 in the two layers is formed at a time.

When Steps P1 to P7 are assumed to form one cycle and the cycle is performed four times, after Steps S3 to S10, Steps S11 to S18, and Steps S19 to S26 each described above are performed in succession, one more cycle including Steps P1 to P7 may be performed appropriately.

Also, the insulating film IL22 (embedded insulating film) embedded in the opening OP23 in Step P7 is designed to be located over each of the light receiving elements (which are the photodiodes PD herein), and the embedded insulating films (insulating film IL22 embedded in the opening OP23 in Step P7) when the plurality of cycles each including Steps P1 to P7 are performed are designed such that each of the higher-layer embedded insulating films is located over the lower-layer embedded insulating film. Specifically, the embedded insulating film BF1 is designed to be located over each of the light receiving elements (which are the photodiodes PD herein), the embedded insulating film BF2 is designed to be located over the embedded insulating film BF1, and the embedded insulating film BF3 is designed to be located over the embedded insulating film BF2. By thus designing the embedded insulating films BF1, BF2, and BF3, a laminated structure of the embedded insulating films BF1, BF2, and BF3 is located over each of the light receiving elements (photodiodes PD). This allows light to be incident on each of the light receiving elements (photodiodes PD) through the embedded insulating films (BF1, BF2, and BF3) stacked over the light receiving element (photodiode PD).

In Step P4, the opening OP22 is preferably formed over each of the light receiving elements (which are the photodiodes PD). As a result, in Step P5, the opening OP23 is also formed over the light receiving element, and consequently the insulating film IL22 (each of the embedded insulating films BF1, BF2, and BF3) remaining in the opening OP23 is also formed over the light receiving element in Step P7.

Each of the insulating films IL22 (embedded insulating films) embedded in the opening OP23 in Step P7, more specifically each of the embedded insulating films BF1, BF2, and BF3 also functions as a waveguide for light incident on each of the light receiving elements (which are the photodiodes PD herein). Therefore, it is necessary for each of the embedded insulating films BF1, BF2, and BF3 to be able to properly function as a light waveguide.

Accordingly, the refractivity of the insulating film IL2 formed in Step P6 is preferably higher than the refractivity of the interlayer insulating film IL21 formed in Step P1. Specifically, it is preferable that the refractivity of the insulating film IL2 formed in Step S9 is higher than the refractivity of the insulating film IL1 formed in Step S3, the refractivity of the insulating film IL4 formed in Step S17 is higher than the refractivity of the insulating film IL3 formed in Step S11, and the refractivity of the insulating film IL6 formed in Step S25 is higher than the refractivity of the insulating film IL5 formed in Step S19. That is, it is preferable that the refractivity of the embedded insulating film BF1 is higher than the refractivity of the insulating film ILL the refractivity of the embedded insulating film BF2 is higher than the refractivity of the insulating film IL3, and the refractivity of the embedded insulating film BF3 is higher than the refractivity of the insulating film IL5.

Due to the refractivity of the embedded insulating film BF3 embedded in the opening OP6 of the insulating film IL5 which is higher than the refractivity of the insulating film IL5, when light incident on the embedded insulating film BF3 reaches the side surfaces of the insulating film IL5 forming the side walls of the opening OP6, the light is reflected by the side surfaces of the insulating film IL5. Also, due to the refractivity of the embedded insulating film BF2 embedded in the opening OP4 of the insulating film IL3 which is higher than the refractivity of the insulating film IL3, when light incident on the embedded insulating film BF2 reaches the side surfaces of the insulating film IL3 forming the side walls of the opening OP4, the light is reflected by the side surfaces of the insulating film IL3. Also, due to the refractivity of the embedded insulating film BF1 embedded in the opening OP2 of the insulating film IL1 which is higher than the refractivity of the insulating film IL1, when light incident on the embedded insulating film BF1 reaches the side surfaces of the insulating film IL2 forming the side walls of the opening OP2, the light is reflected by the side surface of the insulating film IL2. As a result, the light incident on the embedded insulating film BF3 passes through the embedded insulating films BF3, BF2, and BF1 to be efficiently incident on each of the light receiving elements (photodiodes PD). That is, by establishing the relationships between the refractivities of the embedded insulating films BF3, BF2, and BF1 and the insulating films IL5, IL3, and IL1 as described above, even when the light incident on the embedded insulating film BF3 travels toward the side surfaces of the insulating films IL5, IL3, and IL1 forming the respective side walls of the openings OP6, OP4, and OP2, the light is reflected thereby to be able to pass through the interiors of the embedded insulating films BF3, BF2, and BF1 and be properly incident on the light receiving element (photodiode PD). Therefore, the intensity of the light incident on the light receiving element (photodiode PD) is easily ensured. This leads to an improvement in the sensitivity of the light receiving element and allows an improvement in the performance of the semiconductor device.

Note that, when a refractivity or translucency is mentioned, it refers to the refractivity or translucency of the light caused to be incident on a light receiving element (which is the photodiode PD herein). For example, in the case where visible light is caused to be incident on the light receiving element (which is the photodiode PD herein) (is subjected to photoelectrical conversion in the light receiving element), the refractivity or translucency of the light which is not more than a reference value is required in a given specified wavelength region (typically 0.4 µm to 1.1 µm).

The translucency of the insulating film IL22 formed in Step P6 is preferably higher than the translucency of the interlayer insulating film IL21 formed in Step P1. Specifically, it is preferable that the translucency of the insulating film IL2 formed in Step S9 is higher than the translucency of the insulating film IL1 formed in Step S3, the translucency of the insulating film IL4 formed in Step S17 is higher than the translucency of the insulating film IL3 formed in Step S11, and the translucency of the insulating film IL6 formed in Step S25 is higher than the translucency of the insulating film IL5 formed in Step S19. In other words, it is preferable that the translucency of the embedded insulating film BF1 is higher than the translucency of the insulating film IL1 in which the embedded insulating film BF1 is embedded, the translucency of the embedded insulating film BF2 is higher than the translucency of the insulating film IL3 in which the embedded insulating film BF2 is embedded, and the translucency of the embedded insulating film BF3 is higher than the translucency of the insulating film IL5 in which the embedded insulating film BF3 is embedded. Accordingly, it is possible to suppress attenuation (absorption) of light when the light passes through the embedded insulating films BF3, BF2, and BF1. This allows the intensity of the light incident on the light receiving element (photodiode PD) to be easily ensured. This leads to an improvement in the sensitivity of the light receiving element and allows an improvement in the performance of the semiconductor device.

Note that, as described above, when a comparison is made between the magnitudes of translucencies of two films, the film having a higher light transmittance when the thicknesses of the two films are assumed to be the same can be determined to have a higher translucency. That is, it can be said that the film showing smaller attenuation in light intensity when light travels over the same distance in the two films (the intensities of light incident on the two films are assumed to be the same) has a higher translucency. Therefore, when it is said that, e.g., the translucency of the insulating film IL22 is higher than the translucency of the interlayer insulating film IL21, if the thickness of the insulating film IL22 is assumed to be set the same as the thickness of the interlayer insulating film IL21, it is meant that the light transmittance of the insulating film IL22 is higher than the light transmittance of the interlayer insulating film IL21. On the other hand, when it is said that the translucency of each of the embedded insulating films (BF1, BF2, and BF3) is higher than the translucency of the interlayer insulating film (IL1, IL3, or IL5) in which the embedded insulating film is embedded, if the thickness of the embedded insulating film is assumed to be set the same as the thickness of the interlayer insulating film, it is meant that the light transmittance of the embedded insulating film is higher than the light transmittance of the interlayer insulating film.

Note that, since the embedded insulating film BF2 is embedded in the opening OP4 extending through the insulating film IL3, the thickness of the embedded insulating film BF2 is approximately the same as the thickness of the insulating film IL3. Also, since the embedded insulating film BF3 is embedded in the opening OP6 extending through the insulating film IL5, the thickness of the embedded insulating film BF3 is approximately the same as the thickness of the insulating film IL5. Accordingly, it is preferable that the light transmittance of the embedded insulating film BF2 is higher than the light transmittance of the insulating film IL3 and the light transmittance of the embedded insulating film BF3 is higher than the light transmittance of the insulating film IL5.

Here, when the intensity of incident light when the light is incident on a given film is $I_0$ and the intensity of the transmitted light is I, the following expression (1) is satisfied:

$$I=I_0 \times \exp(-\alpha \times z) \quad (1)$$

wherein α is an absorption coefficient, and z is the length of a path (which corresponds herein to the thickness of a film which has transmitted the light).

A value obtained by dividing the intensity I of the transmitted light by the intensity $I_0$ of the incident light (i.e., $I/I_0$), which is expressed in percentage, corresponds to the transmittance.

The absorption coefficient α is given by the following expression (2):

$$\alpha = 4\pi k/\lambda \quad (2)$$

wherein k is an extinction coefficient (attenuation coefficient), and λ is the wavelength of the light.

As can be also seen from the foregoing expressions, as the extinction coefficient k is smaller, the translucency is higher. That is, the higher translucency corresponds to the smaller extinction coefficient. Accordingly, the foregoing relationships between the translucencies of the insulating films IL2, IL4, and IL6, the embedded insulating films BF1, BF2, and BF3, and the insulating films IL5, IL3, and IL1 are expressed as follows using the extinction coefficient k.

That is, the extinction coefficient k of the insulating film IL22 formed in Step P6 is preferably smaller (lower) than the extinction coefficient k of the interlayer insulating film IL21 formed in Step P1. Specifically, it is preferable that the extinction coefficient k of the insulating film IL2 is smaller (lower) than the extinction coefficient k of the insulating film IL1, the extinction coefficient k of the insulating film IL4 is smaller (lower) than the extinction coefficient k of the insulating film IL3, and the extinction coefficient k of the insulating film IL6 is smaller (lower) than the extinction coefficient k of the insulating film IL5. In other words, it is preferable that the extinction coefficient k of the embedded insulating film BF1 is smaller (lower) than the extinction coefficient k of the insulating film IL1, the extinction coefficient k of the embedded insulating film BF2 is smaller (lower) than the extinction coefficient k of the insulating film IL3, and the extinction coefficient k of the embedded insulating film BF3 is smaller (lower) than the extinction coefficient k of the insulating film IL5. Accordingly, it is possible to suppress the attenuation (absorption) of light when the light passes through the embedded insulating films BF3, BF2, and BF1 to easily ensure the intensity of the light incident on the light receiving element (photodiode PD). This leads to an improvement in the sensitivity of the light receiving element and allows an improvement in the performance of the semiconductor device.

The embedded insulating film BF2 (the bottom surface thereof) is preferably in contact with the embedded insulating film BF1 (the upper surface thereof). Also, the embedded insulating film BF3 (the bottom surface thereof) is preferably in contact with the embedded insulating film BF2 (the upper surface thereof). This allows a light waveguide to be properly formed of the stacked embedded insulating films BF3, BF2, and BF1. That is, since another film no longer exists between the embedded insulating films BF3, BF2, and BF1, light is allowed to properly pass through (be transmitted by) the stacked embedded insulating films BF3, BF2, and BF1. This allows the intensity of the light incident on the light receiving element (photodiode PD) to be easily ensured.

The embedded insulating films BF1 and BF2 are preferably made of the same insulating material. Also, the embedded insulating films BF2 and BF3 are preferably made of the same insulating material. That is, the embedded insulating films BF1, BF2, and BF3 are preferably made of the same insulating material. As a result, an interface between layers of different materials is not formed between the embedded insulating films BF3 and BF2, and also an interface between layers of different materials is not formed between the embedded insulating films BF2 and BF1. Accordingly, the occurrence of reflection at the interface between the embedded insulating films BF3 and BF2 or at the interface between the embedded insulating films BF2 and BF1 is easily prevented. Therefore, the intensity of the light incident on the light receiving element (photodiode PD) is easily ensured. To implement this, the insulating films IL2, IL4, and IL6 are preferably formed of the same insulating material.

Also, each of the embedded insulating films BF1, BF2, and BF3 preferably has the same refractivity. This can prevent the occurrence of reflection of light at the interface between the embedded insulating films BF3 and BF2 or at the interface between the embedded insulating films BF2 and BF1. Therefore, the intensity of the light incident on the light receiving element (photodiode PD) is easily ensured.

Also, each of the embedded insulating films BF1, BF2, and BF3 is preferably made of a silicon nitride (silicon nitride film). That is, each of the insulating films IL2, IL4, and IL6 is preferably made of a silicon nitride film. A silicon nitride film has a refractivity and a translucency which are more easily increased than those of a silicon-oxide-based insulating film. In addition, by controlling the quality and composition of the silicon nitride film, the refractivity and translucency thereof are easily controlled. Accordingly, by using a silicon nitride film as each of the insulating films IL2, IL4, and IL6, it is easier to increase the refractivity and translucency of each of the embedded insulating films BF1, BF2, and BF3 each formed of a silicon nitride and control the refractivity and translucency thereof to desired values. This allows the embedded insulating films BF1, BF2, and BF3 to more properly perform the function of the light waveguide.

When each of the insulating films IL2, IL4, and IL6 is formed of a silicon nitride film, the silicon nitride film is preferably formed by a CVD method. In the CVD method, the silicon nitride film can be deposited using a deposition gas containing, e.g., silane and ammonium. At this time, by controlling the flow rates of a silane gas and an ammonium gas or the like, the composition ratio in the silicon nitride film (composition ratio between Si (silicon) and N (nitride)) can be controlled to allow the refractivity and translucency of the silicon nitride film to be controlled.

As a method for forming the insulating film IL22 in Step P6 (i.e., a method for forming the insulating films IL2, IL4, and IL6 in Steps S9, S17, and S25), a coating method or a CVD method can be considered. When a comparison is made between the coating method and the CVD method, the void VD101 described above in the first studied example shown in FIGS. 45 to 48 is more likely to be formed in the CVD method. However, in the present embodiment, by stacking the embedded insulating films BF1, BF2, and BF3 in the plurality of layers to form the light waveguide as described above, it is possible to inhibit or prevent a void from being formed in each of the embedded insulating films. As a result, even when a CVD method is used during the formation of the insulating film IL22 in Step P6 (i.e., during the formation of the insulating films IL2, IL4, and IL6 in Steps S9, S17, and S25), it is possible to inhibit or prevent a void from being formed in each of the embedded insulating films (BF1, BF2, and BF3). Therefore, if applied to the case where a CVD method is used during the formation of the insulating film IL22 in Step P6 (i.e., during the formation of the insulating films IL2, IL4, and IL6 in Steps S9, S17, and S25), the present embodiment achieves an extremely large effect.

When the CVD method is used as the method for forming the insulating film IL22 in Step P6 (i.e., as the method for forming the insulating films IL2, IL4, and IL6 in Steps S9, S17, and S25), the quality of the insulating film IL22 (each of the insulating films IL2, IL4, and IL6) is more easily controlled and the properties (refractivity and translucency) thereof appropriate for the light waveguide are more easily adjusted than when the coating method is used as the method for forming the insulating film IL22 in Step P6. Accordingly, as the method for forming the insulating film IL22 in Step P6 (i.e., as the method for forming the insulating films IL2, IL4, and IL6 in Steps S9, S17, and S25), the CVD method is more preferably used.

A silicon-oxide-based insulating film is preferred as an interlayer insulating film. Accordingly, the interlayer insulating film IL21 formed in Step P1 (i.e., each of the insulating films IL1, IL3, and IL5 formed in Steps S3, S11, and S19) preferably includes a silicon-oxide-based insulating film. The silicon-oxide-based insulating film mentioned herein is an insulating film containing silicon (Si) and oxygen (O) as main components, but can also contain one or more of fluorine (F), carbon (C), and nitrogen (N) besides silicon (Si) and oxygen (O). When the interlayer insulating film IL21 formed in Step P1 (i.e., each of the insulating films IL1, IL3, and IL5 formed in Steps S3, S11, and S19) contains the silicon-oxide-based insulating film, by using a silicon nitride film as the embedded insulating film formed in Step P7 (i.e., each of the embedded insulating films BF1, BF2, and BF3 formed in Steps S10, S18, and S26), it is possible to cause the embedded insulating films to properly function as the light waveguide.

In the present embodiment, as a photomask used in each of the exposure steps for forming the foregoing photoresist patterns RP1, RP2, and RP3, a common photomask (the same photomask) can be used. That is, in each of the exposure step when the foregoing photoresist pattern RP1 is formed in Step S6, the exposure step when the foregoing photoresist pattern RP2 is formed in Step S14, and the exposure step when the foregoing photoresist pattern RP3 is formed in Step S22, the common (same) photomask can be used. This eliminates the need to increase the number of photomasks for stacking the embedded insulating films BF1, BF2, and BF3 in the plurality of layers. As a result, the manufacturing cost of the semiconductor device can be reduced.

In the foregoing manufacturing process of the first studied example shown in FIGS. 45 to 48, the opening OP101 has a large depth. Accordingly, when the insulating films IL105, IL103, and IL1 are etched to form the opening OP101, the amount of etching (depth of etching) is large. As the amount of etching (depth of etching) is larger, variations (fluctuations) in the amount of etching (depth of etching) are larger. As a result, in the etching step for forming the opening OP101 in the first studied example, variations (fluctuations) in the amount of etching (depth of etching) increase and the thickness of the insulating film IL1 remaining under the bottom surface of the opening OP101 may vary (fluctuate) from one semiconductor wafer to another. Since the thickness of the insulating film IL1 remaining under the bottom surface of the opening OP101 affects the intensity of the light incident on each of the light receiving elements (photodiodes PD), variations (fluctuations) therein lead to variations (fluctuations) in the sensitivity of the light receiving element. This may degrade the performance and reliability of the semiconductor device. This may also degrade the manufacturing yield of the semiconductor device. Therefore, it is desired to minimize variations (fluctuations) in the thickness of the insulating film IL1 remaining under the bottom surface of the opening OP101.

By contrast, in the present embodiment, the opening OP2 is formed by etching the insulating film IL1 in Step S8 so that the depth of the opening OP2 is smaller than the depth of the foregoing opening OP101. Accordingly, the amount of etching (depth of etching) when the insulating film IL1 is etched to form the opening OP2 is smaller than the amount of etching (depth of etching) when each of the insulating films IL105, IL103, and IL1 is etched to form the foregoing opening OP101. As the amount of etching (depth of etching) is smaller, variations (fluctuations) in the amount of etching (depth of etching) are smaller. Therefore, in the present embodiment, in the etching step for forming the opening OP2, variations (fluctuations) in the amount of etching (depth of etching) can be reduced. As a result, in the present embodiment, it is possible to inhibit or prevent the thickness of the insulating film IL1 remaining under the bottom surface of the opening OP2 from varying (fluctuating). This can improve the performance and reliability of the semiconductor device. This can also improve the manufacturing yield of the semiconductor device.

As a method which can further inhibit the thickness of the insulating film IL1 remaining under the bottom surface of the opening OP2 from varying (fluctuating), the following modification can also be used.

About Modification

FIGS. 49 to 52 are main-portion cross-sectional views during the manufacturing process of the modification of the present embodiment.

First, by performing the process up to Step S8 (step of forming the opening OP2) described above, the structure of FIG. 49, which is the same as that of FIG. 17 described above, is obtained. Then, the thickness T1 of the insulating film IL1 remaining under the bottom surface of the opening OP2 is measured. For example, the thickness T1 can be optically measured.

As a result of measuring the thickness T1, when the thickness T1 is determined to fall within an acceptable range (e.g., when the thickness T1 is not less than a predetermined thickness (reference thickness set in advance) T2, the flow moves to Step S9 (step of forming the insulating film IL2) described above to obtain the structure of FIG. 18 described above. Thereafter, the process including and subsequent to Step S10 described above may be performed appropriately as described above.

Figure 50:
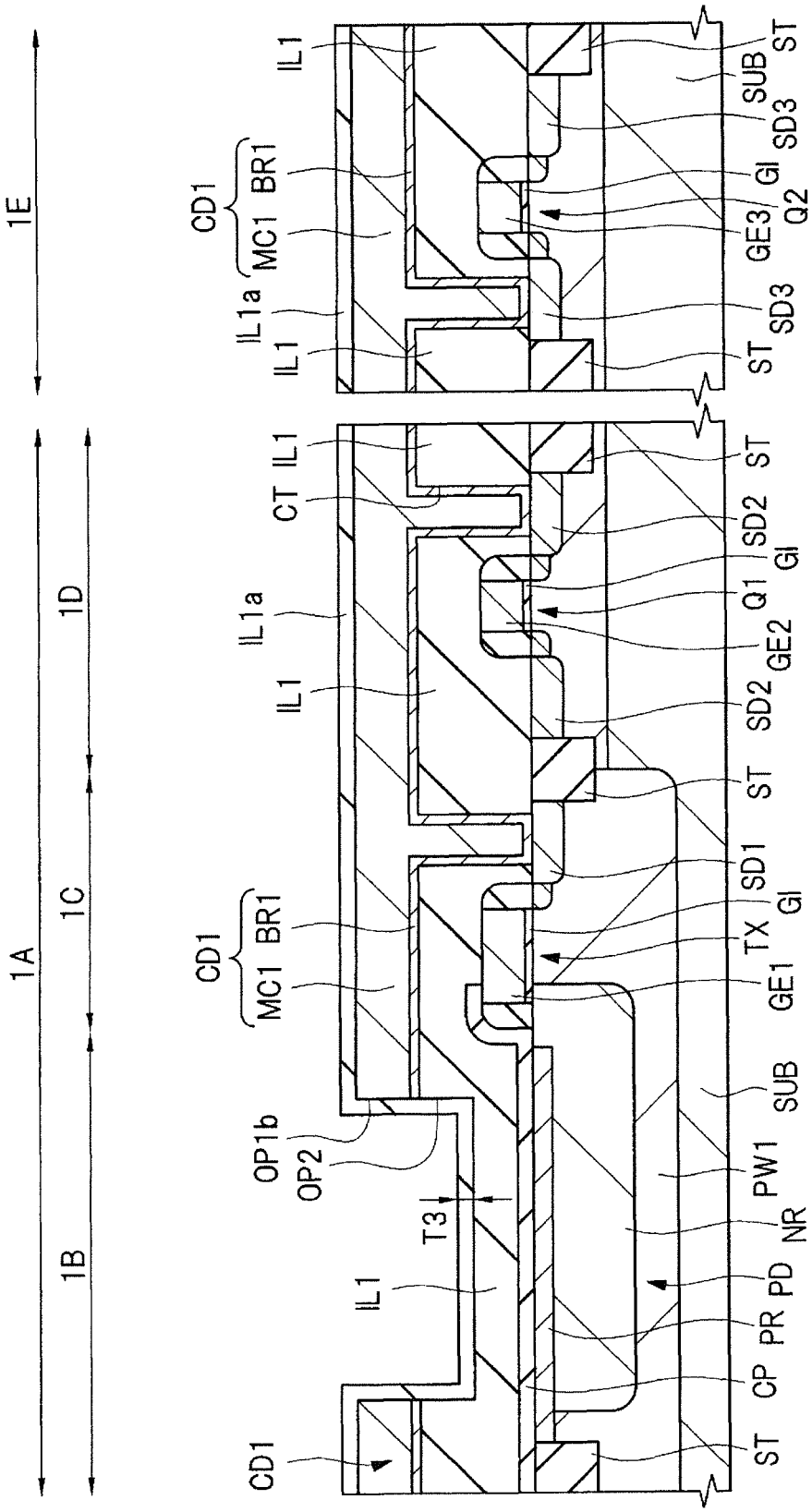
FIG. 50 is a main-portion cross-sectional view of the semiconductor device during the manufacturing process thereof, which is subsequent to FIG. 49.
Figure 51:
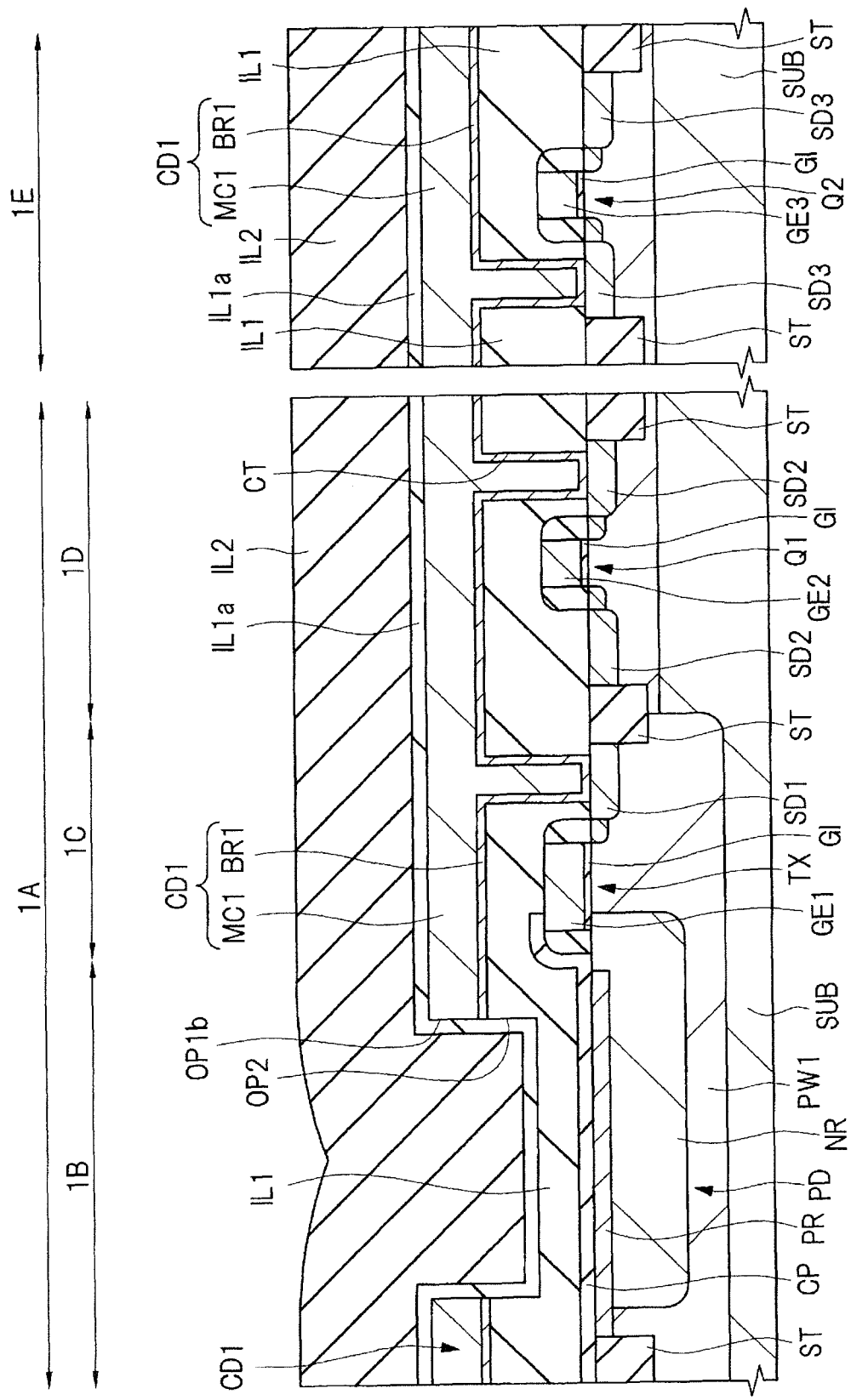
FIG. 51 is a main-portion cross-sectional view of the semiconductor device during the manufacturing process thereof, which is subsequent to FIG. 50.

On the other hand, as a result of measuring the thickness T1, when the thickness T1 is determined to be excessively thin (e.g., when the thickness T1 is less than the foregoing thickness T2), after measuring the thickness T1 and prior to performing Step S9 (step of forming the insulating film IL2), the step of forming the insulating film IL1a is added to the process, as shown in FIG. 50.

That is, as shown in FIG. 50, over the conductive film CD1 including the bottom surface and side walls (side surfaces) of the opening OP2 and the side walls (side surfaces) of the opening OP1b, an insulating film IL1a is formed. The insulating film IL1a is preferably formed of the same insulating material as that of the insulating film IL1 and particularly preferably formed of the same material as the portion of the insulating film IL1 exposed at the bottom of the opening OP2. Therefore, when the insulating film IL1 is formed of a silicon oxide film, the insulating film IL1a is also formed of a silicon oxide film.

As a result of measuring the thickness T1, when the thickness T1 is determined to be excessively thin, the result of the determination means that the depth of the opening OP2 is excessively large (the insulating film IL1 is excessively etched). Accordingly, to compensate for the insulating film IL1 excessively etched at the bottom portion of the opening OP2, the insulating film IL1a is formed. Note that, even when the insulating film IL1a is formed, the opening OP2 is not completely filled with the insulating film IL1a, resulting in a state where the insulating film IL1a is formed over the insulating film IL1 at the bottom surface of the opening OP2 and the insulating film IL1 over the side walls of the opening OP2 to have a thickness T3.

The insulating film IL1a is formed to have the thickness (thickness of the formed film) T3. The thickness T3 of the insulating film IL1a may be set appropriately such that a value obtained by adding the thickness T3 to the measured thickness T1 is appropriate as the thickness of the interlayer insulating film remaining at the bottom portion of the opening OP2.

For example, the thickness T3 of the insulating film IL1a can be set to the difference between the measured thickness T1 and the foregoing thickness T2 (i.e., T3=T2−T1). Consequently, at the bottom portion of the opening OP2, the total thickness of the insulating films IL1 and IL1a is given by (T1+T3), which is substantially equal to the foregoing thickness T2. That is, a state is achieved in which, at the bottom portion of the opening OP2, the laminated film of the insulating films IL1 and IL1a is formed to have the thickness substantially equal to the foregoing thickness T2.

Figure 52:
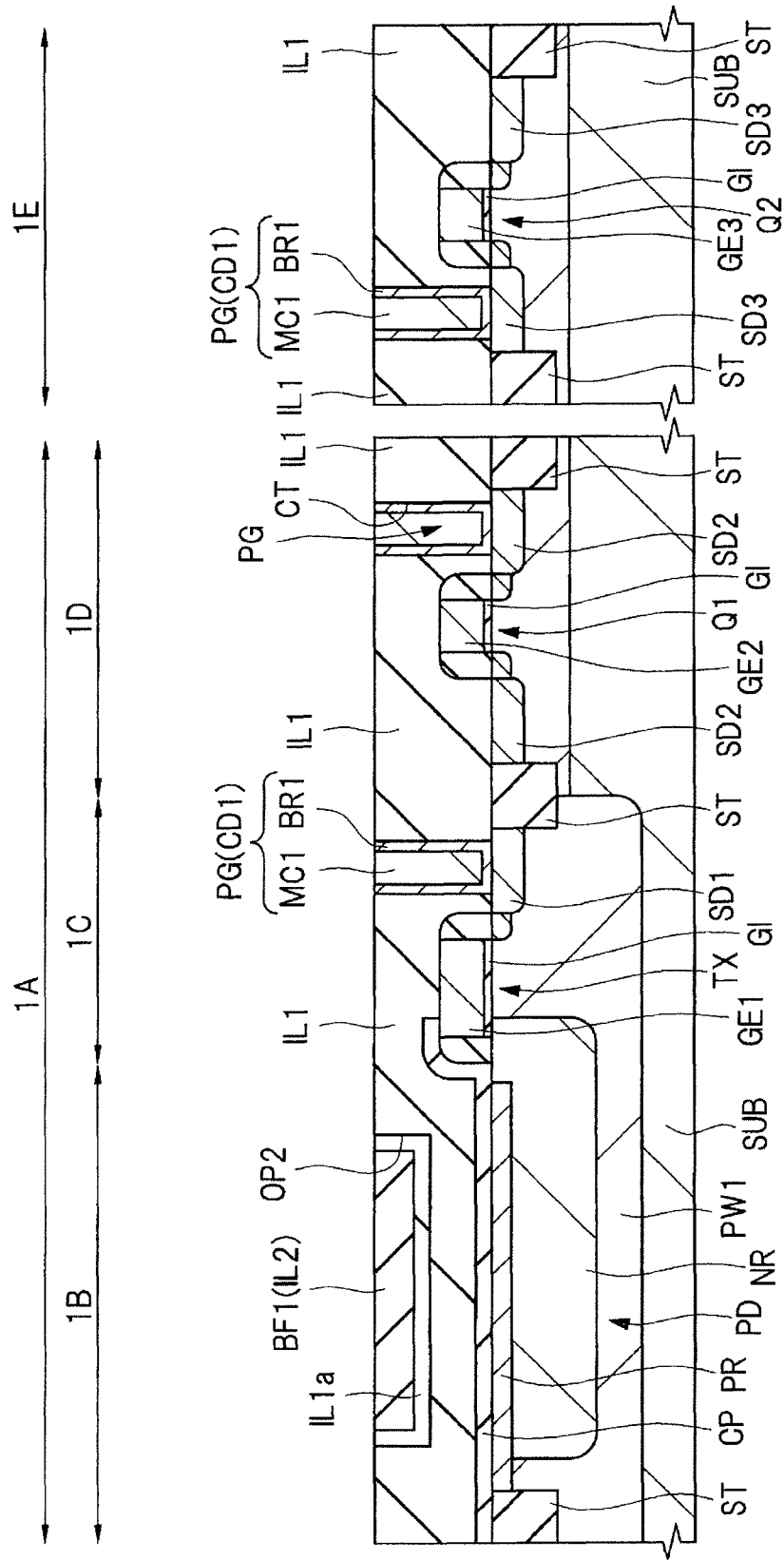
FIG. 52 is a main-portion cross-sectional view of the semiconductor device during the manufacturing process thereof, which is subsequent to FIG. 51.

After the step of forming the insulating film IL1a, the flow moves to Step S9 (step of forming the insulating film IL2) described above in which, as shown in FIG. 51, the insulating film IL2 is formed over the conductive film CD1 so as to be embedded in (to fill) the opening OP2 of the insulating film IL1 and the opening OP1b of the conductive film CD1. Thereafter, by performing the CMP step in Step S10, the structure of FIG. 52 is obtained. That is, as shown in FIG. 52, by polishing the insulating films IL2 and IL1a and the conductive film CD1 by a CMP method, the insulating films IL2 and IL1a located outside the opening OP2 and the conductive film CD1 located outside the contact holes CT are removed. By the CMP step in Step S10, the upper surface of the insulating film IL1 is exposed, and the conductive film CD1 is embedded in the contact holes CT of the insulating film IL1 to remain therein and serve as the plugs PG, while the other portions of the conductive film CD1 and the insulating films IL2 and IL1a are removed.

The embedded insulating film BF1 is formed of the insulating film IL2 remaining in the opening OP2. However, in the case where the step of forming the insulating film IL1a has been performed, the embedded insulating film BF1 is in a state where it is embedded in the opening OP2 of the insulating film IL1 via the insulating film IL1a. Since the insulating film IL1a is formed of the same insulating film material as that of the insulating film IL1, the insulating film IL1a can function as a part of the insulating film IL1. Thereafter, the process including and subsequent to Step S11 described above may be performed appropriately as described above.

According to such a modification, after the opening OP2 is formed in Step S8, the step of measuring the thickness T1 of the insulating film IL1 remaining under the bottom surface of the opening OP2 is performed and, when it is determined as a result of the measurement that the thickness T1 is excessively small, the step of forming the insulating film IL1a is added to the process to compensate for the thickness of the insulating film IL1 at the bottom portion of the opening OP2 with the insulating film IL1a, and then the flow moves next to Step S10. As a result, it is possible to properly inhibit or prevent the thickness of the interlayer insulating film remaining under the bottom surface of the opening OP2 from varying (fluctuating). In addition, it is also possible to properly inhibit or prevent the thickness of the interlayer insulating film remaining under the bottom surface of the opening OP2 from varying (fluctuating) from one semiconductor wafer to another.

In another modification, when the thickness T1 is determined to be excessively large as the result of measuring the thickness T1, after measuring the thickness T1 and prior to performing Step S9 (step of forming the insulating film IL2), the step of further etching the insulating film IL1 at the bottom portion of the opening OP2 to reduce the thickness T1 of the insulating film IL1 remaining under the bottom surface of the opening OP2 can also be added to the process.

In the present embodiment, the description has been given of the case where the semiconductor device is applied to the CMOS image sensor as the solid-state image sensing device. However, the semiconductor device can also be applied to another semiconductor device having a light receiving element such as, e.g., a CCD image sensor. The same shall apply in regard to Embodiment 2 shown below.

Embodiment 2

Embodiment 2 corresponds to the case where further modifications and improvements are made with regard to the CMP steps in Steps S10, S18, and S26 described above in Embodiment 1 described above.

FIGS. 53 to 56 are illustrative views of the CMP step in Step S18 described above in Embodiment 1 described above. Note that FIGS. 53 and to 56 show main-portion cross-sectional views of regions corresponding to the photodiode formation region 1B and the transfer transistor formation region 1C each described above.

In Step S18, as described above, by polishing the insulating film IL4 and the conductive film CD2 by the CMP method, the insulating film IL4 located outside the opening OP4 and the conductive film CD2 located outside the wire trench WT1 are removed. In the CMP step, only the insulating film IL4 is polished till the conductive film CD2 (the upper surface thereof) is exposed and, after the conductive film CD2 (the upper surface thereof) is exposed, both of the conductive film CD2 and the insulating film IL4 are polished.

Figure 53:
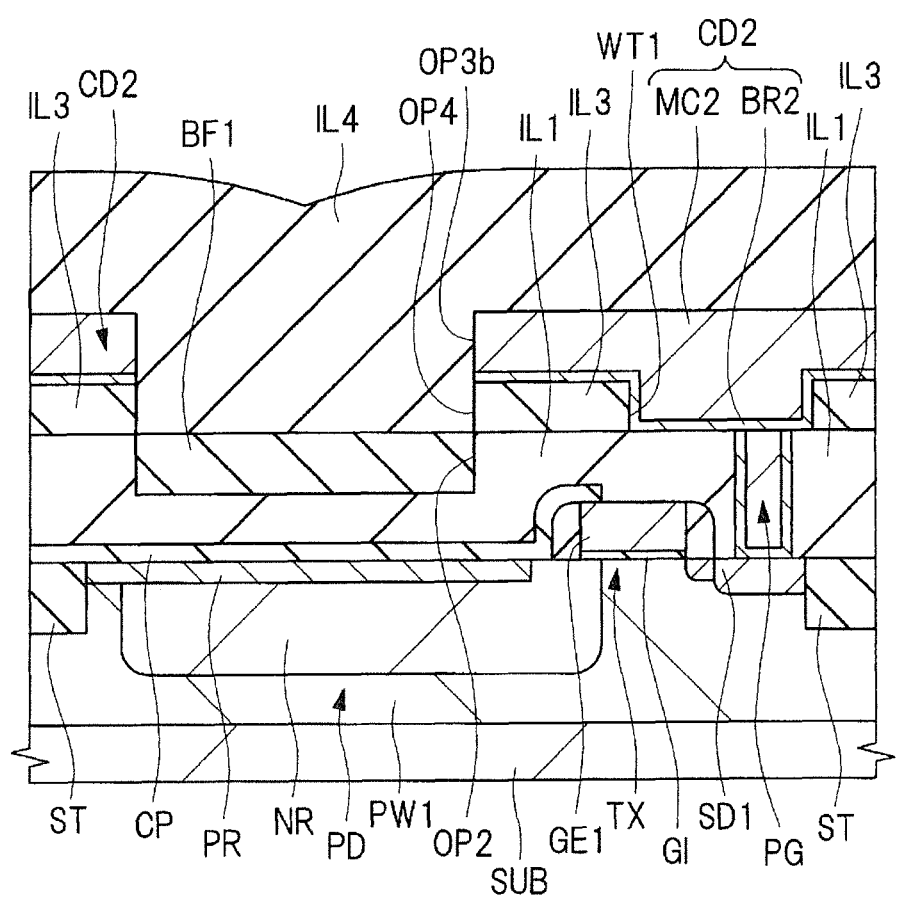
FIG. 53 is an illustrative view of a CMP step.
Figure 54:
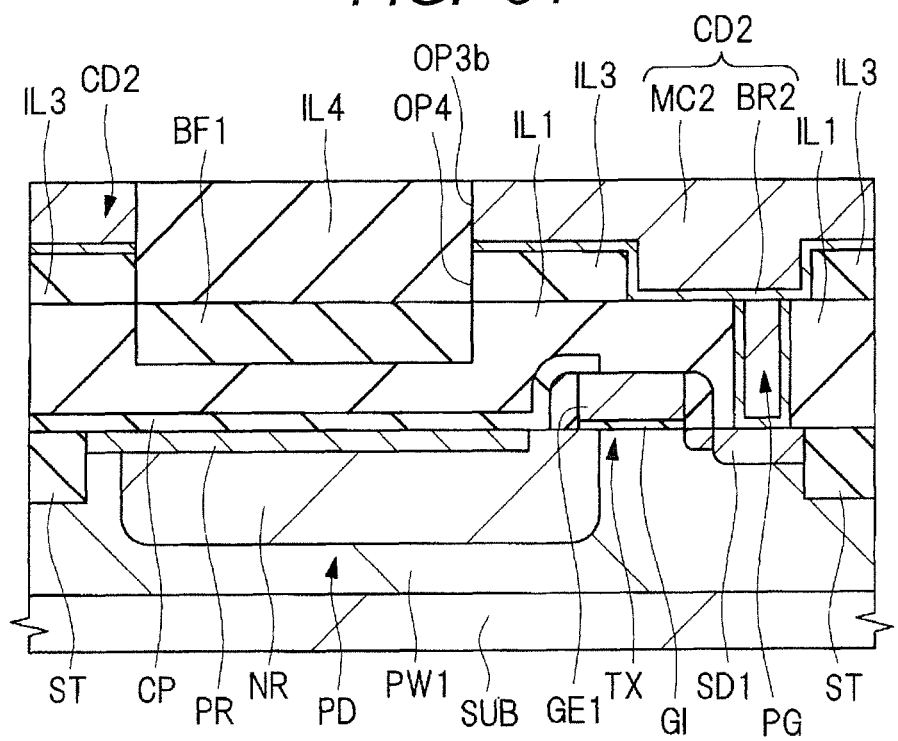
FIG. 54 is an illustrative view of the CMP step.
Figure 55:
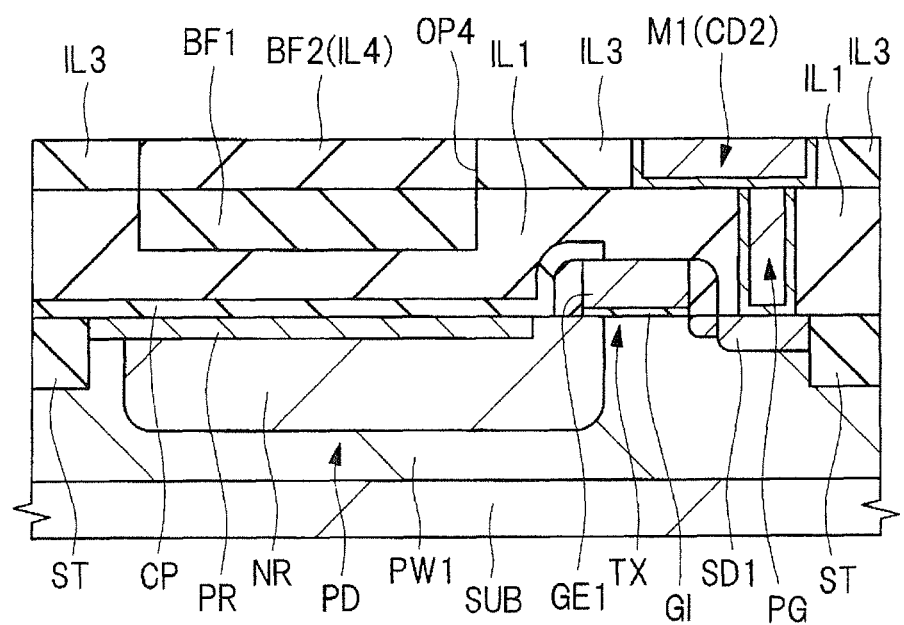
FIG. 55 is an illustrative view of the CMP step.

That is, prior to the CMP step in Step S18, in Step S17, the insulating film IL4 is formed over the conductive film CD2 so as to be embedded in (to fill) the opening OP4 of the insulating film IL3 and the opening OP3b of the conductive film CD2, as shown in FIG. 53. FIG. 53 corresponds to the stage shown in FIG. 26 described above. Then, the CMP step in Step S18 is performed. In the CMP step, first, as shown in FIG. 54, the insulating film IL4 is polished (subjected to CMP treatment) till the conductive film CD2 (the upper surface thereof) is exposed. After the conductive film CD2 (the upper surface thereof) is exposed, as shown in FIG. 55, the conductive film CD2 and the insulating film IL4 are further polished (subjected to CMP treatment) till the insulating film IL3 (the upper surface thereof) is exposed. By the two-stage CMP treatment, it is possible to remove the insulating film IL4 located outside the opening OP4 and the conductive film CD2 located outside the wire trench WT1, leave the conductive film CD2 in the wire trench WT1 of the insulating film IL3 to form the wire M1, and leave the insulating film IL4 in the opening OP4 of the insulating film IL3 to form the embedded insulating film BF2. FIG. 55 corresponds to the stage shown in FIG. 27 described above.

However, it is not easy to select a slurry (polishing solution for CMP) proper for each of the CMP treatment of the conductive film CD2 and the CMP treatment of the insulating film IL4. Therefore, it is considered to change a slurry (polishing solution for CMP) halfway in the CMP treatment in Step S18.

That is, since only the insulating film IL4 may be polished appropriately till the conductive film CD2 (the upper surface thereof) is exposed (till the structure of FIG. 53 shifts to the structure of FIG. 54), the CMP treatment is performed using a slurry (polishing solution for CMP) proper for the insulating film IL4. Then, after the conductive film CD2 (the upper surface thereof) is exposed (after the structure of FIG. 54 is obtained), both of the conductive film CD2 and the insulating film IL4 are polished. However, since the conductive film CD2 has an area larger than that of the insulating film (IL4) (the amount of polishing is accordingly larger), the CMP treatment is performed using a slurry (polishing solution for CMP) proper for the conductive film CD2. In other words, in the process shown in FIGS. 53 and 54, the CMP treatment is performed using the slurry proper for the insulating film IL4 and, in the process shown in FIGS. 54 to 55, the CMP treatment is performed using the slurry proper for the conductive film CD2. When the residues of the conductive film CD2 are left over the insulating film IL3 after polishing, the residues having conductivity may cause a short circuit or leakage. From the viewpoint also, at the stage at which the conductive film CD2 is polished in the CMP step in Step S18, the slurry proper for the conductive film CD2 is preferably used.

Figure 56:
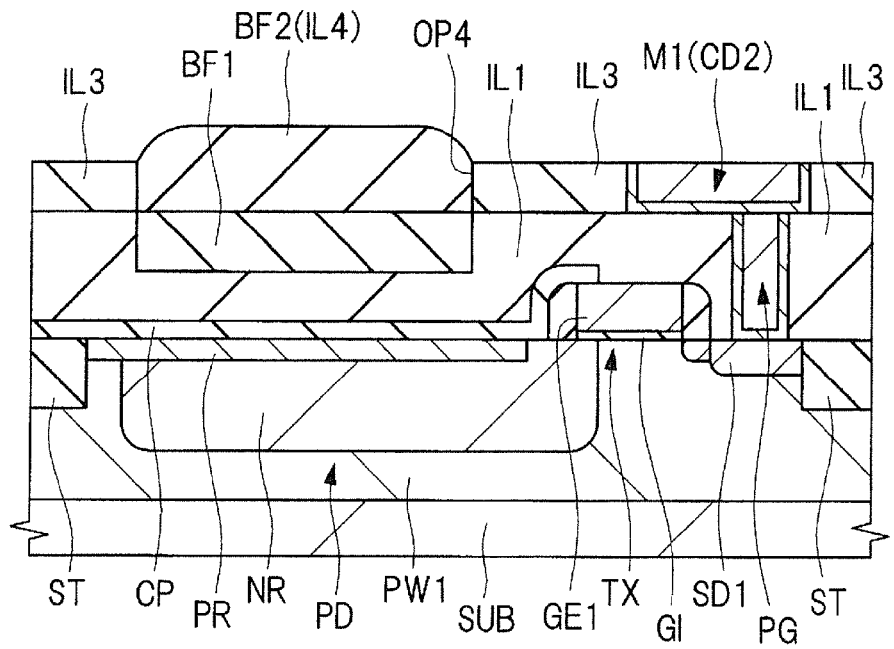
FIG. 56 is an illustrative view of the CMP step.

However, when the different slurries are thus selectively used, at the stage at which the CMP treatment in Step S18 is ended, as shown in FIG. 56, the upper surface of the embedded insulating film BF2 protrudes from the upper surface of the insulating film IL3 and the upper surface of the wire M1 into a projecting shape. At this time, the upper surface of the embedded insulating film BF2 is in a state opposite to dishing in which the middle side of the upper surface of the insulating film BF2 is higher in level than (protruding from) the outer peripheral side thereof.

This is because, when the CMP treatment is performed using the slurry (polishing solution for CMP) proper for the conductive film CD2 after the conductive film CD2 (the upper surface thereof) is exposed (after the structure of FIG. 54 is obtained), the speed of polishing the insulating film IL4 is lower (slower) than the speed of polishing the conductive film CD2 and, even at the stage at which the conductive film CD is polished and the insulating film IL3 is exposed, the polishing of the insulating film IL4 has not remarkably advanced.

As shown in FIG. 56, when the upper surface of the embedded insulating film BF2 has protruded from the upper surface of the insulating film IL3 and the upper surface of the wire M1 into the projecting shape, the subsequent manufacturing process is less easily performed. Therefore, it is desirable to minimize such protrusion of the embedded insulating film BF2.

For example, when the upper surface of the embedded insulating film BF2 has protruded into the projecting shape, projections and depressions reflecting the protrusion of the embedded insulating film BF2 are also formed in the insulating film IL5 formed thereover. As a result, the wire M2, the embedded insulating film BF3, and the like are less easily formed.

Accordingly, in Embodiment 2, a description will be given of several methods (first to third methods) which can suppress a phenomenon as shown in FIG. 56 in which the upper surface of the embedded insulating film BF2 protrudes into a projecting shape.

First Method

Figure 57:
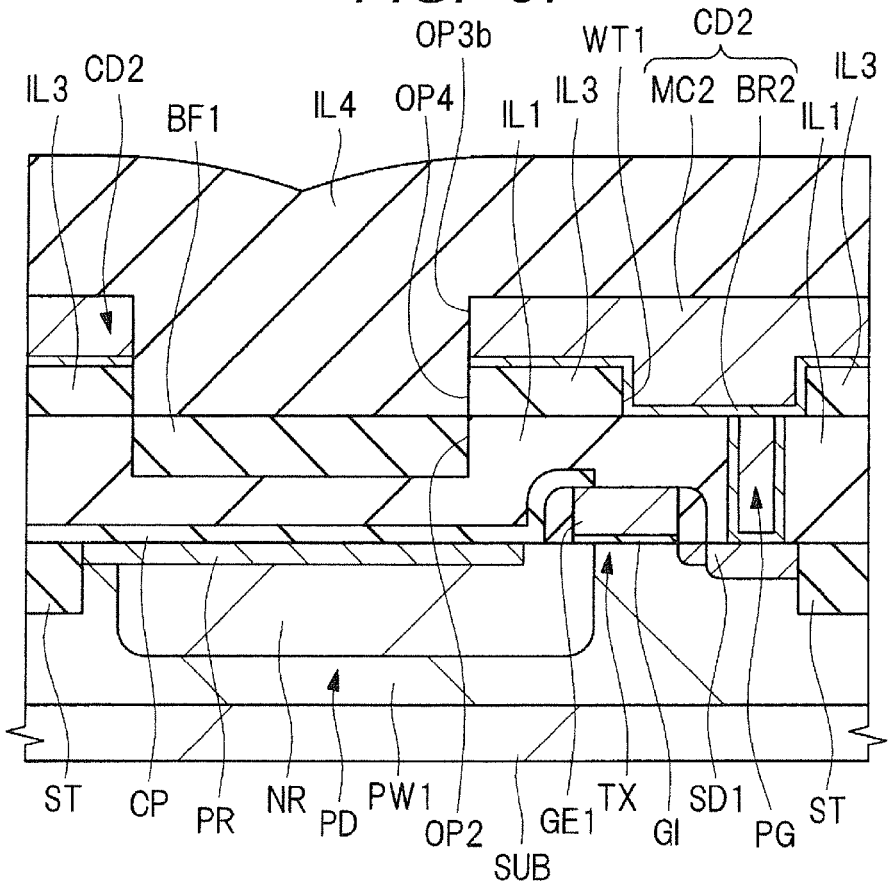
FIG. 57 is an illustrative view of a first method.
Figure 58:
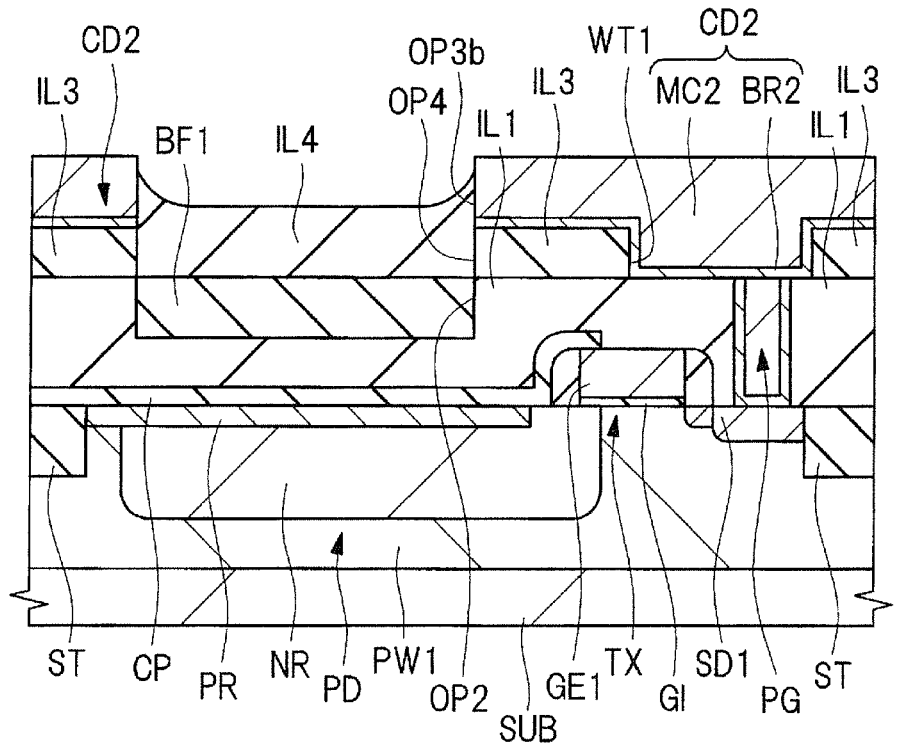
FIG. 58 is an illustrative view of the first method.
Figure 59:
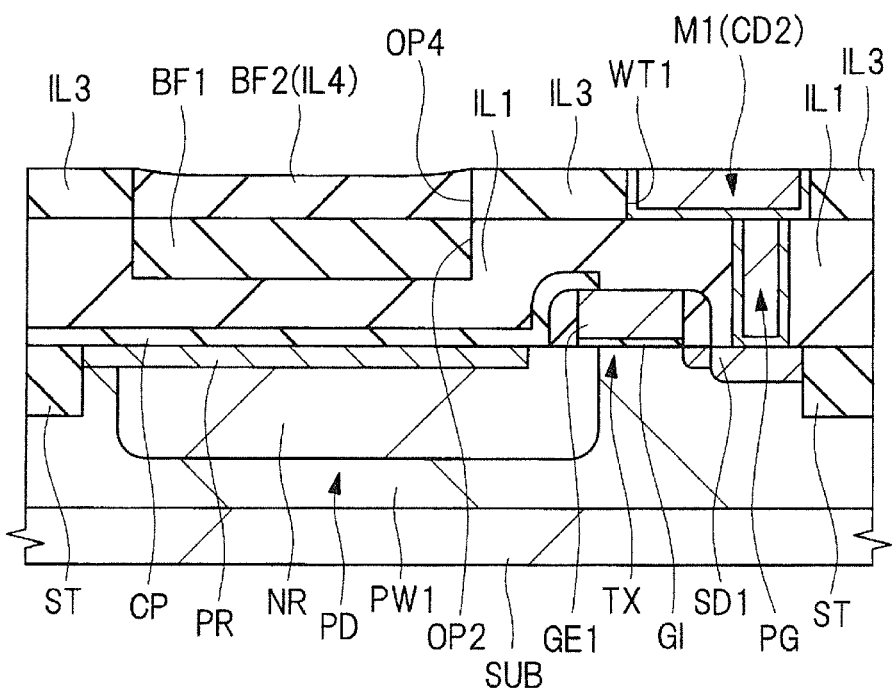
FIG. 59 is an illustrative view of the first method.

First, a description will be given of the first method with reference to FIGS. 57 to 59. FIGS. 57 to 59 are illustrative views of the first method. Similarly to FIGS. 53 to 56 described above, FIGS. 57 to 59 also show main-portion cross-sectional views of the regions corresponding to the photodiode formation region 1B and the transfer transistor formation region 1C each described above.

First, prior to the CMP step in Step S18, in Step S17, the insulating film IL4 is formed over the conductive film CD2 so as to be embedded in (to fill) the opening OP4 of the insulating film IL3 and the opening OP3b of the conductive film CD2, as shown in FIG. 57. FIG. 57 corresponds to the stage shown in FIG. 26 described above.

In the first method, in the CMP step in Step S18, CMP treatment is performed first as first CMP treatment using the slurry (polishing solution for CMP) proper for the insulating film IL4. In the first CMP treatment, the slurry proper for the insulating film IL4 is used so that the speed of polishing the insulating IL4 is higher than the speed of polishing the main conductor film MC2. In particular, the speed of polishing the insulating film IL4 is higher than the speed of polishing the main conductor film MC2 of the conductive film CD2. Accordingly, the time required for the first CMP treatment can be reduced. FIG. 58 shows the stage at which the first CMP treatment is ended. The first CMP treatment is performed till the conductive film CD2 (the upper surface thereof) is exposed. However, in the case of the first method, even after the conductive film CD2 (the upper surface thereof) is exposed, the first CMP treatment is continued to cause dishing in the insulating film IL4 in the openings OP3b and OP4. That is, in the first CMP treatment, the insulating film IL4 is polished till the conductive film CD2 (the upper surface thereof) is exposed and dishing occurs in the insulating film IL4 in the openings OP3b and OP4. In other words, in the first CMP treatment, by excessively polishing the insulating film IL4 even after the conductive film CD2 is exposed, dishing is intentionally caused in the insulating film IL4 in the openings OP3b and OP4.

The degree of dishing can be controlled by determining the composition of the slurry used in the first CMP treatment, to which degree the first CMP treatment is excessively performed (to which degree the first CMP treatment is continued after the conductive film CD2 is exposed), or the like.

Here, the occurrence of dishing in the insulating film IL4 in the openings OP3b and OP4 corresponds to the occurrence of a dish-shaped depressed portion (recessed portion) in the upper surface of the insulating film IL4 in the openings OP3b and OP4. That is, a state is reached where the middle portion of the upper surface of the insulating film IL4 in the openings OP3b and OP4 is recessed from (lower in level than) the outer peripheral portion thereof.

After the first CMP treatment, the slurry for polishing is changed to the slurry (polishing solution for CMP) proper for the conductive film CD2 and then second CMP treatment in the CMP step in Step S18 is performed. In the second CMP treatment, the slurry proper for the conductive film CD2 is used so that the speed of polishing the conductive film CD2 is higher than the speed of polishing the insulating film IL4. In particular, the speed of polishing the main conductor film MC2 of the conductive film CD2 is higher than the speed of polishing the insulating film IL4. Accordingly, the time required for the second CMP treatment can be reduced. FIG. 59 shows the stage at which the second CMP treatment is ended (i.e., the stage at which the CMP step in Step S18 is ended). The second CMP treatment is performed till the insulating film IL3 (the upper surface thereof) is exposed. At the stage at which the first CMP treatment is ended, the conductive film CD2 remains in the form of a layer over the insulating film IL3 located outside the wire trench WT1. However, by performing the second CMP treatment, it is possible to remove the conductive film CD2 from over the insulating film IL3 located outside the wire trench WT1 and form the wire M1 by leaving the conductive film CD2 in the wire trench WT1. Then, after the second CMP treatment, of the insulating film IL4 remaining in the opening OP4, the embedded insulating film BF2 is formed. The subsequent process is as described above in Embodiment 1.

In the second CMP treatment, the insulating film IL4 is less likely to be polished than the conductive film CD2 to result in concern about the protrusion of the upper surface of the embedded insulating film BF2 into a projecting shape, as shown in FIG. 56 described above. However, in the first method, at the stage at which the second CMP treatment is started, dishing is caused in the insulating film IL4 in the openings OP3b and OP4. Accordingly, it is possible to inhibit or prevent the protrusion of the upper surface of the embedded insulating film BF2 into a projecting shape after the second CMP treatment to a degree corresponding to the caused dishing. That is, by intentionally causing dishing in the insulating film IL4 through the first CMP treatment and offsetting the protrusion of the upper surface of the embedded insulating film BF2 into a projecting shape with the dishing, the upper surface of the embedded insulating film BF2 can be inhibited or prevented from protruding into a projecting shape. As a result, the subsequent manufacturing process is easily performed to allow an improvement in the manufacturing yield of the semiconductor device.

In a modification of the first method, the second CMP treatment can also be divided into the CMP treatment of the main conductor film MC2 of the conductive film CD2 and the subsequent CMP treatment of the barrier conductor film BR2. In that case, for the CMP treatment of the main conductor film MC2 and the CMP treatment of the barrier conductor film BR2, different slurries for polishing can also be used.

Second Method

Next, a description will be given of a second method with reference to FIGS. 60 to 65. FIGS. 60 to 65 are illustrative views of the second method. Similarly to FIGS. 53 to 59 described above, FIGS. 60 to 65 also show the main-portion cross-sectional views of the regions corresponding to the photodiode formation region 1B and the transfer transistor formation region 1C each described above.

Figure 60:
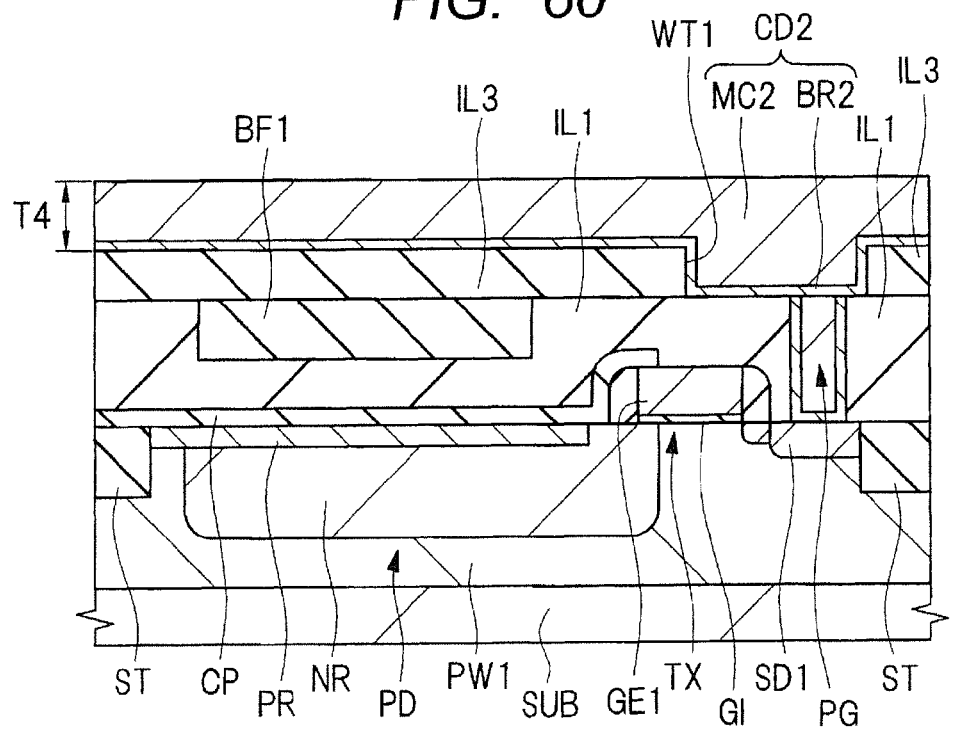
FIG. 60 is an illustrative view of a second method.

FIG. 60 corresponds to the stage shown in FIG. 22 described above. First, by performing the process up to Step S13 (step of forming the conductive film CD2) described above, the structure of FIG. 60 corresponding to FIG. 22 described above is obtained.

Figure 61:
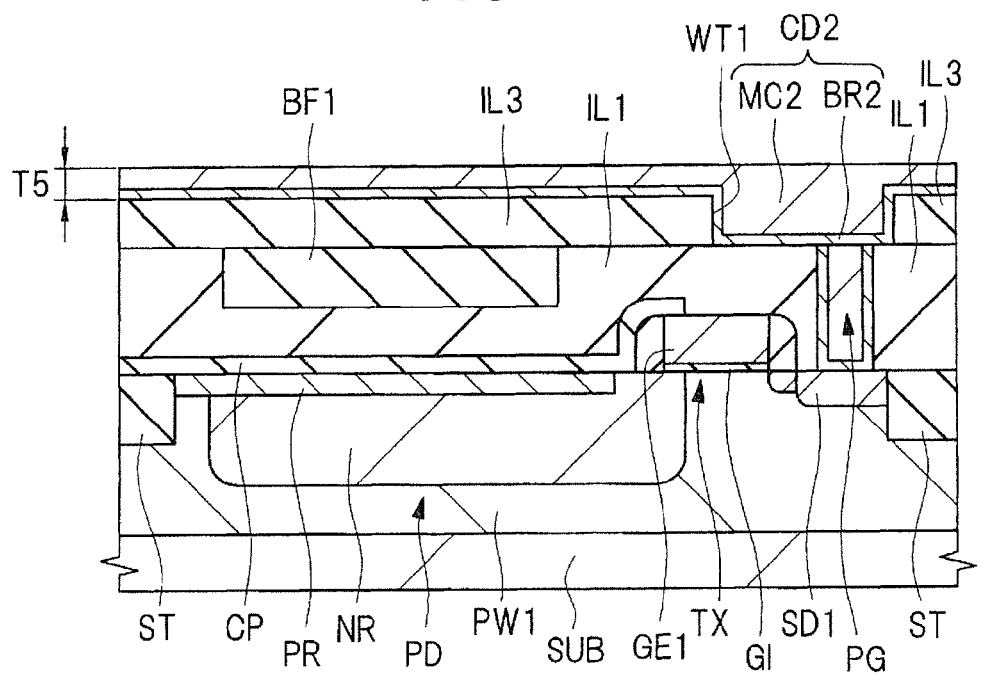
FIG. 61 is an illustrative view of the second method.

Then, in the second method, as shown in FIG. 61, the step of reducing the thickness of the conductive film CD2 is performed. That is, after Step S13 (step of forming the conductive film CD2) described above and prior to Step S14 (step of forming the photoresist pattern PR2) described above, the step of reducing the thickness of the conductive film CD2 is added to the process. Specifically, by polishing the main conductor film MC2 of the conductive film CD2 by a CMP method, the thickness of the conductive film CD2 over the insulating film IL3 located outside the wire trench WT1 is reduced. As shown in FIG. 60, at the stage at which the conductive film CD2 is formed in Step S13, the conductive film CD2 has had a thickness T4. By subsequently polishing the main conductor film MC2 of the conductive film CD2 by a CMP method, the conductive film CD2 has a thickness T5 smaller than the thickness T4 (T5<T4). Here, each of the thicknesses T4 and T5 is the thickness of the conductive film CD2 over the insulating film IL3 located outside the wire trench WT1.

Figure 62:
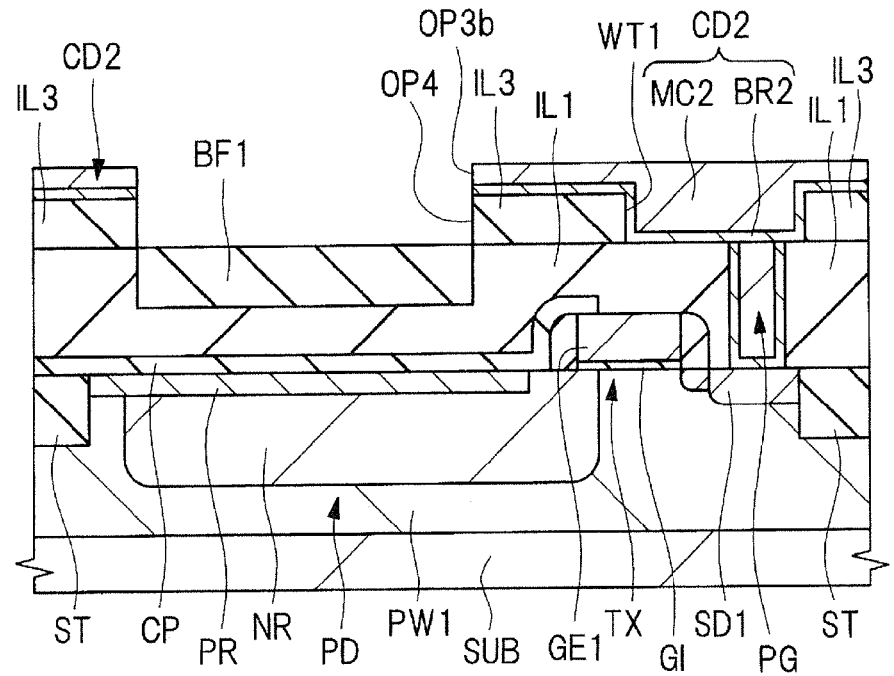
FIG. 62 is an illustrative view of the second method.
Figure 63:
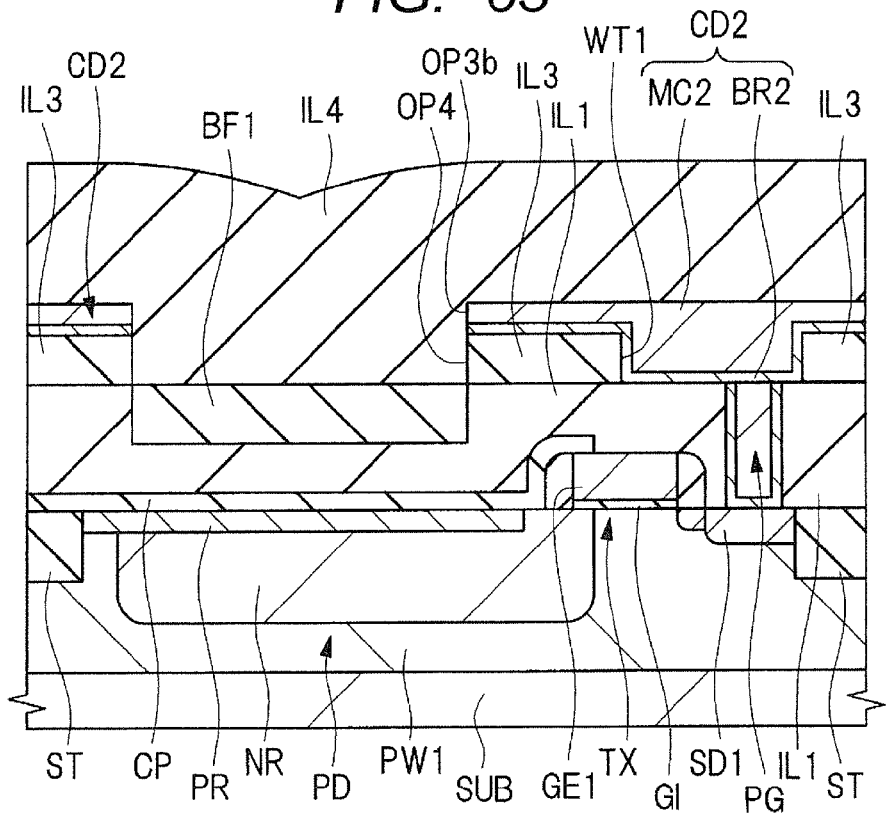
FIG. 63 is an illustrative view of the second method.

Then, by performing Step S14 (step of forming the photoresist pattern RP2) described above, Step S15 (step of etching the conductive film CD2) described above, and Step S16 (step of etching the insulating film IL3) described above in the same manner as in Embodiment 1 described above, the opening OP3b is formed in the conductive film CD2 and the opening OP4 is formed in the insulating film IL3, as shown in FIG. 62. Then, by performing Step S17 (step of forming the insulating film IL4) described above in the same manner as in Embodiment 1 described above, the insulating film IL4 is formed over the conductive film CD2 so as to fill the opening OP4 of the insulating film IL3 and the opening OP3b of the conductive film CD2, as shown in FIG. 63.

Then, the CMP step in Step S18 is performed.

Figure 64:
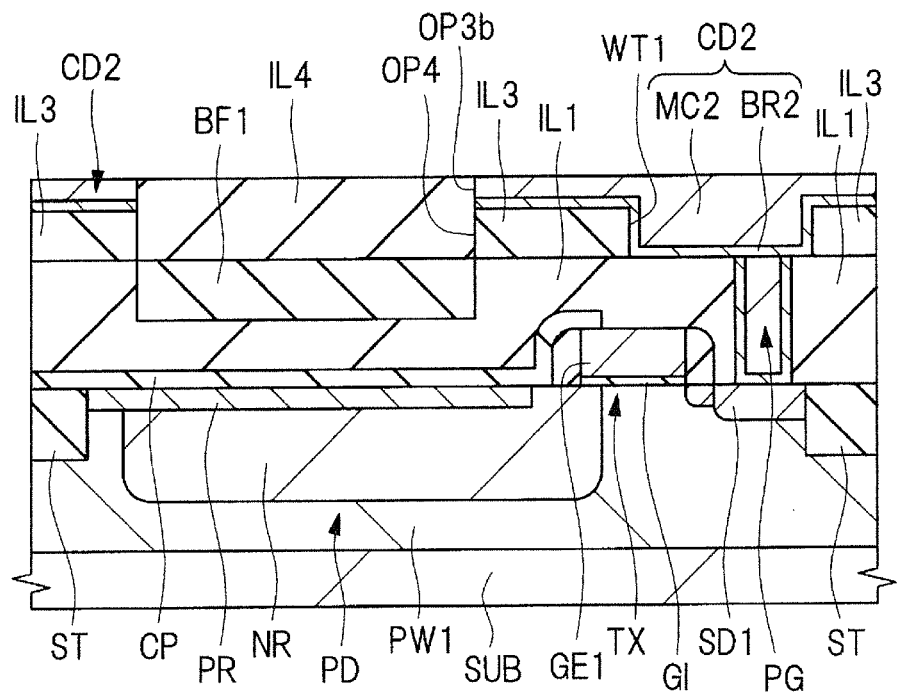
FIG. 64 is an illustrative view of the second method.

In the CMP step in Step S18, first, as the first CMP treatment, CMP treatment is performed using the slurry (polishing solution for CMP) proper for the insulating film IL4. In the first CMP treatment, the slurry proper for the insulating film IL4 is used so that the speed of polishing the insulating film IL4 is higher than the speed of polishing the conductive film CD2. In particular, the speed of polishing the insulating film IL4 is higher than the speed of polishing the main conductor film MC2 of the conductive film CD2. Accordingly, the time required for the first CMP treatment can be reduced. FIG. 64 shows the stage at which the first CMP treatment is ended. The first CMP treatment is performed till the conductive film CD2 (the upper surface thereof) is exposed.

Figure 65:
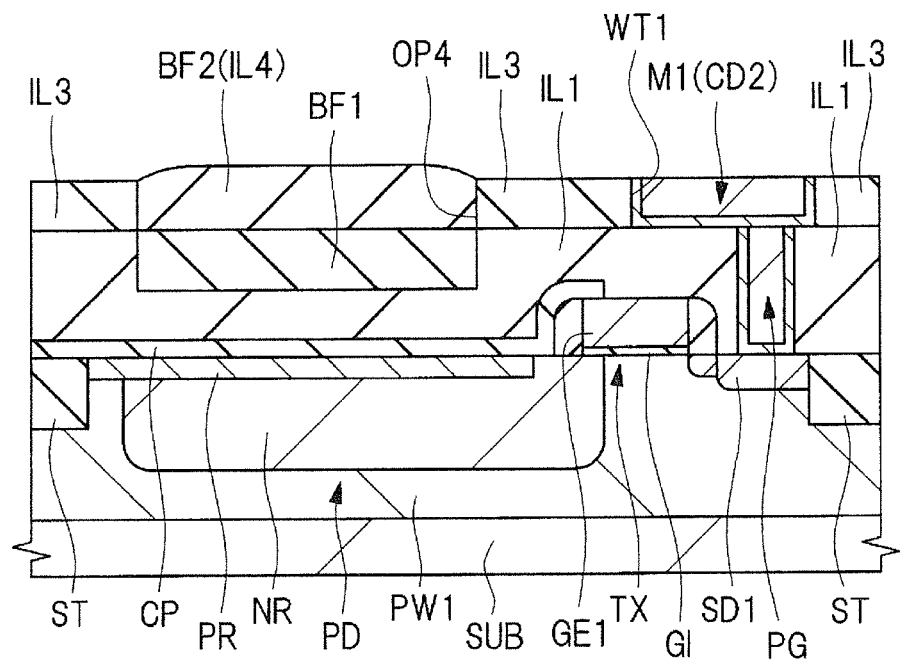
FIG. 65 is an illustrative view of the second method.

After the first CMP treatment, the slurry for polishing is changed to the slurry (polishing solution for CMP) proper for the conductive film CD2 and then second CMP treatment in the CMP step in Step S18 is performed. In the second CMP treatment, the slurry proper for the conductive film CD2 is used so that the speed of polishing the conductive film CD2 is higher than the speed of polishing the insulating film IL4. In particular, the speed of polishing the main conductor film MC2 of the conductive film CD2 is higher than the speed of polishing the insulating film IL4. Accordingly, the time required for the second CMP treatment can be reduced. FIG. 65 shows the stage at which the second CMP treatment is ended (i.e., the stage at which the CMP step in Step S18 is ended). The second CMP treatment is performed till the insulating film IL3 (the upper surface thereof) is exposed. At the stage at which the first CMP treatment is ended, the conductive film CD2 remains in the form of a layer over the insulating film IL3 located outside the wire trench WT1. However, by performing the second CMP treatment, it is possible to remove the conductive film CD2 from over the insulating film IL3 located outside the wire trench WT1 and form the wire M1 by leaving the conductive film CD2 in the wire trench WT1. Then, after the second CMP treatment, of the insulating film IL4 remaining in the opening OP4, the embedded insulating film BF2 is formed. The subsequent process is as described above in Embodiment 1.

In the second CMP treatment, the insulating film IL4 is less likely to be polished than the conductive film CD2 to result in concern about the protrusion of the upper surface of the embedded insulating film BF2 into a projecting shape, as shown in FIG. 56 described above. However, in the second method, after the conductive film CD2 is formed so as to fill the wire trench WT1 in Step S13, the step of reducing the thickness of the conductive film CD2 is performed. As a result, at the stage at which the CMP treatment in Step S18 is started, the thickness of the conductive film CD2 over the insulating film IL3 has been already reduced (the thickness T5 smaller than the thickness T4 has been achieved). Accordingly, the amount of polishing of the conductive film CD2 (thickness of the polished conductive film CD2) in the second CMP treatment can be reduced (decreased). That is, in the case where the step of thinning the conductive film CD2 is not performed after the formation of the conductive film CD2, the conductive film CD2 needs to be polished by the thickness T4 in the second CMP treatment. However, in the case where the step of thinning the conductive film CD2 is performed after the formation of the conductive film CD2, the conductive film CD2 may be polished appropriately by the thickness T5 smaller than the thickness T4 in the second CMP treatment.

A phenomenon in which the upper surface of the embedded insulating film BF2 protrudes into a projecting shape as shown in FIG. 56 described above occurs due to the fact that the insulating film IL4 is less likely to be polished than the conductive film CD2. The phenomenon occurs more prominently as the amount of polishing of the conductive film CD2 (thickness of the polished conductive film CD2) is larger (increases) in the second CMP treatment in which the insulating film IL4 is less likely to be polished than the conductive film CD2. In the second method, since the step of thinning the conductive film CD2 is performed after the formation of the conductive film CD2, the amount of polishing of the conductive film CD2 (thickness of the polished conductive film CD2) can be reduced (decreased). Accordingly, it is possible to inhibit or prevent the protrusion of the upper surface of the embedded insulating film BF2 into a projecting shape after the second CMP treatment to a degree corresponding to the thinned conductive film CD2.

That is, in Step S13, the conductive film CD2 having the thickness T4 which allows the wire trench WT1 to be reliably filled is formed. Then, by polishing the main conductor film MC2 of the conductive film CD2 by a CMP method, the thickness of the conductive film CD2 is reduced to reduce (decrease) the amount of polishing of the conductive film CD2 (thickness of the conductive film CD2) in the CMP step in Step S18. This can inhibit or prevent the upper surface of the embedded insulating film BF2 from protruding into a projecting shape. Therefore, the subsequent manufacturing step is easily performed to allow an improvement in the manufacturing yield of the semiconductor device.

In a modification of the second method, the second CMP treatment can also be divided into the CMP treatment of the main conductor film MC2 of the conductive film CD2 and the subsequent CMP treatment of the barrier conductor film BR2. In that case, for the CMP treatment of the main conductor film MC2 and the CMP treatment of the barrier conductor film BR2, different slurries for polishing can also be used.

Third Method

Next, a description will be given of a third method with reference to FIGS. 66 to 71. FIGS. 66 to 71 are illustrative views of the third method. Similarly to FIGS. 53 to 65 described above, FIGS. 66 to 71 also show the main-portion cross-sectional views of the regions corresponding to the photodiode formation region 1B and the transfer transistor formation region 1C each described above.

Figure 66:
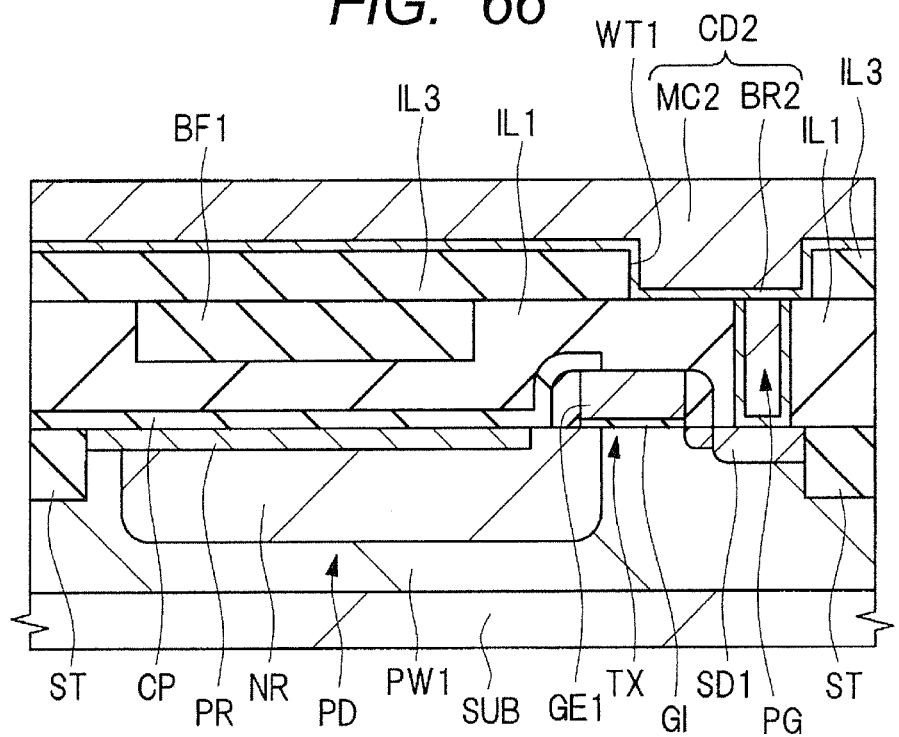
FIG. 66 is an illustrative view of a third method.

FIG. 66 corresponds to the stage shown in FIG. 22 described above. First, by performing the process up to Step S13 (step of forming the conductive film CD2) described above, the structure of FIG. 66 corresponding to FIG. 22 described above is obtained.

Figure 67:
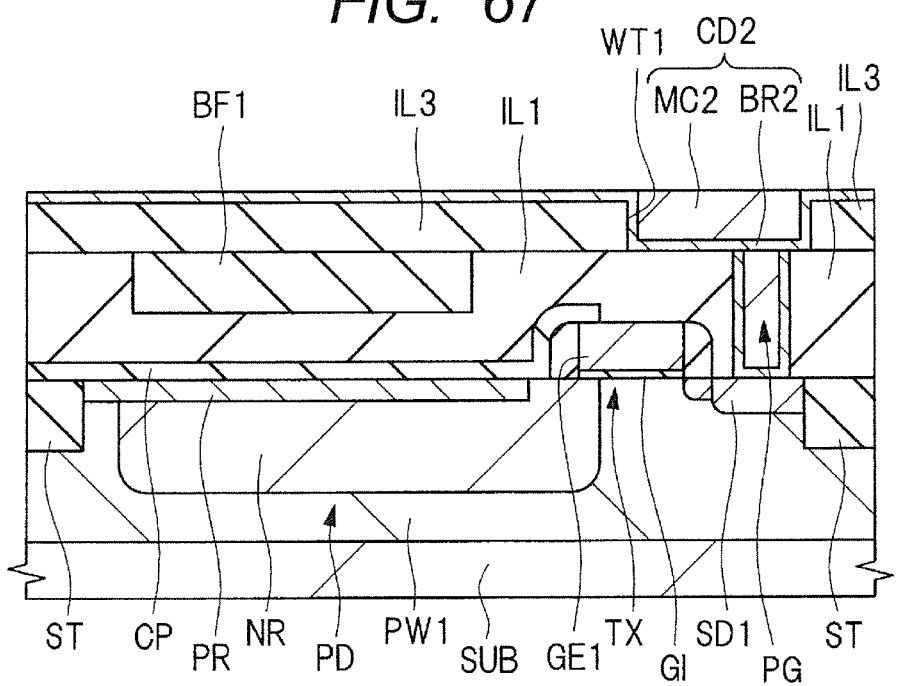
FIG. 67 is an illustrative view of the third method.
Figure 68:
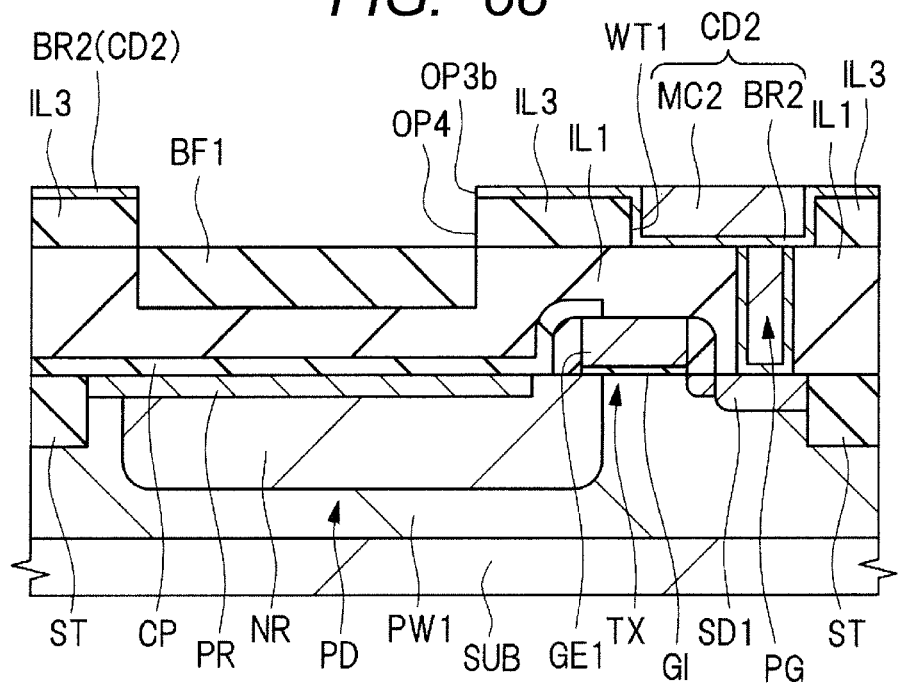
FIG. 68 is an illustrative view of the third method.

Then, in the third method, as shown in FIG. 67, the step of reducing the thickness of the conductive film CD2 is performed. That is, after Step S13 (step of forming the conductive film CD2) described above and prior to Step S14 (step of forming the photoresist pattern PR2) described above, the step of reducing the thickness of the conductive film CD2 is added to the process. However, with regard to the step of reducing the thickness of the conductive film CD2, the third method is partly different from the foregoing second method.

That is, in the case of the foregoing second method, in the step of reducing the thickness of the conductive film CD2, the main conductor film MC2 of the conductive film CD2 is polished by a CMP method to reduce the thickness of the conductive film CD2. As a result, in the case of the second method, even when the step of reducing the thickness of the conductive film CD2 is performed, not only the barrier conductor film BR2, but also the main conductor film MC2 remains in the form of a layer over the insulating film IL3 located outside the wire trench Wt1, as shown in FIG. 61 described above (i.e., the main conductor film MC2 remains in the form of a layer over the barrier conductor film BR2). In other words, in the step of reducing the thickness of the conductive film CD2 in the case of the second method, the polishing of the main conductor film MC2 of the conductive film CD2 is ended before the barrier conductor film BR2 is exposed. Therefore, in the case of the second method, when the step of reducing the thickness of the conductive film CD2 is performed, the main conductor film MC2 of the conductive film CD2 is polished by CMP treatment to be thinned over the insulating film IL3 located outside the wire trench WT1, but the main conductor film MC2 is not entirely removed throughout the thickness thereof so that the barrier conductor film BR2 (the upper surface thereof) is not exposed.

By contract, in the case of the third method, in the step of reducing the thickness of the conductive film CD2, the main conductor film MC2 of the conductive film CD2 is polished by a CMP method to expose the barrier conductor film BR2, as shown in FIG. 67. That is, in the step of reducing the thickness of the conductive film CD2 in the case of the third method, at the stage at which the barrier conductor film BR2 is exposed, the polishing of the conductive film CD2 is ended. At this time, it is possible to cause the barrier conductor film BR2 to function as a stopper film for the CMP treatment. That is, after the barrier film BR2 (the upper surface thereof) is exposed and before the insulating film IL3 (the upper surface thereof) is exposed, the polishing of the conductive film CD2 is ended to prevent the insulating film IL3 located outside the wire trench WT1 from being exposed.

As a result, in the case of the third method, when the step of reducing the thickness of the conductive film CD2 is performed, a state is reached where, over the insulating film IL3 located outside the wire trenches WT, only the barrier conductor film BR2 remains in the form of a layer, while the main conductor film MC2 is entirely removed throughout the thickness thereof to no longer remain, as shown in FIG. 67. In other words, a state is reached where, over the insulating film IL3 located outside the wire trench WT1, the upper surface of the barrier conductor film BR2 is exposed so that the thickness of the conductive film CD2 over the insulating film IL3 located outside the wire trench WT1 corresponds to the thickness of only the barrier conductor film BR2.

After the step of reducing the thickness of the conductive film CD2 is performed, Step S14 (step of forming the photoresist pattern RP2) described above, Step S15 (step of etching the conductive film CD2) described above, and Step S16 (step of etching the insulating film IL3) described above are performed in substantially the same manner as in Embodiment 1 described above to form the opening OP3$b$ in the conductive film CD2 and form the opening OP4 in the insulating film IL3. However, in the step of reducing the thickness of the conductive film CD2, the main conductor film MC2 of the conductive film CD2 over the insulating film IL3 located outside the wire trench WT1 has been entirely removed throughout the thickness thereof. Consequently, in Step S15 (step of etching the conductive film CD2) described above, the barrier conductor film BR2 of the conductive film CD2 is etched to be formed with the opening OP3$b$.

Figure 69:
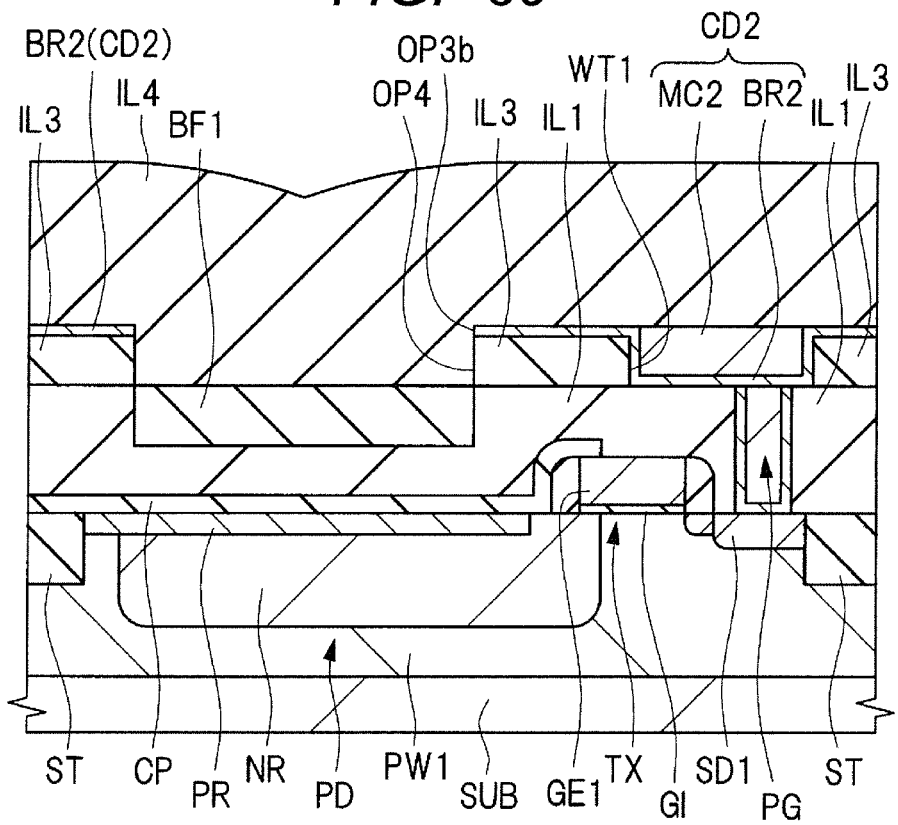
FIG. 69 is an illustrative view of the third method.

Then, Step S17 (step of forming the insulating film IL4) described above is performed in substantially the same manner as in Embodiment 1 described above to form the insulating film IL4 over the conductive film CD2 so as to fill the opening OP4 of the insulating film IL3 and the opening OP3$b$ of the conductive film CD2 therewith, as shown in FIG. 69.

Then, the CMP step in Step S18 is performed.

Figure 70:
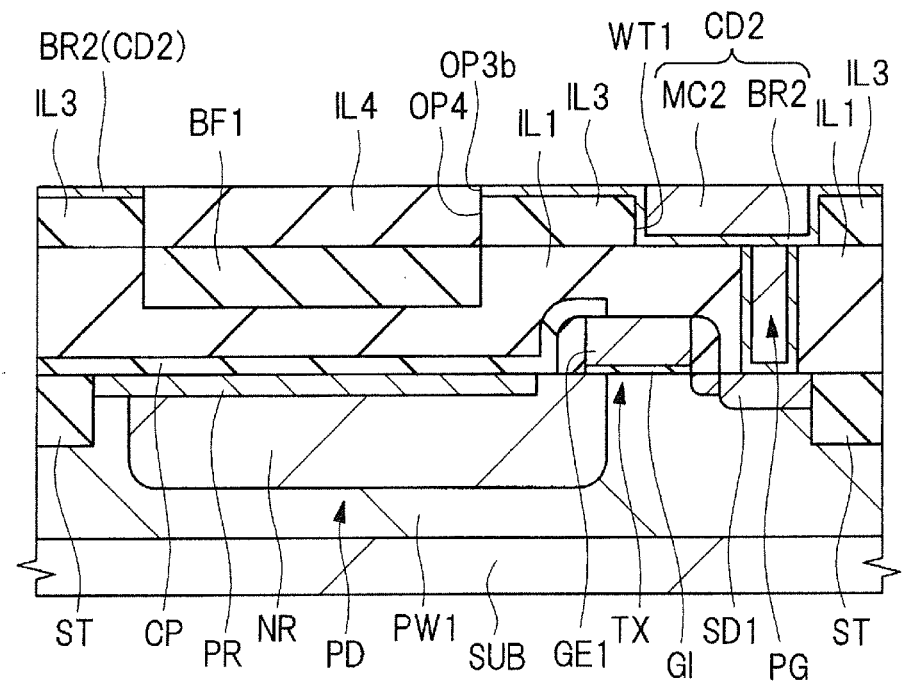
FIG. 70 is an illustrative view of the third method.

In the CMP step in Step S18, first, as the first CMP treatment, CMP treatment is performed using the slurry (polishing solution for CMP) proper for the insulating film IL4. In the first CMP treatment, the slurry proper for the insulating film IL4 is used so that the speed of polishing the insulating IL4 is higher than the speed of polishing the main conductor film MC2. In this case, the speed of polishing the insulating film IL4 is higher than the speed of polishing the main conductor film MC2 of the conductive film CD2 and the barrier conductor film BR2 thereof. Accordingly, the time required for the first CMP treatment can be reduced. FIG. 70 shows the stage at which the first CMP treatment is ended. The first CMP treatment is performed till the conductive film CD2 (the upper surface thereof) is exposed. At the stage at which the first CMP treatment is ended, as shown in FIG. 70, a state is reached where the main conductor film MC2 of the conductive film CD2 is mainly exposed in the wire trench WT1, the barrier conductor film BR2 is exposed over the insulating film IL3 located outside the wire trench WT1, and the insulating film IL4 is exposed in the openings OP3$b$ and OP4.

Figure 71:
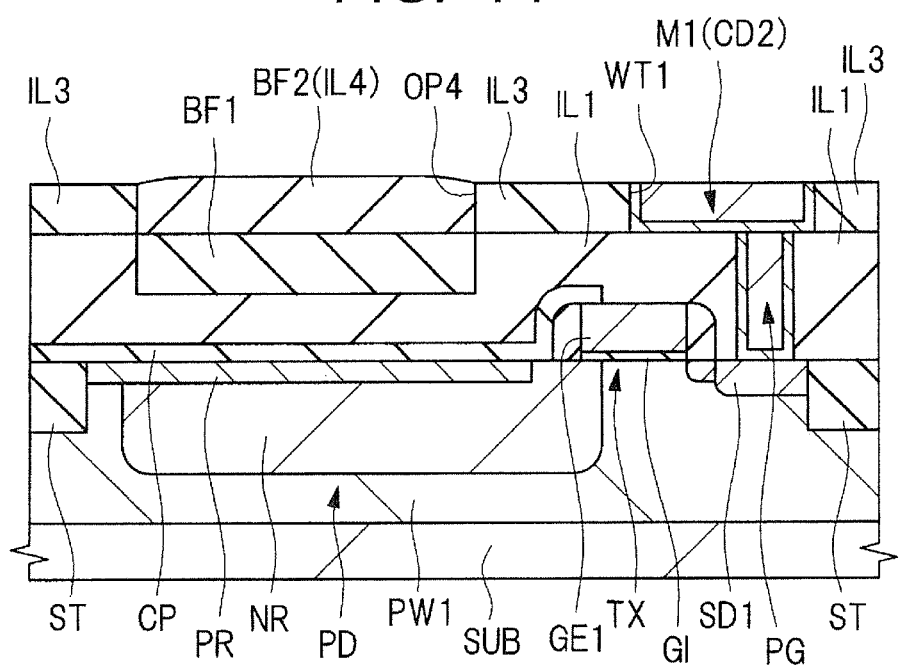
FIG. 71 is an illustrative view of the third method.

After the first CMP treatment, the slurry for polishing is changed to the slurry (polishing solution for CMP) proper for the conductive film CD2 and then second CMP treatment in the CMP step in Step S18 is performed. In the second CMP treatment, the slurry proper for the conductive film CD2 (more specifically, the slurry proper for the barrier film BR2) is used so that the speed of polishing the conductive film CD2 is higher than the speed of polishing the insulating film IL4. In particular, the speed of polishing the barrier conductor film BR2 of the conductive film CD2 is higher than the speed of polishing the insulating film IL4. Accordingly, the time required for the second CMP treatment can be reduced. FIG. 71 shows the stage at which the second CMP treatment is ended (i.e., the stage at which the CMP step in Step S18 is ended). The second CMP treatment is performed till the insulating film IL3 (the upper surface thereof) is exposed. At the stage at which the first CMP treatment is ended, the barrier conductor film BR2 of the conductive film CD2 remains in the form of a layer over the insulating film IL3 located outside the wire trench WT1. However, by performing the second CMP treatment, it is possible to remove the conductive film CD2 (the barrier conductor film BR2 thereof) from over the insulating film IL3 located outside the wire trench WT1 and form the wire M1 by leaving the conductive film CD2 in the wire trench WT1. Then, after the second CMP treatment, of the insulating film IL4 remaining in the opening OP4, the embedded insulating film BF2 is formed. The subsequent process is as described above in Embodiment 1.

In the second CMP treatment, the insulating film IL4 is less likely to be polished than the conductive film CD2 (particularly the barrier conductor film BR2) to result in concern about the protrusion of the upper surface of the embedded insulating film BF2 into a projecting shape, as shown in FIG. 56 described above. However, in the third method, after the conductive film CD2 is formed so as to fill the wire trench WT1 in Step S13, the step of reducing the thickness of the conductive film CD2 is performed. As a result, at the stage at which the CMP treatment in Step S18 is started, the thickness of the conductive film CD2 over the insulating film IL3 has been already reduced (to the thickness of the barrier conductor film BR2). Therefore, the amount of polishing of the conductive film CD2 (thickness of the polished conductive film CD2) in the second CMP treatment can be reduced (decreased). The amount of polishing is sufficient as long as it allows the barrier conductor film BR2 to be removed from over the insulating film IL3 located outside the wire trench WT1.

A phenomenon in which the upper surface of the embedded insulating film BF2 protrudes into a projecting shape as shown in FIG. 56 described above occurs due to the fact that the insulating film IL4 is less likely to be polished than the conductive film CD2. The phenomenon occurs more prominently as the amount of polishing of the conductive film CD2 (thickness of the polished conductive film CD2) is larger (increases) in the second CMP treatment in which the insulating film IL4 is less likely to be polished than the conductive film CD2. In the third method, since the step of thinning the conductive film CD2 is performed after the formation of the conductive film CD2, the amount of polishing of the conductive film CD2 (thickness of the polished conductive film CD2) can be reduced (decreased). Accordingly, it is possible to inhibit or prevent the protrusion of the upper surface of the embedded insulating film BF2 into a projecting shape after the second CMP treatment to a degree corresponding to the thinned conductive film CD2. As a result, the subsequent manufacturing process is easily performed to allow an improvement in the manufacturing yield of the semiconductor device.

When a comparison is made between the foregoing second method and the third method, the amount of polishing of the conductive film CD2 (amount of the polished conductive film CD2) in the second CMP treatment is smaller (more scant) in the third method. Therefore, in terms of the effect of being able to inhibit or prevent the upper surface of the embedded insulating film BF2 from protruding into a projecting shape after the second CMP treatment, the third method is advantageous.

On the other hand, in the foregoing second method, as a result of polishing and removing the main conductor film MC2 remaining over the insulating film IL3 located outside the wire trench WT1, the upper portion of the main conductor film MC2 in the wire trench WT1 corresponding to a given thickness is accordingly polished to be removed in the second CMP treatment. As a result, even when the upper surface of the main conductor film MC2 in the wire trench WT1 is damaged by the first CMP treatment, the damaged portion is satisfactorily removed by the second CMP treatment. Consequently, the upper surface of the wire M1 can be formed of the surface of the main conductor film MC2 which has not been damaged by the first CMP treatment. This allows a further improvement in the reliability of the wire M1. From this viewpoint, the second method in which the amount of polishing of the main conductor film MC2 in the second CMP treatment is larger is advantageous over the third method.

The second method and the third method are easier to be controlled than the foregoing first method. On the other hand, compared to the second and third methods, the foregoing first method does not need the step of reducing the thickness of the conductive film CD2 to allow a reduction in the number of manufacturing steps.

In the foregoing first, second, and third methods, the description has been given of the methods for preventing the upper surface of the embedded insulating film BF2 from protruding into a projecting shape. However, these methods are also applicable to the embedded insulating films BF1 and BF3. That is, these methods are applicable to one or more of the embedded insulating films BF1, BF2, and BF3.

Even when applied to the embedded insulating film BF3, the foregoing first to third methods are basically the same as when applied to the embedded insulating film BF2. However, in the description given above with respect to the foregoing first to third methods, the conductive film CD2 is replaced with the conductive film CD3, the barrier conductor film BR2 is replaced with the barrier conductor film BR3, the main conductor film MC2 is replaced with the main conductor film MC3, the insulating film IL4 is replaced with the insulating film IL6, the insulating film IL3 is replaced with the insulating film IL5, the wire M1 is replaced with the wire M2, and the embedded insulating film BF2 is replaced with the embedded insulating film BF3. In addition, the opening OP3b is replaced with the opening OP5b, the opening OP4 is replaced with the opening OP6, and the wire trench WT1 is replaced with the wire trench WT2.

Also, even when applied to the embedded insulating film BF1, the foregoing first to third methods are basically the same as when applied to the embedded insulating film BF2. However, in the description given above with respect to the foregoing first to third methods, the conductive film CD2 is replaced with the conductive film CD1, the barrier conductor film BR2 is replaced with the barrier conductor film BR1, the main conductor film MC2 is replaced with the main conductor film MC1, the insulating film IL4 is replaced with the insulating film IL2, the insulating film IL3 is replaced with the insulating film IL1, the wire M1 is replaced with the plug PG, and the embedded insulating film BF2 is replaced with the embedded insulating film BF1. In addition, the opening OP3b is replaced with the opening OP1b, the opening OP4 is replaced with the opening OP2, and the wire trench WT1 is replaced with the contact hole CT.

The second method can also be combined with the first method. The third method can also be combined with the first method.

A phenomenon in which the upper surface of an embedded insulating film protrudes into a projecting shape as shown in FIG. 56 is particularly likely to occur when the embedded insulating film is formed simultaneously with copper wires. Accordingly, if the foregoing first to third methods are applied to the embedded insulating films BF2 and BF3 which are formed simultaneously with the wires M1 and M2 as embedded copper wires, the effects thereof are particularly large.

About Second Studied Example

Next, a second studied example studied by the present inventors will be described with reference to FIGS. 72 to 76 and, at the same time, the usability of the foregoing second and third methods will be further described. FIGS. 72 to 76 are main-portion cross-sectional views showing the manufacturing process of a semiconductor device in the second studied example. Similarly to FIGS. 53 to 71 described above, FIGS. 72 to 76 also show cross-sectional views of the regions corresponding to the photodiode formation region 1B and the transfer transistor formation region 1C each described above.

Figure 72:
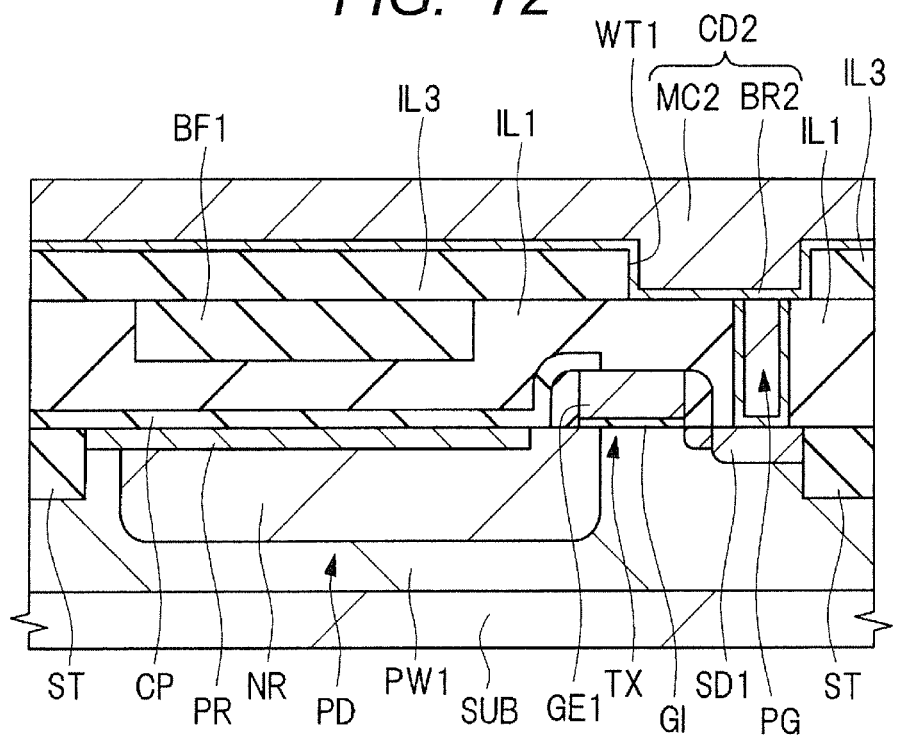
FIG. 72 is a main-portion cross-sectional view of a semiconductor device in a second studied example during the manufacturing process thereof.

FIG. 72 corresponds to the stage shown in FIG. 22 described above. First, by performing the process up to Step S13 (step of forming the conductive film CD2) described above, the structure of FIG. 72 corresponding to FIG. 22 described above is obtained.

Figure 73:
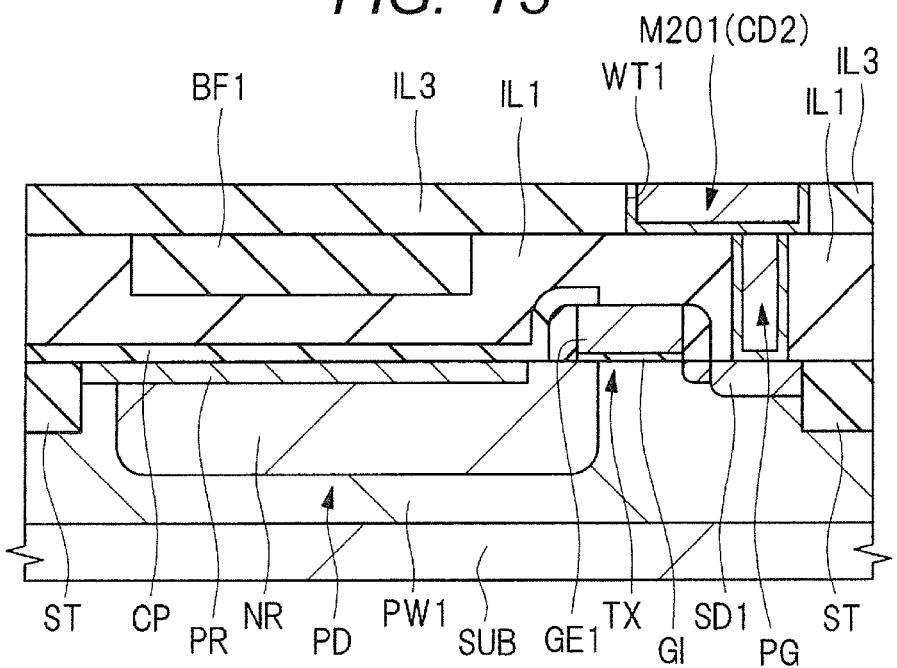
FIG. 73 is a main-portion cross-sectional view of the semiconductor device in the second studied example during the manufacturing process thereof, which is subsequent to FIG. 72.

Then, in the second studied example, as shown in FIG. 73, the conductive film CD2 is polished by a CMP method to remove the conductive film CD2 located outside the wire trench WT1. At this time, the conductive film CD2 is polished till the upper surface of the insulating film IL3 is exposed and the conductive film CD2 remaining in the wire trench WT1 of the insulating film IL3 is formed, while the other portion of the conductive film CD2 is removed.

To each of the foregoing second method, the foregoing third method, and the second studied example, it is common to perform the CMP treatment of the conductive film CD2 after the formation of the conductive film CD2. However, in the foregoing second and third methods, after the CMP treatment of the conductive film CD2, the conductive film CD2 remains in the form of a layer over the insulating film IL3 located outside the wire trench WT1 (in the second method, the laminated film of the barrier conductor film BR2 and the main conductor film MC2 remains while, in the third method, only the barrier conductor film BR2 remains), as shown in FIGS. 61 and 67 described above. By contrast, in the second studied example, after the CMP treatment of the conductive film CD2, the conductive film CD2 is not left over the insulating film IL3 located outside the wire trench WT1, as shown in FIG. 73 described above. Therefore, at the time point in FIG. 73 (at the time when the CMP treatment of the conductive film CD2 is ended), a wire M201 embedded in the wire trench WT1 is substantially completed.

Figure 74:
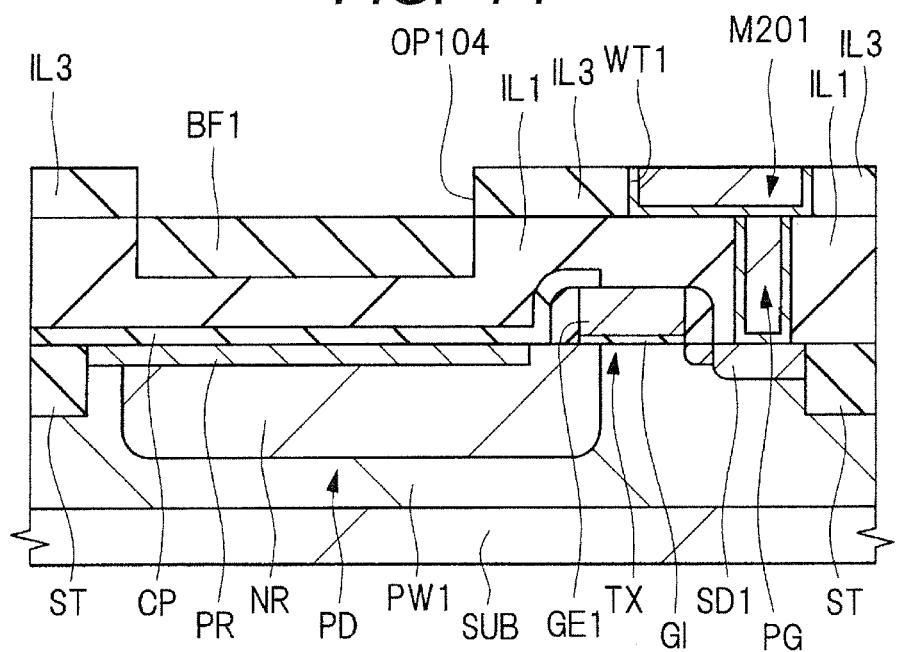
FIG. 74 is a main-portion cross-sectional view of the semiconductor device in the second studied example during the manufacturing process thereof, which is subsequent to FIG. 73.

Next, as shown in FIG. 74, using a photolithographic method and a dry etching method, an opening OP104 is formed in the insulating film IL3. The opening OP104 corresponds to the foregoing opening OP4 and is formed in the same two-dimensional shape as and at the same position as those of the foregoing opening OP4.

Figure 75:
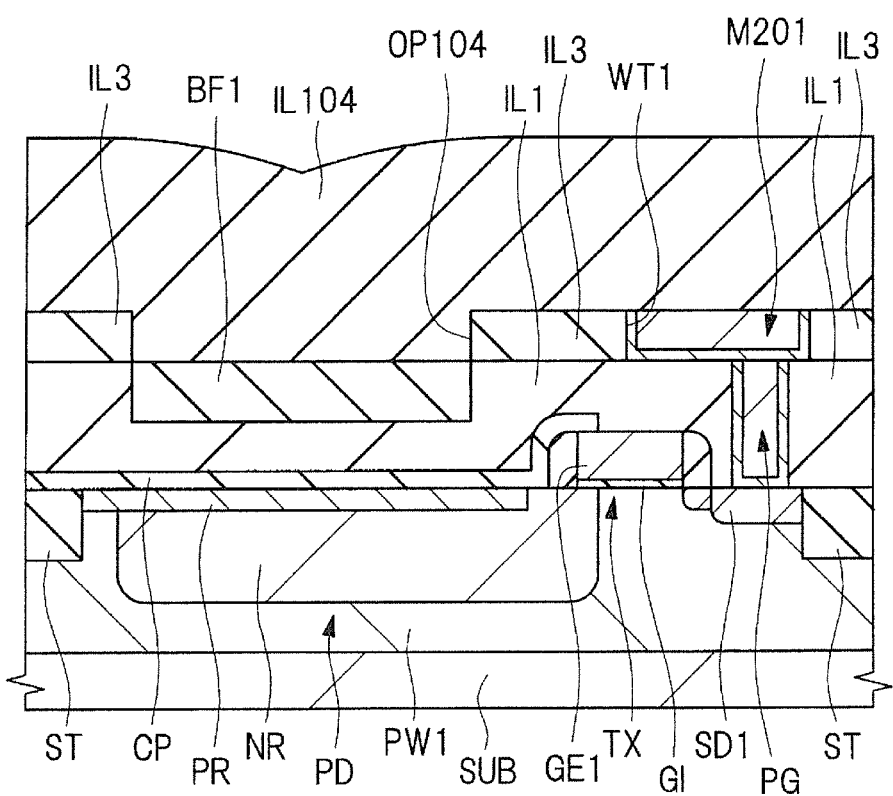
FIG. 75 is a main-portion cross-sectional view of the semiconductor device in the second studied example during the manufacturing process thereof, which is subsequent to FIG. 74.

Next, as shown in FIG. 75, an insulating film IL104 is formed over the insulating film IL3 and the wire M201 so as to fill the opening OP104 of the insulating film IL3. The insulating film IL104 corresponds to the foregoing insulating film IL4.

Figure 76:
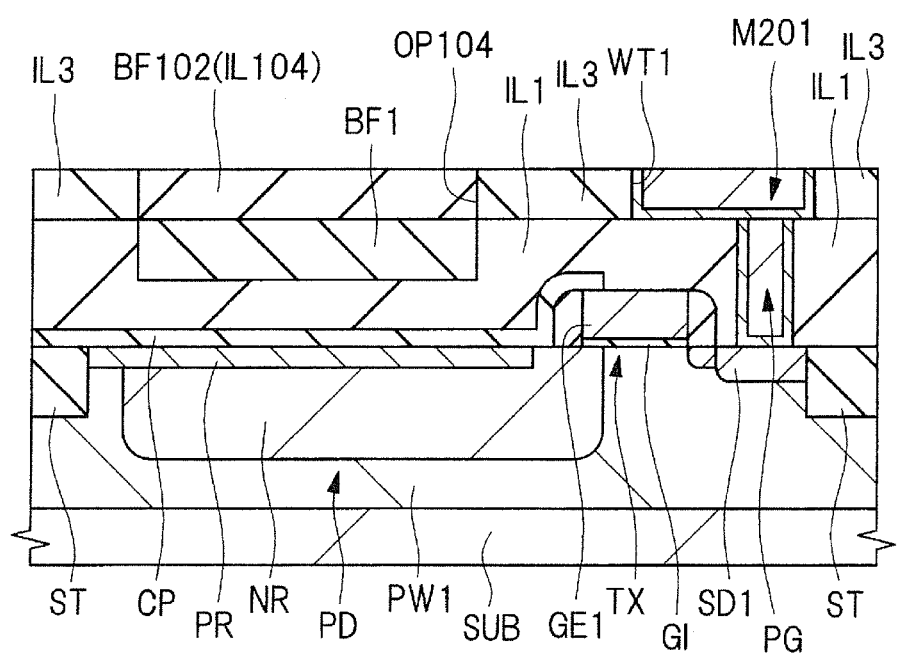
FIG. 76 is a main-portion cross-sectional view of the semiconductor device in the second studied example during the manufacturing process thereof, which is subsequent to FIG. 75.

Next, as shown in FIG. 76, by polishing the insulating film IL104 by a CMP method, the insulating film IL104 located outside the opening OP104 is removed, while the insulating film IL104 is left in the opening OP104 to form an embedded insulating film BF102. The embedded insulating film BF102 corresponds to the foregoing embedded insulating film BF2.

In such a manufacturing process in the second studied example, by the CMP step for the conductive film CD2 in FIG. 73, the wire M201 is formed and, by the CMP step for the insulating film IL104 in FIG. 76, the embedded insulating film BF102 is formed. However, in such a case of the second studied example, in the CMP step for the insulating film IL104 in FIG. 76, the upper surface of the wire M201 may be damaged.

That is, at the stage immediately before the CMP step for the insulating film IL104 in FIG. 76 is performed, the conductive film CD2 does not exist over the insulating film IL3 located outside the wire trench WT1 and the wire M201 embedded in the wire trench WT1 is in a substantially completed state. Therefore, in the CMP step for the insulating film IL104 in FIG. 76, the insulating film IL104 may be subjected appropriately to the CMP treatment to be polished. However, in the CMP step for the insulating film IL104 in FIG. 76, the CMP treatment of the insulating film IL104 is continued till the insulating film IL3 (upper surface thereof) is exposed and, in addition, the slurry proper for the insulating film IL104 is used. Accordingly, the upper surface of the wire M201 is susceptible to damage. When the wire M201 is damaged, the reliability of the wire M1 may be degraded to consequently degrade the reliability of the semiconductor device.

By contrast, in the foregoing second and third methods, the conductive film CD2 having a thickness sufficient to fill the wire trench WT1 is formed in Step S13 and then polished by a CMP method. At this time, unlike in the second studied example, a part of the conductive film CD2 remains in the form of a layer over the insulating film IL3 located outside the wire trench WT1. That is, in the foregoing second and third methods, after the formation of the conductive film CD2, the step of reducing the conductive film CD2 is performed, and the thickness of the conductive film CD2 is not reduced to zero (i.e., the conductive film CD2 still exists) over the insulating film IL3 located outside the wire trench WT1.

Therefore, the wire M1 is completed in the CMP step in Step S18, which is the second CMP treatment. That is, in the CMP step in Step S18, the insulating film IL4 is polished in the first CMP treatment, and the conductive film CD2 is polished in the second CMP treatment. As a result, even when the upper surface of the conductive film CD2 is damaged in the first CMP treatment for polishing the insulating film IL4, the conductive film CD2 is polished in the subsequent second CMP treatment so that the damaged portion thereof is removed in the second CMP treatment. Consequently, the upper surface of the wire M1 is formed of the polished surface of the conductive film CD2 formed not by the first CMP treatment for polishing the insulating film IL4, but by the second CMP treatment for polishing the conductive film CD2. Accordingly, it is easy to prevent the upper surface of the wire M1 from being damaged. This can improve the reliability of the wire M1 and consequently improve the reliability of the semiconductor device.

For the same reason, even in the foregoing first method and Embodiment 1 described above, it is easy to prevent the upper surface of the wire M1 from being damaged. This can improve the reliability of the wire M1 and consequently improve the reliability of the semiconductor device.

That is, the damage caused in the upper surface of the wire M201 at the stage shown in FIG. 73 in the second studied example is considered to be substantially comparable to the damage caused in the upper surface of the wire M1 at the stage at which the CMP step in Step S18 is ended. However, in the second studied example, the CMP step for the insulating film IL4 in FIG. 76 is also performed on the upper surface of the wire M201 so that the damage caused in the upper surface of the wire M201 at the stage in FIG. 76 is increased. Accordingly, in Embodiment 2 and Embodiment 1 each described above, to form the wire M1 and the embedded insulating film BF2, both of the wire M1 and the embedded insulating film BF2 are formed in the CMP step in Step S18 instead of generally completing the wire M1 and then forming the embedded insulating film BF2. In addition, at the stage immediately before the CMP step in Step S18, over the insulating film IL3 located outside the opening OP4 and the wire trench WT1, the conductive film CD2 for the wire M1 is present on the lower-layer side and the insulating film IL4 for the embedded insulating film BF2 is present on the upper-layer side. Accordingly, in the CMP step in Step S18, over the insulating film IL, polishing of the insulating film IL4 is performed first, and then polishing of the conductive film CD2 is performed. Therefore, the upper surface of the wire M1 is formed of the polished surface resulting from the CMP treatment for polishing the conductive film CD2 and can be inhibited or prevented from being damaged.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising the steps of:
   (a) providing a semiconductor substrate;
   (b) forming a light receiving element in the semiconductor substrate;
   (c) after the step (b), forming a first interlayer insulating film over the semiconductor substrate;
   (d) forming a first opening in the first interlayer insulating film;
   (e) forming a first metal film over the first interlayer insulating film so as to fill the first opening therewith;
   (f) forming a second opening in the first metal film;
   (g) etching the first interlayer insulating film exposed from the second opening to form a third opening in the first interlayer insulating film;
   (h) forming a first insulating film over the first metal film so as to fill the third opening and the second opening therewith;
   (i) polishing the first insulating film and the first metal film to remove the first metal film located outside the first opening and the first insulating film located outside the third opening to leave the first metal film in the first opening and leave the first insulating film in the third opening;
   (j) after the step (i), forming a second interlayer insulating film over the first interlayer insulating film;
   (k) forming a fourth opening in the second interlayer insulating film;
   (l) forming a second metal film over the second interlayer insulating film so as to fill the fourth opening therewith;
   (m) forming a fifth opening in the second metal film;
   (n) etching the second interlayer insulating film exposed from the fifth opening to form a sixth opening in the second interlayer insulating film;
   (o) forming a second insulating film over the second metal film so as to fill the sixth opening and the fifth opening therewith; and
   (p) polishing the second insulating film and the second metal film to remove the second metal film located outside the fourth opening and the second insulating film located outside the sixth opening to leave the second metal film in the fourth opening and leave the second insulating film in the sixth opening,
   wherein the first insulating film embedded in the third opening in the step (i) is located over the light receiving element,
   wherein the second insulating film embedded in the sixth opening in the step (p) is located over the first insulating film embedded in the third opening in the step (i), and
   wherein the second insulating film embedded in the sixth opening in the step (p) and the first insulating film embedded in the third opening in the step (i) function as a waveguide for light incident on the light receiving element.

2. A method of manufacturing a semiconductor device according to claim 1,
   wherein the second insulating film embedded in the sixth opening in the step (p) is in contact with the first insulating film embedded in the third opening in the step (i).

3. A method of manufacturing a semiconductor device according to claim 2,
   wherein the first insulating film and the second insulating are each made of the same insulating material.

4. A method of manufacturing a semiconductor device according to claim 3,
   wherein the first insulating film and the second insulating film are each formed of a silicon nitride film.

5. A method of manufacturing a semiconductor device according to claim 4,
   wherein the first insulating film and the second insulating film are each formed by a CVD method.

6. A method of manufacturing a semiconductor device according to claim 5,
   wherein each of the first interlayer insulating film and the second interlayer insulating film includes a silicon-oxide-based insulating film.

7. A method of manufacturing a semiconductor device according to claim 6,
   wherein the first insulating film is higher in refractivity and translucency than the first interlayer insulating film, and
   wherein the second insulating film is higher in refractivity and translucency than the second interlayer insulating film.

8. A method of manufacturing a semiconductor device according to claim 7,
   wherein a conductive plug is formed of the first metal film embedded in the first opening in the step (i), and
   wherein a wire is formed of the second metal film embedded in the fourth opening in the step (p).

9. A method of manufacturing a semiconductor device according to claim 7,
   wherein a first wire is formed of the first metal film embedded in the first opening in the step (i), and
   wherein a second wire in a layer higher than that of the first wire is formed of the second metal film embedded in the fourth opening in the step (p).

10. A method of manufacturing a semiconductor device according to claim 1, further comprising, after the step (l) and prior to the step (m), the step of:
    (l1) reducing a thickness of the second metal film.

11. A method of manufacturing a semiconductor device according to claim 10,
    wherein the step (p) includes the steps of:
    (p1) polishing the second insulating film by a CMP method under such a condition that a speed of polishing the second insulating film is higher than a speed of polishing the second metal film to expose the second metal film; and
    (p2) after the step (p1), polishing the second metal film and the second insulating film by a CMP method under such a condition that a speed of polishing the second metal film is higher than a speed of polishing the second insulating film to expose the second interlayer insulating film.

12. A method of manufacturing a semiconductor device according to claim 11,
    wherein the second metal film formed in the step (l) includes a barrier conductor film, and a main conductor film over the barrier conductor film, and
    wherein, in the step (l1), the main conductor film is polished to have a reduced thickness.

13. A method of manufacturing a semiconductor device according to claim 11,
    wherein the second metal film formed in the step (l) has a barrier conductor film, and a main conductor film over the barrier conductor film, and
    wherein, after the step (l) and prior to the step (m), in the step (l1), the main conductor film is polished to expose the barrier conductor film over the second interlayer insulating film.

14. A method of manufacturing a semiconductor device according to claim 1,
wherein the step (p) includes the steps of:
(p1) polishing the second insulating film by a CMP method under such a condition that a speed of polishing the second insulating film is higher than a speed of polishing the second metal film to expose the second metal film, and
(p2) after the step (p1), polishing the second metal film and the second insulating film by a CMP method under such a condition that the speed of polishing the second metal film is higher than the speed of polishing the second insulating film to expose the second interlayer insulating film, and
wherein, in the step (p1), the second insulating film is polished until the second metal film is exposed and dishing occurs in the second insulating film in the sixth opening and the fifth opening.

15. A method of manufacturing a semiconductor device according to claim 1, further comprising, after the step (p), the steps of:
(q) forming a third interlayer insulating film over the second interlayer insulating film;
(r) forming a seventh opening in the third interlayer insulating film;
(s) forming a third metal film over the third interlayer insulating film so as to fill the seventh opening therewith;
(t) forming an eighth opening in the second metal film;
(u) etching the third interlayer insulating film exposed from the eighth opening to form a ninth opening in the third interlayer insulating film;
(v) forming a third insulating film over the third metal film so as to fill the ninth opening and the eighth opening therewith; and
(w) polishing the third insulating film and the third metal film to remove the third metal film located outside the seventh opening and the third insulating film located outside the ninth opening, leave the third metal film in the seventh opening, and leave the third insulating film in the ninth opening,
wherein the third insulating film is higher in refractivity and translucency than the third interlayer insulating film,
wherein the third insulating film embedded in the ninth opening in the step (w) is located over the second insulating film embedded in the sixth opening in the step (p),
wherein a conductive plug is formed of the first metal film embedded in the first opening in the step (i),
wherein a first wire is formed of the second metal film embedded in the fourth opening in the step (p), and
wherein a second wire in a layer higher than that of the first wire is formed of the third metal film embedded in the seventh opening in the step (w).

16. A method of manufacturing a semiconductor device according to claim 15,
wherein the first insulating film, the second insulating film, and the third insulating film are each made of the same insulating material.

17. A method of manufacturing a semiconductor device, comprising the steps of:
(a) providing a semiconductor substrate;
(b) forming a light receiving element in the semiconductor substrate;
(c) after the step (b), forming a first interlayer insulating film over the semiconductor substrate;
(d) forming a first opening in the first interlayer insulating film;
(e) forming a first metal film over the first interlayer insulating film so as to fill the first opening therewith;
(f) forming a second opening in the first metal film;
(g) etching the first interlayer insulating film exposed from the second opening to form a third opening in the first interlayer insulating film;
(h) forming a first insulating film over the first metal film so as to fill the third opening and the second opening therewith;
(i) polishing the first insulating film and the first metal film to remove the first metal film located outside the first opening and the first insulating film located outside the third opening to leave the first metal film in the first opening and leave the first insulating film in the third opening;
(j) after the step (i), forming a second interlayer insulating film over the first interlayer insulating film;
(k) forming a fourth opening in the second interlayer insulating film;
(l) forming a second metal film over the second interlayer insulating film so as to fill the fourth opening therewith;
(m) forming a fifth opening in the second metal film;
(n) etching the second interlayer insulating film exposed from the fifth opening to form a sixth opening in the second interlayer insulating film;
(o) forming a second insulating film over the second metal film so as to fill the sixth opening and the fifth opening therewith; and
(p) polishing the second insulating film and the second metal film to remove the second metal film located outside the fourth opening and the second insulating film located outside the sixth opening to leave the second metal film in the fourth opening and leave the second insulating film in the sixth opening,
wherein the first insulating film is higher in refractivity and translucency than the first interlayer insulating film,
wherein the second insulating film is higher in refractivity and translucency than the second interlayer insulating film,
wherein the first insulating film embedded in the third opening in the step (i) is located over the light receiving element, and
wherein the second insulating film embedded in the sixth opening in the step (p) is located over the first insulating film embedded in the third opening in the step (i).

18. A method of manufacturing a semiconductor device, comprising the steps of:
(a) providing a semiconductor substrate;
(b) forming a light receiving element in the semiconductor substrate;
(c) after the step (b), forming a first interlayer insulating film over the semiconductor substrate;
(d) forming a first opening in the first interlayer insulating film;
(e) forming a first metal film over the first interlayer insulating film so as to fill the first opening therewith;
(f) forming a second opening in the first metal film;
(g) etching the first interlayer insulating film exposed from the second opening to form a third opening in the first interlayer insulating film;
(h) forming a first insulating film over the first metal film so as to fill the third opening and the second opening therewith;
(i) polishing the first insulating film and the first metal film to remove the first metal film located outside the first opening and the first insulating film located outside the third opening to leave the first metal film in the first opening and leave the first insulating film in the third opening;

(j) after the step (i), forming a second interlayer insulating film over the first interlayer insulating film;

(k) forming a fourth opening in the second interlayer insulating film;

(l) forming a second metal film over the second interlayer insulating film so as to fill the fourth opening therewith;

(m) forming a fifth opening in the second metal film;

(n) etching the second interlayer insulating film exposed from the fifth opening to form a sixth opening in the second interlayer insulating film;

(o) forming a second insulating film over the second metal film so as to fill the sixth opening and the fifth opening therewith; and (p) polishing the second insulating film and the second metal film to remove the second metal film located outside the fourth opening and the second insulating film located outside the sixth opening to leave the second metal film in the fourth opening and leave the second insulating film in the sixth opening, wherein each of the first insulating film and the second insulating film is formed of a silicon nitride film, wherein the first insulating film embedded in the third opening in the step (i) is located over the light receiving element, and wherein the second insulating film embedded in the sixth opening in the step (p) is located over the first insulating film embedded in the third opening in the step (i).

* * * * *